US012571851B2

(12) United States Patent
Shoa Hassani Lashidani et al.

(10) Patent No.: US 12,571,851 B2
(45) Date of Patent: Mar. 10, 2026

(54) APPARATUS AND METHODS FOR TESTING ELECTROCHEMICAL SYSTEMS

(71) Applicant: CADEX Electronics Inc., Richmond (CA)

(72) Inventors: Tina Shoa Hassani Lashidani, North Vancouver (CA); Gregory John Funk, Delta (CA); Mark Steven Richter, Burnaby (CA); April Petrovna Zoom O'Dwyer, Richmond (CA); Tarek Lawrence Ward, Vancouver (CA); Yat Shun (Damien) Yu, Burnaby (CA); Kevin Norman Hadden, Nepean (CA); Alex James Lim, Surrey (CA); Marvin Messing, Burnaby (CA)

(73) Assignee: CADEX Electronics Inc., Richmond (CA)

( * ) Notice: Subject to any disclaimer, the term of this patent is extended or adjusted under 35 U.S.C. 154(b) by 470 days.

(21) Appl. No.: 17/907,209

(22) PCT Filed: Mar. 25, 2021

(86) PCT No.: PCT/CA2021/050392
§ 371 (c)(1),
(2) Date: Sep. 23, 2022

(87) PCT Pub. No.: WO2021/189146
PCT Pub. Date: Sep. 30, 2021

(65) Prior Publication Data
US 2023/0122362 A1 Apr. 20, 2023

Related U.S. Application Data

(60) Provisional application No. 62/994,687, filed on Mar. 25, 2020.

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3648* (2013.01); *G01R 31/367* (2019.01);
(Continued)

(58) Field of Classification Search
CPC .............. G01R 31/392; G01R 31/3648; G01R 31/367; G01R 31/389; G01R 31/386; G01R 31/388
See application file for complete search history.

(56) References Cited

U.S. PATENT DOCUMENTS 3,873,911 A 3/1975 Champlin
4,549,146 A 10/1985 Cowans et al.
(Continued)

FOREIGN PATENT DOCUMENTS

EP 0276305 B1 10/1991
EP 0580241 A2 1/1994
(Continued)

OTHER PUBLICATIONS

Wu et al., "Low-Cost Battery Monitoring by Converter-Based Electrochemical Impedance Spectroscopy" 2017 IEEE International Workshop on Applied Measurements for Power Systems (AMPS) (Year: 2017).*
(Continued)

*Primary Examiner* — John C Kuan
(74) *Attorney, Agent, or Firm* — Todd A. Rattray; Oyen Wiggs Green & Mutala LLP

(57) ABSTRACT
An electrochemical system testing apparatus may comprise a testing module electrically coupled to the electrochemical system. The testing module may comprise a discharge
(Continued)

circuit configured to draw current from the electrochemical system at a plurality of different rates and to continuously draw current from the electrochemical system once a test of the electrochemical system is commenced. The apparatus may also comprise a measurement module which may be configured to measure voltage across terminals of the electrochemical system and current drawn from the electrochemical system during the test. The apparatus may also comprise a processor configured to compensate at least in part the measured voltage for voltage drift which was generated by continuously drawing current from the electrochemical system and to compute a state of health of the electrochemical system based at least in part on the compensated voltage and the measured current.

31 Claims, 17 Drawing Sheets

(51) Int. Cl.
  G01R 31/367 (2019.01)
  G01R 31/385 (2019.01)
  G01R 31/388 (2019.01)
  G01R 31/389 (2019.01)

(52) U.S. Cl.
  CPC .......... G01R 31/389 (2019.01); G01R 31/386 (2019.01); G01R 31/388 (2019.01)

(56) References Cited

U.S. PATENT DOCUMENTS

| | | | |
|---|---|---|---|
| 4,745,349 A | 5/1988 | Palanisamy et al. | |
| 4,881,038 A | 11/1989 | Champlin | |
| 4,912,416 A | 3/1990 | Champlin | |
| 5,059,902 A | 10/1991 | Linder | |
| 5,093,624 A | 3/1992 | Stevenson | |
| 5,119,011 A * | 6/1992 | Lambert ........... | H02J 7/007182 |
| | | | 340/636.11 |
| 5,182,518 A | 1/1993 | Stich et al. | |
| 5,250,903 A | 10/1993 | Limuti et al. | |
| 5,281,919 A | 1/1994 | Palanisamy | |
| 5,372,898 A | 12/1994 | Atwater et al. | |
| 5,469,043 A | 11/1995 | Cherng et al. | |
| 5,537,042 A | 7/1996 | Beutler et al. | |
| 5,574,355 A | 11/1996 | McShane et al. | |
| 5,583,416 A | 12/1996 | Klang | |
| 5,589,757 A | 12/1996 | Klang | |
| 5,592,093 A | 1/1997 | Klingbiel | |
| 5,596,260 A | 1/1997 | Moravec et al. | |
| 5,642,100 A | 6/1997 | Farmer | |
| 5,651,100 A | 7/1997 | Hayashi et al. | |
| 5,656,920 A | 8/1997 | Cherng et al. | |
| 5,661,393 A | 8/1997 | Sengupta | |
| 5,664,066 A | 9/1997 | Sun et al. | |
| 5,675,252 A | 10/1997 | Podney | |
| 5,708,593 A | 1/1998 | Saby et al. | |
| 5,714,866 A | 2/1998 | S et al. | |
| 5,739,673 A | 4/1998 | Le Van Suu | |
| 5,757,192 A | 5/1998 | McShane et al. | |
| 5,758,025 A | 5/1998 | Wu | |
| 5,780,992 A | 7/1998 | Beard | |
| 5,821,756 A | 10/1998 | McShane et al. | |
| 5,831,435 A | 11/1998 | Troy | |
| 5,871,858 A | 2/1999 | Thomsen et al. | |
| 5,883,497 A | 3/1999 | Turnbull | |
| 5,914,605 A | 6/1999 | Bertness | |
| 5,936,383 A | 8/1999 | Ng et al. | |
| 5,945,829 A | 8/1999 | Bertness | |
| 5,977,750 A | 11/1999 | Ng et al. | |
| 6,011,379 A | 1/2000 | Singh et al. | |
| 6,033,798 A | 3/2000 | Tabuchi et al. | |
| 6,037,751 A | 3/2000 | Klang | |

| | | | |
|---|---|---|---|
| 6,037,777 A | 3/2000 | Champlin | |
| 6,051,976 A | 4/2000 | Bertness | |
| 6,061,638 A | 5/2000 | Joyce | |
| 6,072,299 A | 6/2000 | Kurle et al. | |
| 6,081,098 A | 6/2000 | Bertness et al. | |
| 6,091,245 A | 7/2000 | Bertness | |
| 6,104,167 A | 8/2000 | Bertness et al. | |
| 6,137,292 A | 10/2000 | Hirsch et al. | |
| 6,163,156 A | 12/2000 | Bertness | |
| 6,172,505 B1 | 1/2001 | Bertness | |
| 6,208,114 B1 | 3/2001 | Jones et al. | |
| 6,208,147 B1 | 3/2001 | Yoon et al. | |
| 6,215,312 B1 | 4/2001 | Hoenig et al. | |
| 6,225,808 B1 | 5/2001 | Varghese et al. | |
| 6,249,124 B1 | 6/2001 | Bertness | |
| 6,259,254 B1 | 7/2001 | Klang | |
| 6,262,577 B1 | 7/2001 | Nakao et al. | |
| 6,272,477 B1 | 8/2001 | Kelly, III et al. | |
| 6,304,087 B1 | 10/2001 | Bertness | |
| 6,307,378 B1 | 10/2001 | Kozlowski | |
| 6,310,481 B2 | 10/2001 | Bertness | |
| 6,313,608 B1 | 11/2001 | Varghese et al. | |
| 6,316,914 B1 | 11/2001 | Bertness | |
| 6,323,650 B1 | 11/2001 | Bertness et al. | |
| 6,329,793 B1 | 12/2001 | Bertness et al. | |
| 6,331,762 B1 | 12/2001 | Bertness | |
| 6,332,113 B1 | 12/2001 | Bertness | |
| 6,351,102 B1 | 2/2002 | Troy | |
| 6,359,441 B1 | 3/2002 | Bertness | |
| 6,363,303 B1 | 3/2002 | Bertness | |
| 6,366,054 B1 | 4/2002 | Hoenig et al. | |
| 6,377,031 B1 | 4/2002 | Karuppana et al. | |
| 6,392,414 B2 | 5/2002 | Bertness | |
| 6,404,164 B1 | 6/2002 | Bean et al. | |
| 6,411,098 B1 | 6/2002 | Laletin | |
| 6,411,911 B1 | 6/2002 | Hirsch et al. | |
| 6,417,669 B1 | 7/2002 | Champlin | |
| 6,424,158 B2 | 7/2002 | Klang | |
| 6,437,957 B1 | 8/2002 | Karuppana et al. | |
| 6,441,585 B1 | 8/2002 | Bertness | |
| 6,445,158 B1 | 9/2002 | Bertness et al. | |
| 6,445,189 B1 | 9/2002 | Pakonen et al. | |
| 6,456,045 B1 | 9/2002 | Troy et al. | |
| 6,456,988 B1 | 9/2002 | Singh et al. | |
| 6,461,767 B1 | 10/2002 | Dansui et al. | |
| 6,466,025 B1 | 10/2002 | Klang | |
| 6,469,511 B1 | 10/2002 | Vonderhaar et al. | |
| 6,497,209 B1 | 12/2002 | Karuppana et al. | |
| 6,507,196 B2 | 1/2003 | Thomsen et al. | |
| 6,512,937 B2 | 1/2003 | Blank et al. | |
| 6,526,361 B1 | 2/2003 | Jones et al. | |
| 6,534,993 B2 | 3/2003 | Bertness | |
| 6,544,078 B2 | 4/2003 | Palmisano et al. | |
| 6,556,019 B2 | 4/2003 | Bertness | |
| 6,566,883 B1 | 5/2003 | Vonderhaar et al. | |
| 6,586,941 B2 | 7/2003 | Bertness et al. | |
| 6,597,150 B1 | 7/2003 | Bertness et al. | |
| 6,618,681 B2 | 9/2003 | Hoenig et al. | |
| 6,623,314 B1 | 9/2003 | Cox et al. | |
| 6,633,165 B2 | 10/2003 | Bertness | |
| 6,635,974 B1 | 10/2003 | Karuppana et al. | |
| 6,696,819 B2 | 2/2004 | Bertness | |
| 6,707,303 B2 | 3/2004 | Bertness et al. | |
| 6,737,831 B2 | 5/2004 | Champlin | |
| 6,744,149 B1 | 6/2004 | Karuppana et al. | |
| 6,759,849 B2 | 7/2004 | Bertness et al. | |
| 6,778,913 B2 | 8/2004 | Tinnemeyer | |
| 6,781,382 B2 | 8/2004 | Johnson | |
| 6,788,025 B2 | 9/2004 | Bertness et al. | |
| 6,795,782 B2 | 9/2004 | Bertness et al. | |
| 6,805,090 B2 | 10/2004 | Bertness et al. | |
| 6,833,760 B1 | 12/2004 | Aude | |
| 6,833,980 B1 | 12/2004 | Tsukagoshi et al. | |
| 6,835,491 B2 | 12/2004 | Gartstein et al. | |
| 6,850,037 B2 | 2/2005 | Bertness | |
| 6,871,151 B2 | 3/2005 | Bertness | |
| 6,885,195 B2 | 4/2005 | Bertness | |
| 6,888,468 B2 | 5/2005 | Bertness | |
| 6,891,378 B2 | 5/2005 | Bertness et al. | |

(56)                  References Cited

U.S. PATENT DOCUMENTS

| | | | |
|---|---|---|---|
| 6,898,585 | B2 | 5/2005 | Benson et al. |
| 6,906,522 | B2 | 6/2005 | Bertness et al. |
| 6,906,523 | B2 | 6/2005 | Bertness et al. |
| 6,909,287 | B2 | 6/2005 | Bertness |
| 6,913,483 | B2 | 7/2005 | Restaino et al. |
| 6,914,413 | B2 | 7/2005 | Bertness et al. |
| 6,919,725 | B2 | 7/2005 | Bertness et al. |
| 6,930,485 | B2 | 8/2005 | Bertness et al. |
| 6,933,727 | B2 | 8/2005 | Bertness et al. |
| 6,941,234 | B2 | 9/2005 | Bertness et al. |
| 6,967,484 | B2 | 11/2005 | Bertness |
| 6,998,847 | B2 | 2/2006 | Bertness et al. |
| 7,003,410 | B2 | 2/2006 | Bertness et al. |
| 7,003,411 | B2 | 2/2006 | Bertness |
| 7,012,433 | B2 | 3/2006 | Smith et al. |
| 7,015,674 | B2 | 3/2006 | Vonderhaar |
| 7,019,542 | B2 | 3/2006 | Tinnemeyer |
| 7,034,541 | B2 | 4/2006 | Bertness et al. |
| 7,039,533 | B2 | 5/2006 | Bertness et al. |
| 7,058,525 | B2 | 6/2006 | Bertness et al. |
| 7,072,871 | B1 | 7/2006 | Tinnemeyer |
| 7,081,755 | B2 | 7/2006 | Klang et al. |
| 7,106,070 | B2 | 9/2006 | Bertness et al. |
| 7,116,109 | B2 | 10/2006 | Klang |
| 7,119,686 | B2 | 10/2006 | Bertness et al. |
| 7,126,341 | B2 | 10/2006 | Bertness et al. |
| 7,154,276 | B2 | 12/2006 | Bertness |
| 7,198,510 | B2 | 4/2007 | Bertness |
| 7,205,746 | B2 | 4/2007 | Batson |
| 7,208,914 | B2 | 4/2007 | Klang |
| 7,246,015 | B2 | 7/2007 | Bertness et al. |
| 7,295,936 | B2 | 11/2007 | Bertness et al. |
| 7,319,304 | B2 | 1/2008 | Veloo et al. |
| 7,363,175 | B2 | 4/2008 | Bertness et al. |
| 7,398,176 | B2 | 7/2008 | Bertness |
| 7,408,358 | B2 | 8/2008 | Knopf |
| 7,425,833 | B2 | 9/2008 | Bertness et al. |
| 7,446,536 | B2 | 11/2008 | Bertness |
| 7,479,763 | B2 | 1/2009 | Bertness |
| 7,498,767 | B2 | 3/2009 | Brown et al. |
| 7,501,795 | B2 | 3/2009 | Bertness et al. |
| 7,505,856 | B2 | 3/2009 | Restaino et al. |
| 7,545,146 | B2 | 6/2009 | Klang et al. |
| 7,557,586 | B1 | 7/2009 | Vonderhaar et al. |
| 7,595,643 | B2 | 9/2009 | Klang |
| 7,598,699 | B2 | 10/2009 | Restaino et al. |
| 7,598,743 | B2 | 10/2009 | Bertness |
| 7,598,744 | B2 | 10/2009 | Bertness et al. |
| 7,619,417 | B2 | 11/2009 | Klang |
| 7,622,929 | B2 | 11/2009 | Tinnemeyer et al. |
| 7,642,786 | B2 | 1/2010 | Philbrook |
| 7,642,787 | B2 | 1/2010 | Bertness et al. |
| 7,656,162 | B2 | 2/2010 | Vonderhaar et al. |
| 7,688,074 | B2 | 3/2010 | Cox et al. |
| 7,705,602 | B2 | 4/2010 | Bertness |
| 7,706,991 | B2 | 4/2010 | Bertness et al. |
| 7,710,119 | B2 | 5/2010 | Bertness |
| 7,723,993 | B2 | 5/2010 | Klang |
| 7,728,597 | B2 | 6/2010 | Bertness |
| 7,772,850 | B2 | 8/2010 | Bertness |
| 7,774,151 | B2 | 8/2010 | Bertness |
| 7,777,612 | B2 | 8/2010 | Sampson et al. |
| 7,788,052 | B2 | 8/2010 | Iwane et al. |
| 7,791,348 | B2 | 9/2010 | Brown et al. |
| 7,808,375 | B2 | 10/2010 | Bertness et al. |
| 7,902,828 | B2 | 3/2011 | Huang |
| 7,924,015 | B2 | 4/2011 | Bertness |
| 7,940,052 | B2 | 5/2011 | Vonderhaar et al. |
| 7,940,053 | B2 | 5/2011 | Brown et al. |
| 7,959,476 | B2 | 6/2011 | Smith et al. |
| 7,977,914 | B2 | 7/2011 | Bertness |
| D643,759 | S | 8/2011 | Bertness |
| 7,999,505 | B2 | 8/2011 | Bertness |
| 8,035,396 | B2 | 10/2011 | Kim |
| 8,063,643 | B2 | 11/2011 | Deveau et al. |
| 8,164,343 | B2 | 4/2012 | Bertness |
| 8,198,900 | B2 | 6/2012 | Bertness et al. |
| 8,203,345 | B2 | 6/2012 | Bertness |
| 8,237,448 | B2 | 8/2012 | Bertness |
| 8,306,690 | B2 | 11/2012 | Bertness et al. |
| 8,310,205 | B1 | 11/2012 | Hamburgen |
| 8,344,685 | B2 | 1/2013 | Bertness et al. |
| 8,436,619 | B2 | 5/2013 | Bertness et al. |
| 8,442,877 | B2 | 5/2013 | Bertness et al. |
| 8,493,022 | B2 | 7/2013 | Bertness |
| D687,727 | S | 8/2013 | Kehoe et al. |
| 8,513,949 | B2 | 8/2013 | Bertness |
| 8,516,429 | B2 | 8/2013 | Wu et al. |
| 8,589,097 | B2 | 11/2013 | Kirchev |
| 8,645,088 | B2 | 2/2014 | Schaefer et al. |
| 8,648,602 | B2 | 2/2014 | Van Lammeren |
| 8,674,654 | B2 | 3/2014 | Bertness |
| 8,674,711 | B2 | 3/2014 | Bertness |
| 8,704,483 | B2 | 4/2014 | Bertness et al. |
| 8,738,309 | B2 | 5/2014 | Bertness |
| 8,754,653 | B2 | 6/2014 | Vonderhaar et al. |
| 8,872,516 | B2 | 10/2014 | Bertness |
| 8,872,517 | B2 | 10/2014 | Philbrook et al. |
| 8,958,998 | B2 | 2/2015 | Bertness |
| 8,963,550 | B2 | 2/2015 | Bertness et al. |
| 9,018,958 | B2 | 4/2015 | Bertness |
| 9,052,366 | B2 | 6/2015 | Bertness |
| 9,201,120 | B2 | 12/2015 | Stukenberg |
| 9,229,062 | B2 | 1/2016 | Stukenberg |
| 9,244,100 | B2 | 1/2016 | Coleman et al. |
| 9,255,955 | B2 | 2/2016 | Bertness |
| 9,274,157 | B2 | 3/2016 | Bertness |
| 9,312,575 | B2 | 4/2016 | Stukenberg et al. |
| 9,335,362 | B2 | 5/2016 | Bertness et al. |
| 9,419,311 | B2 | 8/2016 | Bertness |
| 9,425,487 | B2 | 8/2016 | Bertness |
| 9,496,720 | B2 | 11/2016 | McShane et al. |
| 9,851,408 | B2 | 12/2017 | Tinnemeyer |
| 9,923,289 | B2 | 3/2018 | Bertness |
| 9,966,676 | B2 | 5/2018 | Salo, III et al. |
| 10,046,649 | B2 | 8/2018 | Bertness |
| 10,222,397 | B2 | 3/2019 | Salo, III |
| 10,222,426 | B2 | 3/2019 | Wang et al. |
| 10,302,709 | B2 | 5/2019 | Shoa Hassani Lashidani et al. |
| 10,310,022 | B2 | 6/2019 | Park et al. |
| 10,317,468 | B2 | 6/2019 | Bertness |
| 10,429,449 | B2 | 10/2019 | van Bremen |
| 2002/0003423 | A1 | 1/2002 | Bertness et al. |
| 2002/0010558 | A1 | 1/2002 | Bertness et al. |
| 2002/0018927 | A1 | 2/2002 | Thomsen et al. |
| 2002/0036504 | A1 | 3/2002 | Troy et al. |
| 2002/0047711 | A1 | 4/2002 | Bertness et al. |
| 2002/0105428 | A1 | 8/2002 | Benson et al. |
| 2002/0153864 | A1 | 10/2002 | Bertness |
| 2002/0171428 | A1 | 11/2002 | Bertness |
| 2002/0180445 | A1 | 12/2002 | Bertness et al. |
| 2002/0193955 | A1 | 12/2002 | Bertness et al. |
| 2003/0001579 | A1 | 1/2003 | Bertness |
| 2003/0011344 | A1 | 1/2003 | Bertness et al. |
| 2003/0017753 | A1 | 1/2003 | Palmisano et al. |
| 2003/0020479 | A1 | 1/2003 | Koch et al. |
| 2003/0038637 | A1 | 2/2003 | Bertness et al. |
| 2003/0048106 | A1 | 3/2003 | Bertness et al. |
| 2003/0078743 | A1 | 4/2003 | Bertness et al. |
| 2003/0088375 | A1 | 5/2003 | Bertness et al. |
| 2003/0090272 | A1 | 5/2003 | Bertness |
| 2003/0092308 | A1 | 5/2003 | Bertness |
| 2003/0124417 | A1 | 7/2003 | Bertness et al. |
| 2003/0128011 | A1 | 7/2003 | Bertness |
| 2003/0155930 | A1 | 8/2003 | Thomsen |
| 2003/0173971 | A1 | 9/2003 | Bertness et al. |
| 2003/0183191 | A1 | 10/2003 | Bertness et al. |
| 2003/0184258 | A1 | 10/2003 | Vonderhaar |
| 2003/0184264 | A1 | 10/2003 | Bertness |
| 2003/0184306 | A1 | 10/2003 | Bertness et al. |
| 2003/0184307 | A1 | 10/2003 | Kozlowski et al. |
| 2003/0204328 | A1 | 10/2003 | Tinnemeyer |
| 2003/0206021 | A1 | 11/2003 | Laletin et al. |
| 2004/0036443 | A1 | 2/2004 | Bertness |

(56)　　　　References Cited

U.S. PATENT DOCUMENTS

| | | |
|---|---|---|
| 2004/0046564 A1 | 3/2004 | Klang et al. |
| 2004/0046566 A1 | 3/2004 | Klang |
| 2004/0051532 A1 | 3/2004 | Smith et al. |
| 2004/0104728 A1 | 6/2004 | Bertness et al. |
| 2004/0108856 A1 | 6/2004 | Johnson |
| 2004/0113494 A1 | 6/2004 | Karuppana et al. |
| 2004/0140904 A1 | 7/2004 | Bertness |
| 2004/0145371 A1 | 7/2004 | Bertness et al. |
| 2004/0157113 A1 | 8/2004 | Klang |
| 2004/0178918 A1 | 9/2004 | Lockhart et al. |
| 2004/0189308 A1 | 9/2004 | Bertness et al. |
| 2004/0196681 A1 | 10/2004 | Xiao et al. |
| 2004/0232918 A1 | 11/2004 | Bertness et al. |
| 2004/0251876 A1 | 12/2004 | Bertness |
| 2004/0251908 A1 | 12/2004 | Knopf |
| 2004/0257084 A1 | 12/2004 | Restaino et al. |
| 2005/0021475 A1 | 1/2005 | Bertness et al. |
| 2005/0024061 A1 | 2/2005 | Cox et al. |
| 2005/0035752 A1 | 2/2005 | Bertness et al. |
| 2005/0052187 A1 | 3/2005 | Bertness |
| 2005/0057256 A1 | 3/2005 | Bertness |
| 2005/0057865 A1 | 3/2005 | Veloo et al. |
| 2005/0068039 A1 | 3/2005 | Bertness |
| 2005/0073314 A1 | 4/2005 | Bertness et al. |
| 2005/0075807 A1 | 4/2005 | Bertness |
| 2005/0077904 A1 | 4/2005 | Bertness |
| 2005/0099185 A1 | 5/2005 | Klang |
| 2005/0162124 A1 | 7/2005 | Bertness et al. |
| 2005/0162172 A1 | 7/2005 | Bertness |
| 2005/0184732 A1 | 8/2005 | Restaino et al. |
| 2005/0206346 A1 | 9/2005 | Smith et al. |
| 2005/0212521 A1 | 9/2005 | Bertness |
| 2005/0218001 A1 | 10/2005 | You et al. |
| 2005/0218902 A1 | 10/2005 | Restaino et al. |
| 2005/0225446 A1 | 10/2005 | Bertness et al. |
| 2005/0231205 A1 | 10/2005 | Bertness et al. |
| 2005/0264296 A1 | 12/2005 | Philbrook |
| 2006/0006876 A1 | 1/2006 | Bertness |
| 2006/0017447 A1 | 1/2006 | Bertness et al. |
| 2006/0038572 A1 | 2/2006 | Philbrook |
| 2006/0051659 A1 | 3/2006 | Kelly et al. |
| 2006/0125482 A1 | 6/2006 | Klang et al. |
| 2006/0125483 A1 | 6/2006 | Bertness |
| 2006/0192564 A1 | 8/2006 | Brown et al. |
| 2006/0217914 A1 | 9/2006 | Bertness |
| 2006/0267575 A1 | 11/2006 | Sampson et al. |
| 2006/0279288 A1 | 12/2006 | Klang |
| 2007/0069734 A1 | 3/2007 | Bertness |
| 2007/0090844 A1 | 4/2007 | Klang |
| 2007/0159177 A1 | 7/2007 | Bertness et al. |
| 2007/0182367 A1 | 8/2007 | Partovi |
| 2008/0024137 A1 | 1/2008 | Carlin et al. |
| 2008/0106267 A1 | 5/2008 | Bertness |
| 2008/0204030 A1 | 8/2008 | Brown et al. |
| 2008/0252437 A1 | 10/2008 | Bertness et al. |
| 2008/0315830 A1 | 12/2008 | Bertness |
| 2009/0024266 A1 | 1/2009 | Bertness et al. |
| 2009/0027056 A1 | 1/2009 | Huang et al. |
| 2009/0051365 A1 | 2/2009 | Bertness |
| 2009/0115420 A1 | 5/2009 | Koch et al. |
| 2009/0160451 A1 | 6/2009 | Bertness |
| 2009/0184165 A1 | 7/2009 | Bertness et al. |
| 2009/0187495 A1 | 7/2009 | Bertness et al. |
| 2009/0212781 A1 | 8/2009 | Bertness et al. |
| 2009/0295395 A1 | 12/2009 | Bertness |
| 2009/0311919 A1 | 12/2009 | Smith et al. |
| 2010/0094575 A1 | 4/2010 | Andrieu et al. |
| 2010/0194576 A1 | 8/2010 | Bertness |
| 2010/0292942 A1 | 11/2010 | Golf et al. |
| 2011/0015815 A1 | 1/2011 | Bertness |
| 2011/0257913 A1 | 10/2011 | Philbrook et al. |
| 2011/0265025 A1 | 10/2011 | Bertness |
| 2011/0300416 A1 | 12/2011 | Bertness |
| 2011/0309800 A1 | 12/2011 | Bertness |
| 2012/0035870 A1 | 2/2012 | Bertness |
| 2012/0035876 A1 | 2/2012 | Bertness et al. |
| 2012/0079710 A1 | 4/2012 | Bertness |
| 2013/0087624 A1 | 4/2013 | Bertness et al. |
| 2013/0154652 A1 | 6/2013 | Rice et al. |
| 2013/0158782 A1 | 6/2013 | Bertness et al. |
| 2013/0311124 A1 | 11/2013 | van Bremen |
| 2014/0002021 A1 | 1/2014 | Bertness |
| 2014/0005965 A1* | 1/2014 | Vestama ............... H01M 10/48 |
| | | 702/63 |
| 2014/0117997 A1 | 5/2014 | Bertness |
| 2014/0266225 A1 | 9/2014 | Coleman et al. |
| 2015/0168499 A1 | 6/2015 | Palmisano |
| 2015/0200470 A1 | 7/2015 | Bertness |
| 2016/0011271 A1 | 1/2016 | Bertness |
| 2016/0091571 A1 | 3/2016 | Salo, III |
| 2016/0154044 A1 | 6/2016 | Bertness |
| 2016/0171799 A1 | 6/2016 | Bertness |
| 2016/0216335 A1 | 7/2016 | Bertness |
| 2016/0238667 A1 | 8/2016 | Palmisano et al. |
| 2016/0253852 A1 | 9/2016 | Bertness et al. |
| 2016/0285284 A1 | 9/2016 | Matlapudi et al. |
| 2017/0093056 A1 | 3/2017 | Salo, III et al. |
| 2017/0373410 A1 | 12/2017 | Lipkin et al. |
| 2018/0043778 A1* | 2/2018 | Murbach ............. G01R 31/389 |
| 2018/0113171 A1 | 4/2018 | Bertness |
| 2018/0306867 A1 | 10/2018 | Bertness |
| 2019/0105998 A1 | 4/2019 | Bertness |
| 2019/0152332 A1 | 5/2019 | Bertness |
| 2019/0154763 A1 | 5/2019 | Bertness |
| 2019/0181658 A1* | 6/2019 | Kitagawa ............. H02J 7/0047 |
| 2019/0204392 A1 | 7/2019 | Bertness |
| 2019/0271747 A1* | 9/2019 | Osaka ................. G01R 31/367 |
| 2022/0011373 A1* | 1/2022 | Zappen ............... G01R 31/389 |

FOREIGN PATENT DOCUMENTS

| | | |
|---|---|---|
| EP | 1181540 A1 | 2/2002 |
| EP | 0990150 B1 | 8/2004 |
| EP | 1634088 A2 | 3/2006 |
| EP | 1075655 B1 | 10/2006 |
| EP | 1206826 B1 | 2/2009 |
| EP | 1485726 B1 | 10/2010 |
| EP | 2897229 A1 | 7/2015 |
| GB | 2377833 A | 1/2003 |
| JP | H10228889 A | 8/1998 |
| JP | 2001076730 A | 3/2001 |
| JP | 2004199910 A | 7/2004 |
| WO | 1996029773 A2 | 9/1996 |
| WO | 1997044652 A1 | 11/1997 |
| WO | 1998004910 A1 | 2/1998 |
| WO | 1998015821 A1 | 4/1998 |
| WO | 1998040925 A1 | 9/1998 |
| WO | 1999023738 A1 | 5/1999 |
| WO | 1999056121 A1 | 11/1999 |
| WO | 2000019578 A1 | 4/2000 |
| WO | 2000062049 A1 | 10/2000 |
| WO | 2000067359 A1 | 11/2000 |
| WO | 2001059443 A1 | 8/2001 |
| WO | 2003025602 A1 | 3/2003 |
| WO | 2003034084 A1 | 4/2003 |
| WO | 2003076960 A1 | 9/2003 |
| WO | 2003079032 A1 | 9/2003 |
| WO | 2003079033 A1 | 9/2003 |
| WO | 2003084024 A2 | 10/2003 |
| WO | 2004023579 A2 | 3/2004 |
| WO | 2004023580 A2 | 3/2004 |
| WO | 2004042840 A2 | 5/2004 |
| WO | 2004062010 A1 | 7/2004 |
| WO | 2004106946 A2 | 12/2004 |
| WO | 2007027702 A2 | 3/2007 |
| WO | 2007075403 A2 | 7/2007 |
| WO | 2009011875 A2 | 1/2009 |
| WO | 2010091170 A1 | 8/2010 |
| WO | 2011109343 A2 | 9/2011 |
| WO | 2011153419 A2 | 12/2011 |
| WO | 2011159455 A1 | 12/2011 |
| WO | 2012021672 A1 | 2/2012 |
| WO | 2012044767 A2 | 4/2012 |
| WO | 2013070850 A2 | 5/2013 |

(56) References Cited

FOREIGN PATENT DOCUMENTS

| WO | 2014004769 | A2 | 1/2014 |
| WO | 2015089249 | A1 | 6/2015 |
| WO | 2016123075 | A1 | 8/2016 |
| WO | 2016176405 | A1 | 11/2016 |
| WO | 2019147546 | A1 | 8/2019 |
| WO | 2019147549 | A1 | 8/2019 |

OTHER PUBLICATIONS

Brooks "Smart Accelerometers with Wireless Interfaces for the Condition Monitoring Industry" (May 2-5, 1999).
Buchmann "Artificial Intelligence Reads Battery State-of-Health in Three Minutes" (2001).
Buchmann; www.buchmann.ca/article 14-page2.asp; "Battery Analyzers"; 2001.
Byers, W.A. et al., "Computerized Pattern Recognition Applied to Ni—Cd Cell Lifetime Prediction", J. Electrochem. Soc., vol. 126, No. 5, p. 720-725, May 1979.
Chen et al.; On parametric t-norm-sum-gravity inference method for fuzzy logic control; IEEE International Conference on Fuzzy Systems Proceedings; vol. 1; May 4-9, 1998, pp. 510-515.
Cox et al; Battery state of health monitoring, combining conductance technology with other measurement parameters for real-time battery performance analysis; Twenty-second International Telecommunications Energy Conference; Sep. 10-14, 2000; pp. 342-347.
Eastman "Guide to GIS and Image Processing" (May 2001).
Emami et al; Development of a systematic methodology of fuzzy logic modeling; IEEE Transactions on Fuzzy Systems; vol. 6, Is. 3; Aug. 1998; pp. 346-361.
Feder, D.O., Performance measurements and reliability of VRLA batteries, Proceedings of the 1995 INTELEC Conference.
Florescu et al; Heuristic linearization of external characteristics of DC-DC converters using fuzzy control; Proceedings of the IEEE International Symposium on Industrial Electronics; vol. 1; Jul. 12-16, 1999; pp. 274-279.
Gurries, Smart Battery Charger is Programmed via the SMBus; Linear Technology Magazine; 1999www.linear.com/pc/downloadDocument.do?navid=H0,C1,C1003,C1037,C1078,C1089,P1762,D4852; Nov. 1999; pp. 6-10, 18.
Huet, F., A review of impedance measurements for determination of the state of charge or state of health of secondary batteries, Journal of Power Sources 70 (1998), 56-69.
Jou et al; An adaptive fuzzy logic controller: its VLSI architecture and applications; IEEE Transactions on Very Large Scale Integration Systems; vol. 8, Is. 1; Feb. 2000; pp. 52-60.
Mao et al; Approximation capability of fuzzy systems using translations and dilations of one fixed function as membership functions; IEEE Transactions on Fuzzy Systems; vol. 5, Is. 3; Aug. 1997; pp. 468-473.
Nan, C-W., et al., "Large magnetoelectric response in multiferroic polymer-based composites", Phys. Rev. B 71, 014102 (2005).
Nathan, A., "How to achieve nanotesla resolution with integrated silicon magnetotransistors", Electron Devices Meeting, 1989, IEDM '89, pp. 511-514 (Dec. 3-6, 1989).
Nguyen, V.D.F., "Magnetic sensors for nanotesia detection using planar Hall effect", Sensors and actuators, A, vol. 53, No. 1-3, pp. 256-620 (1996).
Noworolski, Z. et al., Can a battery ohmic tester distinguish a good cell from a pool of better ones?, Telecommunications Energy Conference 2002.
Pedrycz et al; Information granulation for concept formation; Proceedings of the ACM symposium on Applied computing; Mar. 2000.
Singh, P. et al., "A Fuzzy System Methodology to Determine State-of-Charge in Primary Li/So2 and Other Batteries", (1998).
Rao et al "A tunable fuzzy logic controller for vehicle-active suspension systems"; Fuzzy Sets and Systems 85; 1997; pp. 11-21.
Rine et al; A reusable software adaptive fuzzy controller architecture; ACM symposium on Applied Computing Proceedings; Feb. 1996.
Ryu, et al., "Magnetoelectric Effect in Composites of Magnetostrictive and Piezoelectric Materials", Journal of Electroceramics, 8, 107-119 (Aug. 2002).
Schrag, B.D. et al., "Magnetic current imaging with magnetic tunnel junction sensors: case study and analysis", Proceedings of the 2006 International Symposium for Testing and Failure Analysis (2006).
Shen, et al., "In situ detection of single micron-sized magnetic beads using magnetic tunnel junction sensors", Applied Physics Letters 86, 253901 (2005).
Shi et al; A learning algorithm for tuning fuzzy inference rules; IEEE International Fuzzy Systems Conference Proceedings; vol. 1; Aug. 22-25, 1999; pp. 378-382.
Spath et al; The detection of the state of health of lead acid batteries; 19th International Telecommunications Energy Conference; Oct. 19-23, 1997; pp. 681-686.
King, Z.P. et al., "Modeling and detection of quasi-static nanotesla magnetic field variations using magnetoelectric laminate sensors", Meas. Sci. Technol. 19, 015206 (2008).
Zhang et al; Learning fuzzy concept prototypes using genetic algorithms; IEEE International Fuzzy Systems Conference Proceedings; vol. 3; Aug. 22-25, 1999; pp. 1790-1795.

* cited by examiner

100

| MEASURE TERMINAL VOLTAGE | 101 |

↓

| WAIT | 102 |

↓

| MEASURE TERMINAL VOLTAGE | 103 |

↓

| COMPUTE RATE OF CHANGE | 104 |

↓

| DETERMINE REST TIME | 105 |

↓

| COMPENSATE FOR REST TIME | 106 |

APPARATUS AND METHODS FOR TESTING ELECTROCHEMICAL SYSTEMS

CROSS-REFERENCE TO RELATED APPLICATIONS

This application claims priority from U.S. application No. 62/994,687 filed 25 Mar. 2020 and entitled APPARATUS AND METHODS FOR TESTING ELECTROCHEMICAL SYSTEMS which is hereby incorporated herein by reference for all purposes. For purposes of the United States of America, this application claims the benefit under 35 U.S.C. § 119 of U.S. application No. 62/994,687 filed 25 Mar. 2020 and entitled APPARATUS AND METHODS FOR TESTING ELECTROCHEMICAL SYSTEMS which is hereby incorporated herein by reference for all purposes.

FIELD

This invention relates to testing electrochemical systems such as electrical batteries and fuel cells. Example embodiments provide apparatus and methods for testing electrochemical systems.

BACKGROUND

Electrochemical systems (e.g. batteries, fuel cells, etc.) are used to provide electrical power in a wide range of applications. For example, batteries are found in automobiles, air planes, marine vessels, portable electronics, watches, remote weather stations, communication equipment, uninterruptable power supplies, etc. Electrochemical systems have limited life spans. Such systems tend to degrade with age. There is a need for ways to accurately and efficiently determine conditions of batteries and other electrochemical systems. This need is particularly acute for electrochemical systems that are used in critical applications (i.e. where failure could lead to severe undesirable consequences) and/or for managing large numbers of electrochemical systems (e.g. batteries in a large fleet of vehicles or a large fleet of battery powered devices).

A typical life cycle of an electrochemical system includes a phase during which the electrochemical system has optimal performance, a phase during which the electrochemical system has satisfactory performance which meets the performance requirements but no longer has optimal performance and a phase during which the electrochemical system no longer meets its performance requirements and service and/or replacement of the electrochemical system is required. It would be very useful to be able to predict in advance when an electrochemical system will fail or when the performance of the electrochemical system will fall below a threshold. This would permit the electrochemical system to be replaced or serviced during scheduled maintenance rather than having to take equipment out of service because its power source failed.

A problem is that the condition of an electrochemical system is dependent on many factors (e.g. historical use, environmental conditions, number of charge/discharge cycles, exposure to mechanical forces (e.g. shock, vibration), variations in material composition of electrodes or other parts, physical damage, variations in manufacturing tolerances, etc.). This complicates making accurate assessments of a state of health of an electrochemical system. Additionally many known battery testing systems and methods require several hours of charging and discharging of a battery to complete a test. It is not practical to perform such tests regularly, especially on a large number of batteries.

There remains a need for improved apparatus and methods for testing electrochemical systems.

SUMMARY

This invention has a number of aspects. These aspects have synergies when combined but may also be applied individually or in any combination. These aspects include, without limitation:

- systems and methods for testing electrochemical systems such as batteries or fuel cells;
- systems and methods for drawing an electrical current from electrochemical systems;
- systems and methods for compensating for the effects of different conditions of an electrochemical system (e.g. temperature, state of charge, state of equilibrium, etc.) on estimates of state of health and/or other parameters;
- systems and methods for estimating temperature of an electrochemical system;
- methods for autonomously classifying a state of health of an electrochemical system;
- leads for coupling to terminals of electrochemical systems;
- cloud-based systems for monitoring state of health and/or other parameters of electrochemical systems and methods involving such cloud based systems.

One aspect of the technology described herein provides an apparatus for testing an electrochemical system. The apparatus comprises a testing module adapted to be electrically coupled to the electrochemical system. The testing module comprises a discharge circuit configured to draw current from the electrochemical system and to controllably vary a magnitude of the discharge current. The discharge circuit may be configured to draw current from the electrochemical system continuously during testing of the electrochemical system. The apparatus comprises measurement circuitry configured to measure terminal voltage across terminals of the electrochemical system and current drawn from the electrochemical system by the testing module. The apparatus also comprises a processor. The processor is configured to compensate the voltage measured by the measurement module to at least in part compensate for voltage drift caused by drawing current from the electrochemical system (continuously or otherwise) and to compute a state of health of the electrochemical system based at least in part on the compensated voltage and the measured current.

In some embodiments the testing module is configured to perform a test sequence that includes varying the magnitude of the discharge current at a plurality of different frequencies.

In some embodiments the test sequence comprises a plurality of sequential time periods and the measurement module is configured to vary the magnitude of the discharge current at a fixed frequency in each of the time periods wherein the fixed frequency is different in different ones of the time periods.

In some embodiments the test sequence includes one or more time periods during which the magnitude of the discharge current is modulated at a plurality of different frequencies.

In some embodiments the discharge circuit is configured to control the discharge current according to a waveform.

In some embodiments the waveform is a sinusoidal waveform.

In some embodiments the frequency of the waveform is set to each of a plurality of different values in a corresponding plurality of sequential testing periods.

In some embodiments the discharge circuit is configured or controlled to draw current according to a superposition of a plurality of waveforms having a corresponding number of different frequencies.

In some embodiments each waveform in the plurality of waveforms is a sinusoidal waveform.

In some embodiments the discharge circuit is configured or controlled to control the discharge current to have a magnitude within a range that results in a linear response from the electrochemical system.

In some embodiments the discharge circuit is configured or controlled to minimize introduction of a bias or constant current when drawing current from the electrochemical system.

In some embodiments the discharge circuit is configured or controlled to draw a current in the range of about 200 mA to about 5 A from the electrochemical system.

In some embodiments the discharge circuit is configured or controlled to draw a current in the range of about 0.2% to 5% of a C-rate of the electrochemical system multiplied by a capacity value of the electrochemical system.

In some embodiments the testing module is configured or controlled to vary the magnitude of the discharge current at a first frequency and the processor is configured to determine a first response of the electrochemical system at a frequency that is a harmonic of the first frequency.

In some embodiments the processor is configured to compute a state of health of the electrochemical system based at least in part on the first response.

In some embodiments the first response corresponds to the second harmonic of the first frequency.

In some embodiments the first response corresponds to the third harmonic of the first frequency.

In some embodiments the first response corresponds to the second to fifth harmonic of the first frequency.

In some embodiments the processor is configured or controlled to compute a ratio of the first response to a fundamental response of the electrochemical system at the first frequency.

In some embodiments the discharge circuit is configured or controlled to draw a current having a magnitude sufficient to force a non-linear response of the electrochemical system.

In some embodiments the discharge circuit is configured or controlled to vary a magnitude of the discharge current while the measurement module is monitoring the terminal voltage and the discharge current and the processor is configured to process the monitored terminal voltage and discharge current to determine a first magnitude of the discharge current at which the response becomes non-linear and to set a magnitude of the discharge current based on the first magnitude.

In some embodiments the discharge circuit is configured or controlled to force a non-linear response of the electrochemical system by drawing a current in the range of about 5% to 10% of a C-rate of the electrochemical system multiplied by a capacity value of the electrochemical system.

In some embodiments computing the state of health comprises computing one or more complex impedance values of the electrochemical system at one or more corresponding frequencies based on the compensated voltage and the measured current.

In some embodiments the processor is configured to compute the complex impedance for each frequency at which the electrochemical system is discharged.

In some embodiments the processor is configured to test the validity of the complex impedance values by fitting real and imaginary components of the complex impedance values to a model and assessing the validity of the complex impedance values based on values of parameters of the model.

In some embodiments the processor is configured to test the validity of the complex impedance values by fitting the complex impedance values to a transformable circuit.

In some embodiments the transformable circuit is a Kramers-Kronig transformable circuit.

In some embodiments the processor is configured to test the validity of the complex impedance values by evaluating the complex impedance values with a Hilbert logarithmic transform.

In some embodiments the processor is configured to compute the state of health based on the computed complex impedance values.

In some embodiments the processor is further configured to trigger a new test of the electrochemical system if the complex impedance values are found to be invalid.

In some embodiments the processor is further configured to generate a user warning indicating that one or more of the complex impedance values are invalid.

In some embodiments the processor is further configured to confirm for a user when the complex impedance values are valid.

In some embodiments the processor is further configured to compare the complex impedance values to reference impedance frequency spectra of other electrochemical systems of the same type as the electrochemical system that have known conditions.

In some embodiments the processor is further configured to fit parameter values for a model comprising a network of ideal electrical components to the complex impedance values.

In some embodiments the apparatus further comprises a cloud-based system.

In some embodiments the apparatus further comprises an artificial intelligence (AI) module configured to determine the state of health of the electrochemical system based at least in part on the compensated voltage and the measured current.

In some embodiments the AI module is configured to receive at least one of: the measured voltage, the measured current and parameters of a model fitted to the measured voltage and current.

In some embodiments the AI module comprises a trained neural network.

In some embodiments the AI module part of a cloud-based system is connected to receive measured voltages and currents obtained by the measurement module by way of a data communication network.

In some embodiments the AI module is trained using data collected by testing a number of calibration electrochemical systems that are of the same type as the electrochemical system and have a wide range of conditions from new and meeting all performance specifications to end of life.

In some embodiments the data for the calibration electrochemical systems is stored on the cloud-based system.

In some embodiments the AI module comprises at least one algorithm selected from the group consisting of linear regression, K-means, logistic regression, Naive Bayes, kNN,

5 random forest, dimensionality reduction algorithms, gradient boosting algorithms and support vector machines.

In some embodiments the AI module is configured to identify a subset of features that are relevant to determining the state of health of the electrochemical system and to disregard other features while determining the state of health of the electrochemical system.

In some embodiments the AI module is configured to identify a sub-range of frequencies that is most relevant to determining the state of health of the electrochemical system and to disregard data corresponding to frequencies outside of the sub-range of frequencies.

In some embodiments the processor is configured to compensate the voltage measured by the measurement module using a genetic algorithm.

In some embodiments the genetic algorithm comprises subtracting an average of the measured voltage signal from the measured voltage signal, transforming the measured voltage signal into a frequency domain signal, identifying a voltage drift peak in the frequency signal corresponding to the voltage drift and optimizing parameter values defining a parameterized tuning curve such that subtracting the tuning curve from the measured voltage signal minimizes the magnitude of the voltage drift peak.

In some embodiments the genetic algorithm comprises subtracting an average of the measured voltage signal from the measured voltage signal prior to transforming the measured voltage signal.

In some embodiments the tuning curve is a non-linear curve.

In some embodiments the tuning curve is a spline curve having a plurality of sections joined at knots.

In some embodiments locations of the knots are evenly spaced in a time dimension spanning an acquisition period for the measured voltage signals.

In some embodiments the tuning curve is a polynomial or an exponential decay curve.

In some embodiments the optimizing comprises making a plurality of copies of a candidate curve obtained by initializing the parameters of the training curve and randomly adjusting the parameter values for each of the candidate curves, subtracting each of the candidate curves from the voltage signal to yield a corresponding candidate voltage signal, transforming the candidate voltage signal into the frequency domain and comparing the magnitudes for the drift voltage peaks in the transformed candidate voltage signals.

In some embodiments an objective function used by the genetic algorithm is a function that has a value that is proportional to a squared error between points of the discharge signal and points on an idealized sine-wave.

In some embodiments the genetic algorithm comprises one or more of: particle swarm, simulated annealing, gradient descent and stochastic hill climbing.

In some embodiments the processor is configured to compensate the voltage measured by the measurement module by averaging local maxima and minima of the measured voltage signal together to generate a compensation signal and subtracting the compensation signal from the measured voltage signal.

In some embodiments the processor is configured to fit a first curve to the maxima of the measured voltage signal, fit a second curve to the minima of the measured voltage signal and then average the first and second curves to yield the compensation signal.

In some embodiments the first and second curves comprise decaying exponential curves, spline curves or polynomial curves.

In some embodiments the processor is configured to compensate the voltage measured by the measurement module by filtering the measured voltage to generate a compensation curve and subtracting the compensation curve from the measured voltage data.

In some embodiments the processor is configured to compensate the voltage measured by the measurement module by measuring a characteristic drift by performing steps comprising discharging the electrochemical system for a period of time while measuring the terminal voltage of the battery to yield a characteristic drift curve and subtracting the characteristic drift curve from the measured voltage data.

In some embodiments the apparatus is configured to obtain a first characteristic drift curve before performing the testing of the electrochemical system.

In some embodiments the apparatus is configured to obtain a second characteristic drift curve after performing the testing of the electrochemical system.

In some embodiments the apparatus is configured to obtain a first characteristic drift curve before performing the testing of the electrochemical system and a second characteristic drift curve after performing the testing of the electrochemical system and to average the first and second characteristic drift curves.

In some embodiments discharging the electrochemical system for a period of time while measuring the terminal voltage of the battery to yield a characteristic drift curve comprises modulating the current drawn while discharging the electrochemical system to match an average current of the testing from the voltage signal measured during the testing.

In some embodiments the apparatus comprises a clip for coupling the testing module to a terminal of the electrochemical system. The clip may comprise a first part comprising a first conducting surface and a second part comprising a second conducting surface. The second part may be pivotally coupled to the first part. At least one of the first and second conducting surfaces may be shaped to conform to a surface of the terminal of the electrochemical system. The first part may be connected in the discharge circuit and the second part may be connected to a voltage measuring part of the measurement module.

In some embodiments the processor is configured to perform a method for compensating for state of charge of the electrochemical system. The method may comprise measuring an open circuit voltage of the electrochemical system, determining a scaling factor based on the measured open circuit voltage, and scaling test data corresponding to a test of the electrochemical system based on the scaling factor.

In some embodiments the processor is configured to perform a method for compensating for rest time of the electrochemical system. The method may comprise determining a time since the electrochemical system was last charged and adjusting test data corresponding to a test of the electrochemical system based on the determined time.

In some embodiments the processor is configured to perform a method for determining temperature of the electrochemical system. The method may comprise measuring temperature of the electrochemical system using a temperature sensor for a first amount of time. The first amount of time may be less than a second amount of time required for the electrochemical system and the temperature sensor to reach thermal equilibrium. The method may also comprise determining a rate of change of temperature of the electrochemical system based at least in part on the measured temperature and the first amount of time. The method may also comprise based at least in part on the determined rate of change of temperature of the electrochemical system determining a temperature of the electrochemical system.

Another aspect of the technology described herein provides a method for testing an electrochemical system. The method comprises drawing current from the electrochemical system at a plurality of different rates, measuring voltage across terminals of the electrochemical system and current drawn from the electrochemical system as the current is being drawn from the electrochemical system, compensating at least in part the measured voltage for voltage drift which was generated by drawing current from the electrochemical system and computing a state of health of the electrochemical system based at least in part on the compensated voltage and the measured current. The current may be drawn continuously from the electrochemical system.

Another aspect of the technology described herein provides a method for testing an electrochemical system. The method may comprise continuously drawing discharge current from the electrochemical system while controlling a magnitude of the discharge current and measuring the discharge current and a terminal voltage of the electrochemical system, compensating the measured voltage to at least in part compensate for voltage drift caused by continuously drawing current from the electrochemical system and computing a state of health of the electrochemical system based at least in part on the compensated voltage and the measured current.

Another aspect of the technology described herein provides apparatus for managing a plurality of electrochemical systems. The apparatus comprises at least one testing apparatus for testing an electrochemical system of the plurality of electrochemical systems. The at least one testing apparatus is configured to collect data corresponding to a condition of the electrochemical system. The apparatus may also comprise a cloud-based system comprising a data store storing data from previous tests of electrochemical systems and a processor configured to determine the condition of the electrochemical system based at least in part on the collected data and the stored data. The apparatus may also comprise a network interface communicatively coupling the at least one testing apparatus with the cloud-based system.

Another aspect of the technology described herein provides a clip for coupling a lead to a terminal of an electrochemical system. The clip comprises a first part comprising a first conducting surface and a second part comprising a second conducting surface. The second part is movable relative to the first part to engage a terminal of an electrical system between the first and second parts (e.g. the first part may be pivotally coupled to the second part). At least one of the first and second conducting surfaces may be shaped to conform to a surface of the terminal of the electrochemical system.

Another aspect of the technology described herein provides a method for compensating for state of charge of an electrochemical system. The method comprises measuring an open circuit voltage of the electrochemical system, determining a scaling factor based on the measured open circuit voltage and scaling test data corresponding to a test of the electrochemical system based on the scaling factor.

Another aspect of the technology described herein provides a method for compensating for rest time of an electrochemical system. The method comprises determining a time since the electrochemical system was last charged and adjusting test data corresponding to a test of the electrochemical system based on the determined time.

Another aspect of the technology described herein provides a method for determining temperature of an electrochemical system. The method comprises measuring temperature of the electrochemical system using a temperature sensor for a first amount of time. The first amount of time may be less than a second amount of time required for the electrochemical system and the temperature sensor to reach thermal equilibrium. The method may also comprise determining a rate of change of temperature of the electrochemical system based at least in part on the measured temperature and the first amount of time and based at least in part on the determined rate of change of temperature of the electrochemical system determining a temperature of the electrochemical system.

In some embodiments the temperature sensor is in thermal contact with a terminal of the electrochemical system.

In some embodiments the temperature sensor is integrated with a clip configured to provide an electrical connection to the terminal of the electrochemical system.

Another aspect of the technology described herein provides all combinations of the aspects set out above including: any two of the above aspects, any three of the above aspects, any four of the above aspects, any five of the above aspects, any six of the above aspects, any seven of the above aspects or any eight of the above aspects.

Another aspect of the technology described herein provides the combination of any of the above aspects with any feature or combination of features described in this disclosure.

Further aspects and example embodiments are illustrated in the accompanying drawings and/or described in the following description.

It is emphasized that the invention relates to all practical combinations of the features described herein, even if these are recited in different claims, described and/or illustrated with reference to different drawings and/or described in different sentences, paragraphs or parts of the description.

BRIEF DESCRIPTION OF THE DRAWINGS

The accompanying drawings illustrate non-limiting example embodiments of the invention.

DETAILED DESCRIPTION

Figure 1:
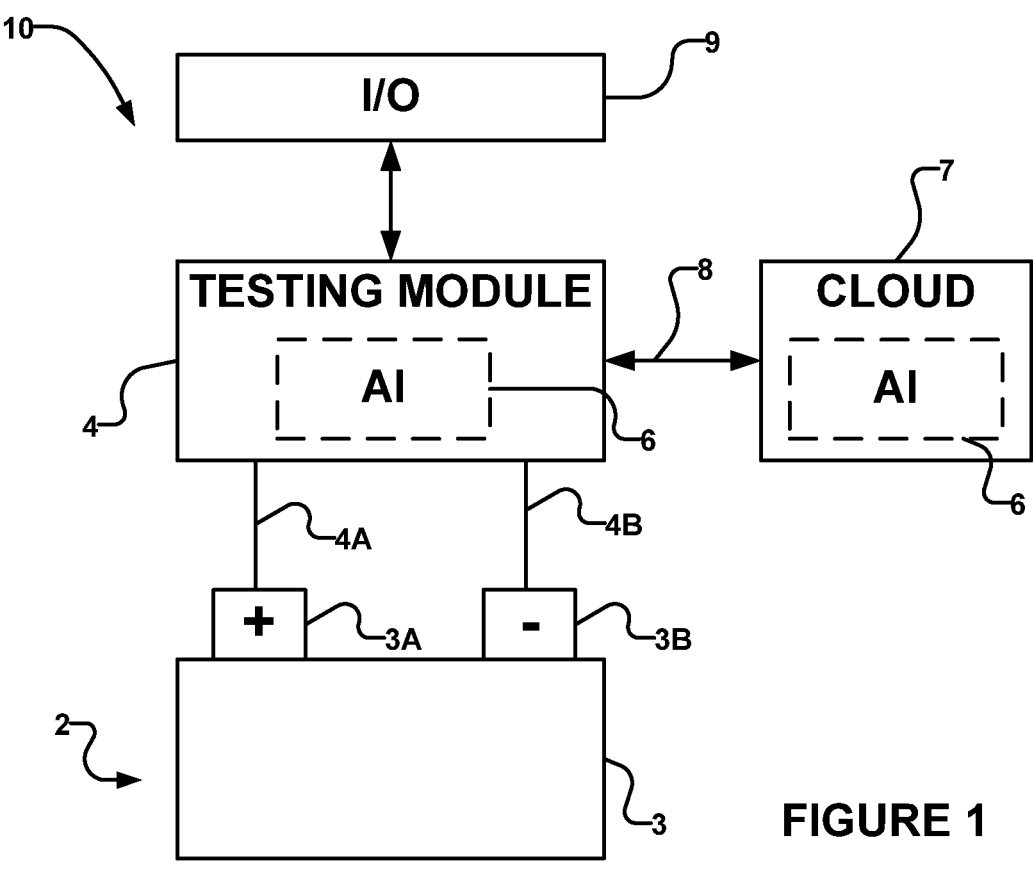
FIG. 1 is a schematic illustration of an electrochemical system testing apparatus according to an example embodiment of the invention.

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive sense.

For the purposes described herein "module" means an element or a group of elements which perform a function (or functions). Each module described herein need not be physically separate or separable from other elements of the system(s) described herein. In some cases a module described herein need not correspond to a physical element of a system (e.g. a module may be a software module, etc.).

The following description explains a number of technologies that have synergy when combined but may also be applied individually, in other combinations and in other contexts. In particular, the following description explains a method and apparatus for testing batteries and other electrochemical systems that can involve monitoring a battery or other system under test while current is being drawn from the battery or other system under test. The described testing methods and apparatus may be applied alone or in combination with any or all of:

methods and/or apparatus for compensating for drift in voltage that occurs during testing of an electrochemical system;

methods and/or apparatus for compensating for different states of charge of batteries under test;

methods and/or apparatus for estimating temperature of an electrochemical system;

test leads having integrated temperature measurement and associated methods;

cloud-based systems for testing electrochemical systems and/or processing and storing data relating to electrochemical systems and related methods.

Each of the above also may be applied individually and/or in other contexts and/or combinations.

Testing Systems and Methods

One aspect of the technology disclosed herein provides apparatus and methods for testing electrochemical systems such as batteries, fuel cells, and/or the like using a spectroscopic approach (i.e. an approach that bases one or more metrics on the response of an electrochemical system to electrical signals at different frequencies).

An example of a metric that may be determined is state of health ("SoH"). SoH is a value that indicates how performance characteristics for a particular electrochemical system match the original specifications for that system. A system that is new would be expected to completely match the original specifications for that system. For example, for a new battery in perfect condition performance measures such as: energy stored when fully charged, self-discharge rate, internal impedance, voltage when fully charged, maximum discharge current, etc. may all meet design specifications for that model of battery. The new battery may be said to have a SoH of 100%. As the battery is used and ages performance measures may drop. Eventually the battery may have degraded to the point where it is no longer serviceable. SoH can provide a useful estimate of how much life a particular battery has remaining before it is no longer serviceable and/or how close to ideal is the performance of the particular battery.

Some examples of the types of changes that can occur in an electrochemical system with age and use include:

Loss of material from electrodes (e.g. as a result of corrosion);

Change in the morphology of electrodes (e.g. changes in surface area, growth of dendrites);

Loss of electrolyte;

Changes in concentration of chemical species in an electrolyte;

Cracks or defects in electrodes, cell separators and other components;

Accumulation of salts or other chemical species that may be produced as a result of operation of the electrochemical system and/or chemical reactions among chemical species present in the electrochemical system;

Degradation of ion conductive membranes.

These changes can all affect (usually adversely) the performance of the electrochemical system.

Typically newer "good" batteries have a smaller range of impedance values, have a more defined impedance spectrum and have smaller initial impedances than older batteries that have deteriorated somewhat. FIG. 1A illustrates an example impedance spectrum of a good battery (solid curve) versus an example impedance spectrum of a bad battery (dashed curve). FIG. 1A is a Nyquist plot of the different impedance spectrums.

SoH attempts to provide a single value that sums up a complicated state of affairs. As such there are a great many ways that a measure of SoH could be defined. Different definitions of SoH could result in different SoH values for the same battery. Applying the same measure of SoH to different batteries of the same type can provide a very useful way to compare different ones of the batteries and to make decisions such as when to remove them from service. In some embodiments apparatus according to the present technology is configured to test electrochemical systems and generate a measure of SoH for each of the tested systems.

It is possible to test every specified performance characteristic for an electrochemical system and to compare the results of such tests to the specifications for the electrochemical system. This would provide an excellent basis for determining SoH as well as other parameters of and/or other metrics that characterize the electrochemical system. However, in practice such testing would take much too long to be practical.

The (complex) electrical impedance of an electrochemical system typically varies with frequency. The impedance spectrum of an electrochemical system depends on conditions of the components of the electrochemical system. As the components age and deteriorate the impedance spectrum changes. Information about the impedance spectrum for an electrochemical system is relevant to the performance of the electrochemical system because changes to components of an electrochemical system that affect performance typically also affect impedance and vice versa.

For example:

a reduction in surface area of an electrode in a battery may reduce both a capacitive reactance component of the impedance and a maximum current that can be drawn from the battery (typically appears in the high to medium frequency range of the impedance spectrum);

a reduction of concentration of current carriers in an electrolyte may increase a resistive component of the impedance and reduce a maximum current that can be drawn from the battery (typically referred to as the "diffusion region" in the art and may appear in the low frequency region of the impedance spectrum);

a coating or deposit on an electrode of a battery may increase a resistive component of the impedance, alter a capacitive reactance component of the impedance and reduce a maximum current that can be drawn from the battery (typically referred to as the "charge transfer region" in the art and may appear in the medium frequency region).

Frequency ranges may be different for different batteries. In some cases frequency ranges vary based on factors such as battery type, battery chemistry, capacity, state of health and/or the like. For a 12V lead acid battery, for example (non-limiting):

frequencies greater than about 300 Hz may be considered high frequency (e.g. 300 Hz to 2 KHz);

frequencies in the range of about 2 Hz to about 300 Hz may be considered medium frequency;

frequencies less than about 2 Hz may be considered low frequency.

One aspect of the invention tests electrochemical systems by measuring impedances of the systems at different frequencies and processing results of the impedance measurements to characterize the electrochemical systems. For example, the impedance spectrum may be processed to yield a measure of SoH and/or estimates of electrical and/or physical characteristics of the electrochemical system.

Figure 1A:
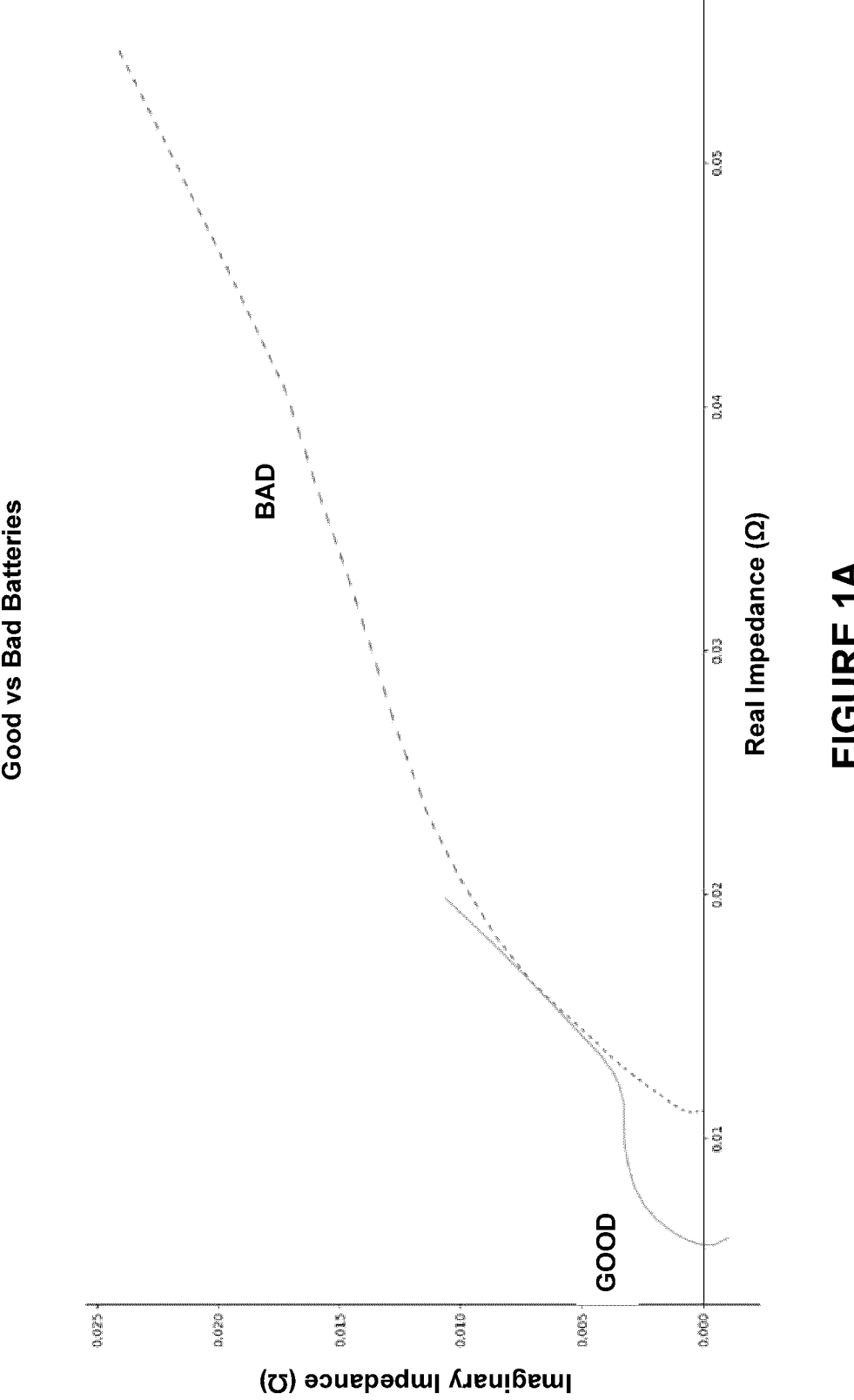
FIG. 1A is a graphic illustration (e.g. a Nyquist plot) showing example impedance spectrums of a "good" battery and a "bad" battery.

FIG. 1 schematically shows an example testing apparatus 10 for testing an electrochemical system 2. In the example case shown in FIG. 1, electrochemical system 2 is a battery 3. However, as described elsewhere herein, electrochemical system 2 may be any system having one or more electrochemical cells. In some embodiments electrochemical system 2 comprises a fuel cell.

Testing module 4 is coupled to battery 3. For example, leads 4A and 4B of testing module 4 may be coupled to terminals 3A and 3B respectively of battery 3.

Testing module 4 is configured to test battery 3 by discharging battery 3 at a plurality of different frequencies (i.e. testing module 4 draws current from battery 3 while varying a magnitude of the current being drawn at a plurality of different frequencies). In some embodiments, systems as described herein set one or more frequencies or frequency ranges for the testing automatically based on information about the type of electrochemical system being tested.

Advantageously, and in distinction to many existing battery testing technologies, testing module 4 need not charge battery 3. Testing module 4 may solely discharge battery 3 during a test. Testing module 4 does not need to incorporate charging functionality.

As battery 3 is discharged at a rate that varies at one or more different frequencies, testing module 4 measures voltage across the terminals of battery 3 (e.g. terminals 3A, 3B) and current being drawn from battery 3. Testing may be performed at one frequency at a time. For example, testing module 4 may be configured to discharge battery 3 by drawing a current from battery 3 and controlling the drawn current to vary according to a sinusoidal waveform. The frequency of the waveform may be set to each of a plurality of different values in a corresponding plurality of sequential testing periods.

As another example, testing module 4 may draw a current that is simultaneously modulated at plural frequencies. For example, in each of one or more testing periods testing module 4 may be configured to draw a current from battery 3 and control the drawn current to vary according to a superposition of a number of sinusoidal waveforms having a corresponding number of different frequencies.

Preferably testing module 4 draws a current that results in a linear (or close to linear) response from battery 3. For example, testing module 4 preferably minimizes introduction of a bias or constant current when drawing current from battery 3.

The current drawn by testing module 4 may be relatively small. The drawn current is sufficient when both the drawn current and corresponding variations in the voltage of battery 3 can be measured with sufficient precision by testing module 4. This may depend on some or all of:

the sensitivity and resolution of the voltage and current sensing components of testing module 4;

the magnitude of any electrical noise present in the measured voltage and current signals; and the characteristics of battery 3 (which affect the magnitude of variations in voltage which correspond to variations in current draw).

For example, in some embodiments the current drawn from battery 3 by testing module 4 is in the range of about 200 mA to about 5 A.

Typically, the impedance of a battery depends on the energy storage capacity of the battery. For example, a larger battery typically requires larger current draw in order to achieve a measurable voltage response. To account for varying sizes (e.g. capacities) of batteries to be tested, the current drawn by testing module 4 may be scaled by a capacity rating (i.e. a "C-rate") of battery 3. In some embodiments testing module 4 draws a current in the range of about 0.2% C-rate to 5% C-rate multiplied by a capacity value of battery 3. For example, for a battery having a capacity of 1000 mAh with a C-rate of 2 C testing module 4 may be configured to draw a current in the range of $0.2\% \times 2 \times 1000 = 4$ mA to $0.5\% \times 2 \times 1000 = 10$ mA.

In some embodiments a higher harmonic impedance response may be extracted from the impedance spectrum. For example, if battery 3 is discharged by a current having a frequency component of 200 Hz a third harmonic impedance response corresponding to a frequency of 600 Hz may be present in the output voltage signal and measured. The higher harmonic impedance response may be correlated to a condition of battery 3 (e.g. a state of health of battery 3). A higher harmonic impedance response may be extracted by forcing a non-linear response of battery 3. A non-linear response may, for example, be forced by having testing module 4 draw a higher current from battery 3. In some such embodiments testing module 4 draws a current in the range of 5% C-rate to 10% C-rate multiplied by the capacity value of battery 3.

A complex impedance of battery 3 may be computed from the measured voltage and current values for each frequency at which battery 3 is discharged (and/or at harmonics of those frequencies). The complex impedance may be expressed, for example, as:

real and imaginary components of the impedance;

capacitive reactance, inductive reactance and resistive components of the impedance; and/or relative magnitude and relative phase shift of the current and voltage signals.

In cases where testing module 4 has extracted a higher harmonic response as described elsewhere herein, a ratio of the higher harmonic response (e.g. a higher harmonic voltage response) to the fundamental or first harmonic response may be computed.

The testing by testing module 4 may be processed to yield an impedance spectrum for battery 3 made up of complex impedance values for each of a plurality of frequencies (and/or higher harmonic ratios (e.g. higher harmonic voltage ratios)). The impedance spectrum may in turn be processed to yield a SoH value or estimates of other parameters of battery 3.

The validity of the complex impedance values (i.e. the impedance spectrum(s)) may be tested through fitting real and imaginary components of the complex impedance to a model. In some embodiments, data is considered valid (i.e. data that may be relied upon for classifying a condition of battery 3) if the data satisfies certain criteria.

For example, data may be considered to be valid if:

battery 3 does not generally change electrochemically during a discharge cycle with respect to time and battery 3 generally returns to its initial electrochemical state once a discharge signal is no longer applied to battery 3 (e.g. the condition of "stability");

a measured response of battery 3 is caused by application of a discharge signal to battery 3 (e.g. the condition of "causality"); and/or a measured response of battery 3 is linear (or close to linear) (e.g. the condition of "linearity").

For example, real and imaginary components of the complex impedance at different frequencies may be fit to a transformable circuit. One non-limiting example of a transformable circuit is the Kramers-Kronig transformable circuit. Such a circuit consists of an inductor and capacitor in series with a string of RC (resistor capacitor) pairs. The number of RC pairs may be, for example, less than or equal to the number of frequencies in the complex impedances. The number of RC pairs may be chosen such that the ratio between positive valued and negative valued resistances remains close to one. This may prevent over-fitting of the values. The RC pairs may be connected in series or in parallel.

Additionally, or alternatively, a Hilbert logarithmic transform (known in the art as "Z-HIT") may, for example, be used to evaluate validity of the complex impedance values. In both of the example cases described above, a model fit may be obtained. A statistical analysis of the residuals between the model and the underlying data may provide insight into the validity of the data.

If data is found to be invalid (e.g. have a low (less than 30%, 25%, 20%, 10%, 5%, etc.) likelihood of being accurate) a system as described herein may be configured in ways that include one or more of:

Data that is not recognized as being valid (i.e. does not satisfy the criteria) may be ignored or given reduced weight.

Where data is not considered valid the testing may be repeated. This may be done automatically. Conditions of the testing may optionally be changed in a way that avoids the problem that caused the data not to satisfy one or more validity criteria. For example, where the condition of stability does not apply (e.g. as determined by checking battery characteristics such as OCV and/or internal resistance before and after testing) the testing may be repeated using a reduced current draw and/or the testing may be repeated with a reduced set of frequencies and/or battery 3 may be charged for a period before repeating the testing.

For example, testing module 4 may perform a new test of battery 3. If the data is found to be invalid repeatedly, testing module 4 (or apparatus 10) may generate a user warning (e.g. display an electronic warning message, print a warning message, an alarm, turning on a warning indicator (e.g. a red LED), etc.) indicating that the data is invalid. If the data is found to be valid testing module 4 (or apparatus 10) may, for example, confirm for a user that the data is valid (e.g. display an electronic confirmation message, print a confirmation message, turn on a confirmation indication (e.g. a green LED), etc.).

The processing may directly or indirectly compare the impedance frequency spectrum of battery 3 to impedance frequency spectra of other batteries of the same type as battery 3 that have known conditions.

An electrochemical system such as battery 3 may be modelled by an electrical circuit made up of a network of ideal electrical components (e.g. resistors, capacitors, inductors). In fact an electrochemical system may be modelled by many different models. Different ones of the models may, for example, comprise different electrical circuits made up of ideal electrical components. In some embodiments processing the impedance spectrum of battery 3 comprises determining parameters for one or more electrical circuit models for battery 3. The parameters may, for example, comprise values for electrical components in the one or more electric circuit models.

The electrical circuit models may be simple (e.g. a single resistor or a single capacitor or a resistor capacitor and inductor connected in parallel) or more complicated.

It is possible but not mandatory for any of the electrical circuit models to map to a physical structure of battery 3. An electrical circuit model may, for example, map to a structure of a battery by including one or more components that correspond to structures and interfaces in the battery such as electrodes, electrode-electrolyte interfaces, and electrolyte that would be expected to affect electrical properties of the battery. If a battery has a plurality of cells connected in series then an electrical circuit model may map to the structure of the battery by including sets of components that map to each cell connected in series. For example, an electrode of a cell may be modeled as having a first impedance. An electrolyte solution within the cell may be modeled as having a second impedance connected in series with the first impedance. The first impedance may comprise an RC circuit. The second impedance may also comprise an RC circuit. Other components of the cell may be modeled with different impedances. Although the impedances have been described as being connected in series, this is not mandatory.

The impedance frequency spectrum for any given electrical circuit model is determined by parameters which specify values of components in the model (e.g. resistance of resistors, capacitance of capacitors and inductance of inductors). An electrical circuit model may be fitted to match test results of a particular battery 3 by finding values of the parameters applicable to that electrical circuit model that cause the impedance frequency spectrum for the electrical circuit model to most closely fit the impedance frequency spectrum that has been measured by testing unit 4. This yields a set of parameter values that depend on the current condition of the battery under test and which will change with changes in condition of the battery under test.

Where two or more electrical circuit models are fitted to the impedance frequency spectrum for the battery under test a set of parameters is obtained for each of the electrical circuit models.

Results of the test by testing module 4 may be processed to generate data that characterizes battery 3. Advantageously the data includes values that are useful for managing battery 3 (e.g. a SoH value or an estimate of a performance characteristic of battery 3 that may be used to make decisions such as whether to replace battery 3). For example, testing module 4 may determine (without limitation):

parameters of a model (or models) corresponding to battery 3;

a state of health of battery 3 (e.g. as described elsewhere herein);

other characteristics of battery 3.

Apparatus 10 may comprise an AI module 6. AI module 6 may classify a state of health of battery 3 based on data collected from the test of battery 3. AI module 6 may receive the raw data (e.g. measured pairs of current and voltage values), parameters of a model fitted to the raw data, both raw data and the parameters of the model, etc.

Training of AI module 6 may determine what weight should be given to each type of data that is input into AI module 6. For example, in some cases AI module 6 may give the model parameters 80% weight and the impedance data 20% weight or vice versa. In some embodiments a given type of data that is input into AI module 6 is given zero weight. In some embodiments AI module 6 is trained to give specific input data highly indicative of a state of health of battery 3 a high weight. Similarly, AI module 6 may be trained to give input data generally not indicative of a state of health very little or no weight.

In some embodiments a trained neural network or other AI module 6 is connected to receive results of testing of battery 3 and to output a SoH value and/or estimate(s) of other performance characteristics of battery 3. AI module 6 may be physically co-located with testing module 4 (e.g. AI module 6 may be packaged in a housing together with the circuits of testing module 4 that acquire the impedance frequency spectrum of battery 3). Additionally, or alternatively, AI module 6 may be provided by a cloud-based system 7. In such cases testing module 4 may communicate with AI module 6 (and cloud-based system 7) via a wired or wireless network interface 8. Having AI module 6 on cloud-based system 7 may advantageously increase processing power and/or speed of AI module 6. In some embodiments AI modules 6 are provided in both testing module 4 and cloud-based system 7. In some embodiments an AI module 6 is distributed between testing module 4 and cloud-based system 7.

AI module 6 may take as inputs test data obtained by testing unit 4. This test data may include one or more of:

parameters for one or more electrical circuit models that have been fitted to the data obtained by testing the battery;

data specifying the measured impedance spectrum of battery 3; and raw testing data (e.g. sampled voltage and current waveforms obtained while testing battery 3).

Preferably, AI module 6 is trained using data collected by testing a number of calibration batteries that are of the same type as battery 3 and have a wide range of conditions from new and meeting all performance specifications to end of life. The data for the calibration batteries may, for example, be stored on cloud system 7. The data for the calibration batteries may be obtained as described above for battery 3 and may comprise any of the test data described above.

In some embodiments testing module 4 may access the calibration data via network interface 8.

AI module 6 may, for example, comprise a neural network that has been trained using the calibration data by back-propagation or another training algorithm. The neural network may, for example, comprise a number of layers each having a set of nodes. The nodes are interconnected with one another. Each node has one or more inputs and an output. Each node asserts an output value that is a function of values presented at its inputs. Each node may assign a weight to each input and may specify a function (usually a non-linear function such as a sigmoid or tanh function) which combines the weighted input values to yield the output value of the node.

The neural network may comprise an input layer having a set of nodes configured to receive data about a battery 3 (or other electrochemical system) being tested. The nodes of the input layer may be connected to receive data regarding the battery 3. For example:

one set of input nodes may be connected to receive as input real parts of the complex impedances in the impedance frequency spectrum. For example if the impedance frequency spectrum specifies complex impedance at thirty frequencies this set of input nodes may comprise 30 nodes.

one set of input nodes may be connected to receive as input imaginary parts of the complex impedances in the impedance frequency spectrum.

one set of input nodes may be connected to receive as input the ratios of higher harmonic responses to a first harmonic response (e.g. higher harmonic voltage responses to the first harmonic voltage response). For example, if a measured frequency spectrum comprises harmonic ratios for 30 different fundamental frequencies, the set of inputs may comprise 30 nodes each configured to receive one of the harmonic ratios as input. For example, if a fundamental frequency is 500 Hz, harmonic frequencies may be 1000 Hz (i.e. the second harmonic frequency), 1500 Hz (i.e. the third harmonic frequency), 2000 Hz (i.e. the fourth harmonic frequency), etc.

one or more sets of input nodes may each be connected to receive values for parameters of a corresponding electrical circuit model that have been fitted to the impedance frequency spectrum as described herein.

one set of input nodes may be connected to receive raw sampled voltage values obtained while battery 3 was being tested.

one set of input nodes may be connected to receive raw sampled current values obtained while battery 3 was being tested.

one set of input nodes may be connected to receive values indicating a type of battery 3 (e.g. a model number and/or performance specifications (such as capacity, voltage, etc.) and/or battery chemistry type).

one set of input nodes may be connected to receive values containing information regarding the specific battery 3 being tested (e.g. when was it made, when was it placed in service, what kind of service is the battery 3 in, where was it made).

one set of input nodes may be connected to receive one or more parameters related to a state of the battery (e.g. temperature, open circuit voltage, rest time, state of charge, etc.)

Depending on an architecture of the neural network some (e.g. for a sparse network) or all (e.g. for a dense network) of the nodes of the input layer are interconnected with other nodes of the neural network (e.g. outputs of the input layer nodes are provided as inputs to nodes in other layers). The way in which the nodes are interconnected is determined by an architecture of the neural network.

The neural network may include one or more intermediate layers each having a set of nodes connected to receive outputs from a previous layer and to generate outputs which are supplied as inputs to nodes of a subsequent layer. The intermediate layers are trained (e.g. by setting weights for the inputs of the nodes as described elsewhere herein) to autonomously process the input data to determine a state of health or an estimate of another performance parameter for the battery (or electrochemical system) being tested. This may commonly be referred to as "classifying" the input data. An output layer having a set of nodes provides the results of the processing or classification.

A neural network may be implemented in hardware or in one or more data processors programmed to implement the neural network using a neural network programming environment such as Tensorflow™.

Nodes in the neural network may assign different weights to different inputs. The weight assigned to an input determines how important that input is to the processing or classification of the data. In some embodiments, as described elsewhere herein, specific nodes or sets of nodes corresponding to specific parameters (e.g. certain frequencies, a state of charge, current amplitude, etc.) may have higher weights than remaining nodes or sets of nodes. Typically parameters corresponding to such nodes or sets of nodes have a stronger influence on the classification of the data than parameters corresponding to the remaining nodes.

AI module 6 may be trained using a dataset collected by testing a plurality of batteries in a lab environment. In some embodiments a portion of the dataset is used to train AI module 6 and a portion of the data set is used to verify AI module 6. The dataset may be labelled. Training AI module 6 may involve setting weights for nodes in a neural network for example.

In some embodiments AI module 6 is contemporaneously updated (e.g. retrained) once a test of battery 3 is complete. For example a completed test of battery 3 may be uploaded to the dataset with which AI module 6 is trained. Based on an outcome of the test of battery 3, one or more parameters (e.g. node weights, etc.) may be adjusted.

AI module 6 may comprise one or more presently known or future developed machine learning algorithms. For example, AI module 6 may comprise one or more of the following algorithms (non-limiting):

Linear Regression;
K-Means;
Logistic Regression;
Naive Bayes;
kNN;
Random Forest;
Dimensionality Reduction Algorithms;
Gradient Boosting Algorithms;
Artificial Neural Networks;
Deep Neural Networks;
Recurrent Neural Networks;
Convolutional Neural Networks;
Support Vector Machines;
etc.

In some embodiments AI module 6 can determine importance of features (e.g. how relevant specific features in the data are to determining a performance characteristic of battery 3). In such embodiments AI module 6 may reduce processing time by focusing on features relevant to determining performance of battery 3 while disregarding other features. For example, if only a sub-range of frequencies is relevant for determining performance of battery 3 (e.g. a State of Health of battery 3), AI module 6 may determine such sub-range of frequencies and disregard frequency values outside of the sub-range. In some such embodiments AI module 6 comprises a Random Forest algorithm.

In some embodiments AI module 6 is configured to self-verify validity of the processing completed by AI module 6 and/or the validity of the data measured by testing module 4 (e.g. a computed impedance spectrum, a measured response of battery 3, etc.). If, for example, data (e.g. a classification produced by AI module 6, a measured voltage response, etc.) deviates from what the data is expected to be based on past measurements, AI module 6 may verify whether a fault condition has been produced. A fault condition may occur, for example, if AI module 6 incorrectly classifies data, if testing module 4 incorrectly measured data, etc.

For example if the output of AI module 6 is configured to produce a probability distribution for the classes (e.g. how confident AI module 6 is about its output), a fault condition may be detected by analyzing the produced probability distribution. A probability of about 50% may indicate a fault condition (e.g. AI module 6 is unsure about the classification it provided). In some such embodiments AI module 6 comprises a function which assigns probabilities to each classification based on how confident AI module 6 is that the classification is correct. In some embodiments the function is a SoftMax activation function.

Additionally, or alternatively, AI module 6 may verify whether a fault condition has been produced by comparing a produced classification to a predicted classification of data. For example, AI module 6 may predict what a classification should be based on previously collected data (and the corresponding classifications). If the produced classification and the predicted classification differ by more than a threshold amount, AI module 6 may indicate that a fault condition has been produced. In some embodiments a fault condition is produced if the produced classification and the predicted classification are not a perfect match. In some embodiments a fault condition is produced if the produced classification and the predicted classification are less than a 90% or higher match. In some embodiments a fault condition is produced if the produced classification and the predicted classification are less than an 80% or higher match.

Once a test of battery 3 is commenced, testing module 4 discharges battery 3 and modulates the magnitude of the discharge current according to one or more test signals having different frequency compositions.

Figure 2:
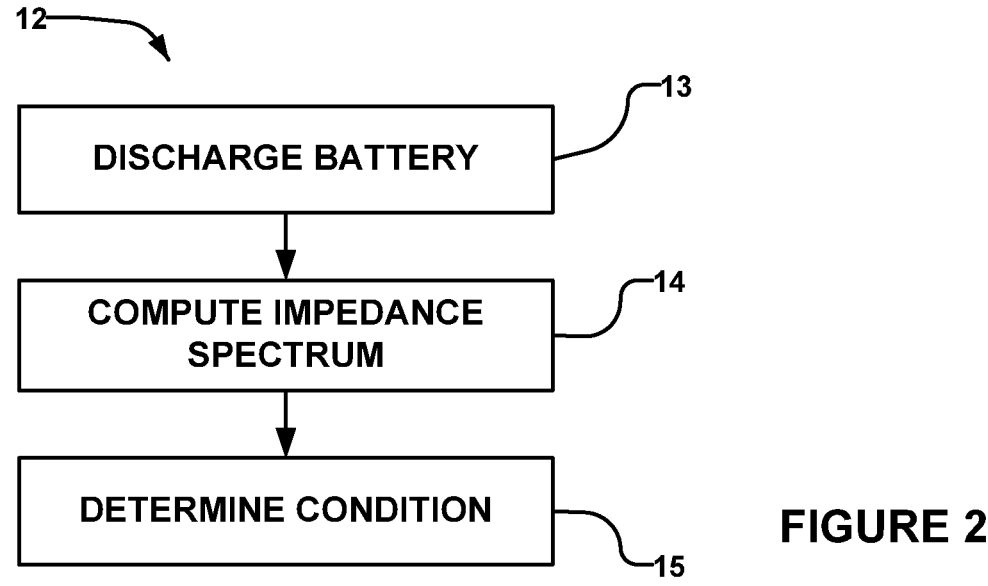
FIG. 2 is a flow chart illustrating a method according to an example embodiment of the invention.

Battery 3 may, for example, be tested according to example method 12 shown in FIG. 2.

In block 13 battery 3 is discharged. As described elsewhere herein, battery 3 may be discharged with a plurality of signals having different frequencies. As battery 3 is discharged, voltage across the terminals of battery 3 and/or current being drawn from battery 3 are measured. In block 14 a frequency response of the complex impedance of battery 3 is computed from the measured voltage and/or current data.

Parameters of one or more circuit models may be fitted to the resulting impedance frequency spectrum in block 15. The parameters of the model(s) may be compared to parameters for other batteries of the same type as battery 3 with known conditions to assess a state of health of battery 3. Additionally, or alternatively, block 15 may directly compare the impedance frequency spectrum against known impedance frequency responses for other batteries of the same type as battery 3 with known conditions to assess the state of health of battery 3. The state of health may be provided to a user via input/output interface 9 (e.g. a display, a print-out, a light corresponding to the state of health, etc.).

Testing module 4 may be configurable to test different types of battery 3. To facilitate this, testing module 4 may be configured to use:

different test signals (e.g. different frequencies or sets of frequencies) and/or different current levels;

different electrical circuit model(s); and/or different configuration and/or training of AI module 6;

for testing different types of battery 3.

Where a battery 3 to be tested may be one of several types there is a need for some way to determine which one of the types battery 3 belongs to. Information regarding the type of battery 3 may be determined, for example, by:

Receiving information about the specific type of battery 3 (or other electrochemical system) to be tested from a user via input/output interface 9. For example, a user may input one or more of a model number, rated voltage, rated current, etc. using an input device such as a keyboard, touchscreen, etc. coupled to testing module 4.

Testing module 4 may automatically determine a type of battery 3 being tested. This may be done, for example by scanning a barcode or other unique identifier, acquiring type information from a RFID tag or other data store associated with battery 3, etc.

AI module 6 may be trained to recognize one or more different types of battery based on the raw data.

In some embodiments a state of health of battery 3 may be determined autonomously by AI module 6. In some embodiments testing module 4 computes parameters of a model (or models) corresponding to battery 3 from the measured impedance frequency response. The computed parameters may be provided to AI module 6 as inputs. AI module 6 is trained to classify a state of health of battery 3 based at least in part on the computed model parameters. In some embodiments testing module 4 provides the measured impedance frequency response directly to AI module 6 as input. In such embodiments AI module 6 is trained to classify a state of health of battery 3 based at least in part on the measured impedance frequency response. In some embodiments AI module 6 receives both computed model parameters and the measured impedance frequency response as inputs.

Although apparatus 10 and method 12 have been described with reference to test battery 3, apparatus 10 and/or method 12 may be applied to test fuel cells or other types of electrochemical systems. In some such embodiments components of apparatus 10 (e.g. AI module 6) may need to be trained, calibrated, etc. for a different type of electrochemical system before apparatus 10 may be used to test such electrochemical system.

More specific aspects of example ways in which apparatus 10 and/or method 12 may be implemented will now be described.

Figure 3:
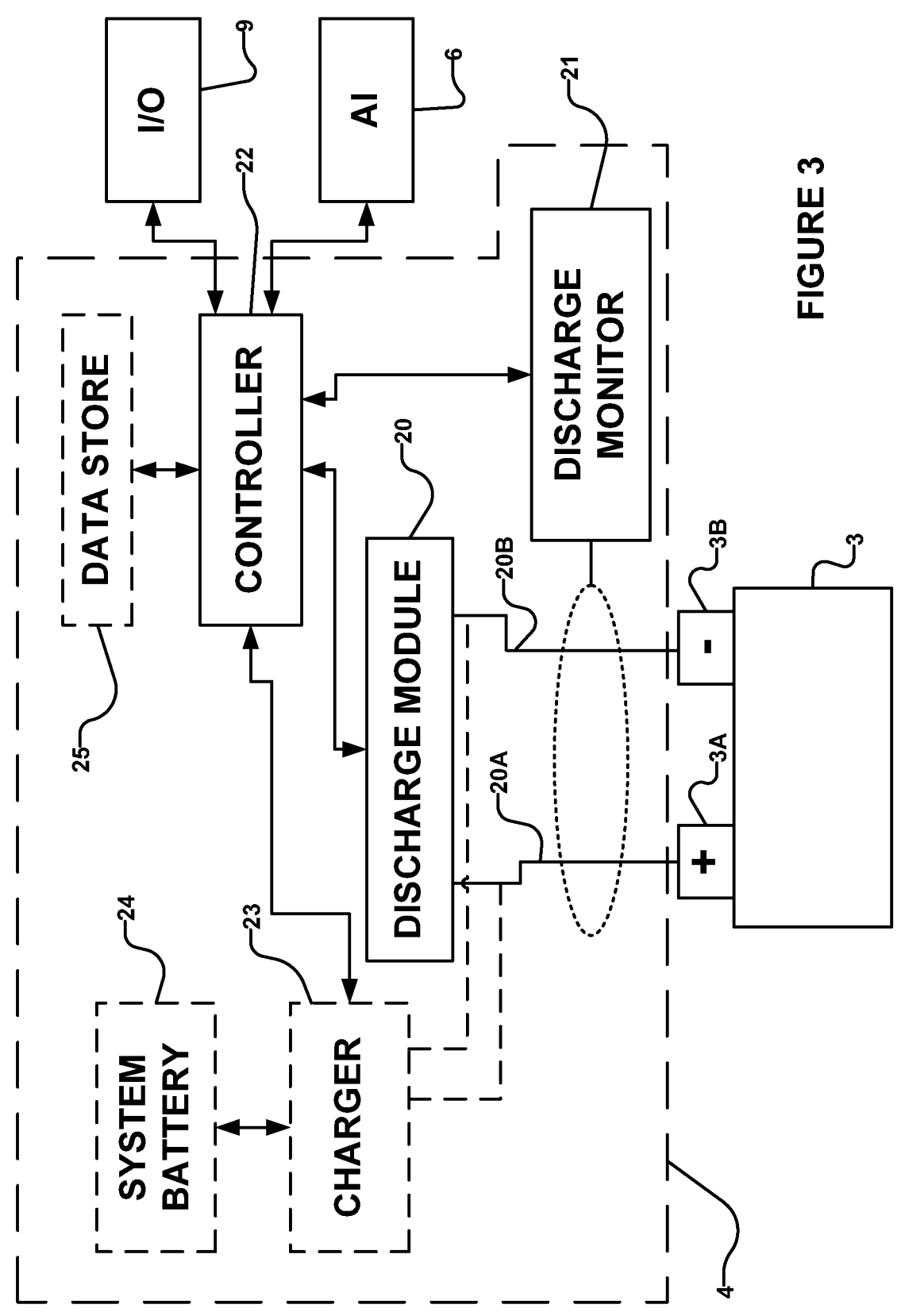
FIG. 3 is a schematic illustration of a testing module of the FIG. 1 testing apparatus according to an example embodiment of the invention.

FIG. 3 is an expanded schematic view of example testing module 4 connected to test battery 3. Testing module 4 may be configured to test batteries having electrolytic and/or galvanic cells. Battery 3 may optionally be rechargeable. Battery 3 may, for example, be a rechargeable lithium-ion battery, an alkaline battery, a lead acid battery, an aluminum-air battery, sodium ion, lithium-sulphur, solid state lithium-ion, graphene, fluoride-ion, etc.

Terminals 3A, 3B of battery 3 are connected to leads 20A, 20B of discharge module 20. Discharge module 20 loads battery 3 during a test of battery 3. As described elsewhere herein discharge module 20 may discharge battery 3 with a plurality of signals having different frequencies or frequency compositions. Each of the signals draws a current from battery 3 which corresponds to the frequency or frequencies of the signal. In some embodiments a single signal comprises two or more frequencies. For example, a first signal having a first frequency and a second signal having a second frequency may be superimposed to generate a single discharge signal. In some embodiments a switching network, multiplexers and/or the like combine signals into a single discharge signal to be applied to battery 3. In some embodiments a waveform comprising two or more frequency components is applied to control discharge of battery 3.

Once a test of battery 3 is commenced, discharge module 20 preferably continuously discharges battery 3. "Continuously discharges" means that battery 3 is not charged while a current is drawn from battery 3. "Continuously discharges" may also mean that battery 3 is not charged between application of distinct discharge signals to battery 3. "Continuously discharges" may also mean that a single discharge signal comprising varying frequencies is applied for the duration of a test (e.g. a single signal have different frequencies at different times).

Figure 3A:
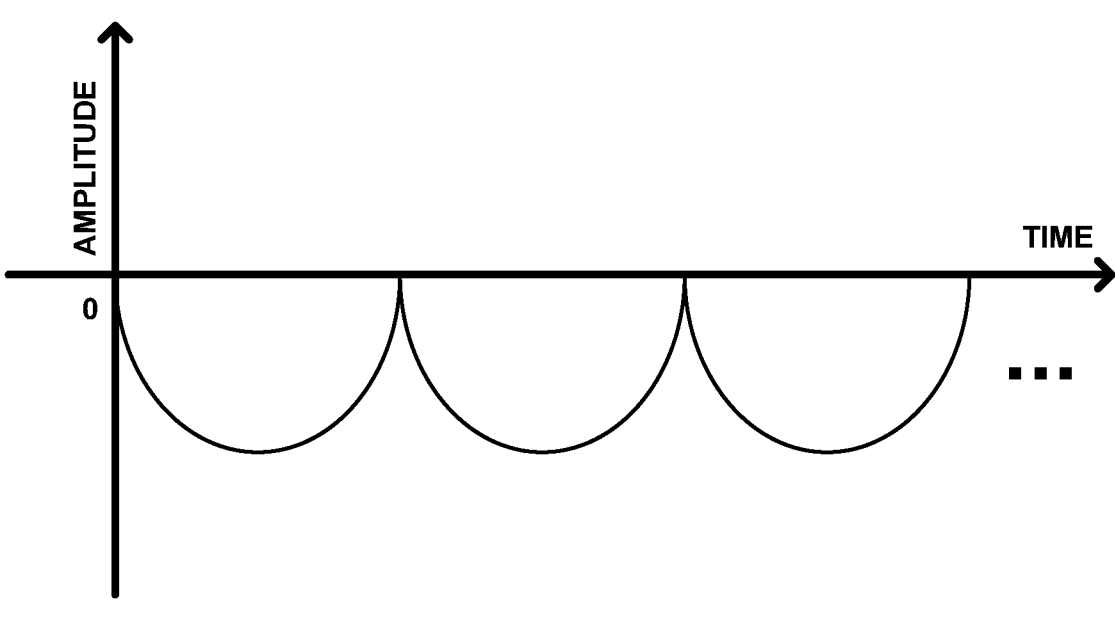
FIGS. 3A to 3E are graphical illustrations of example discharge signals which may be applied to draw a current from an electrochemical system.
Figure 3B:
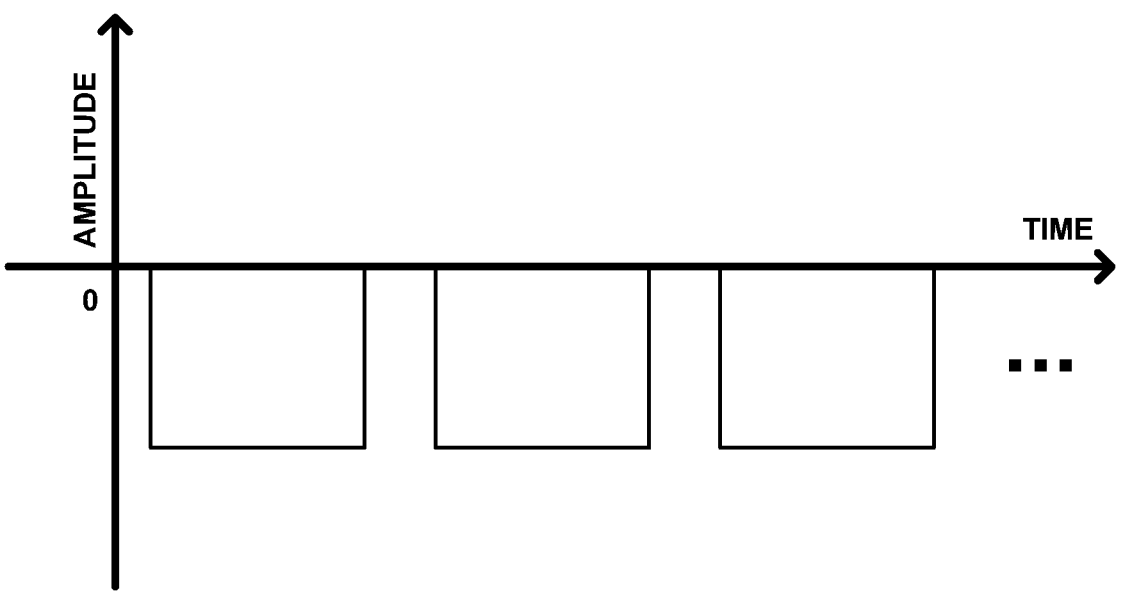
Figures 3C, 3D, 3E:
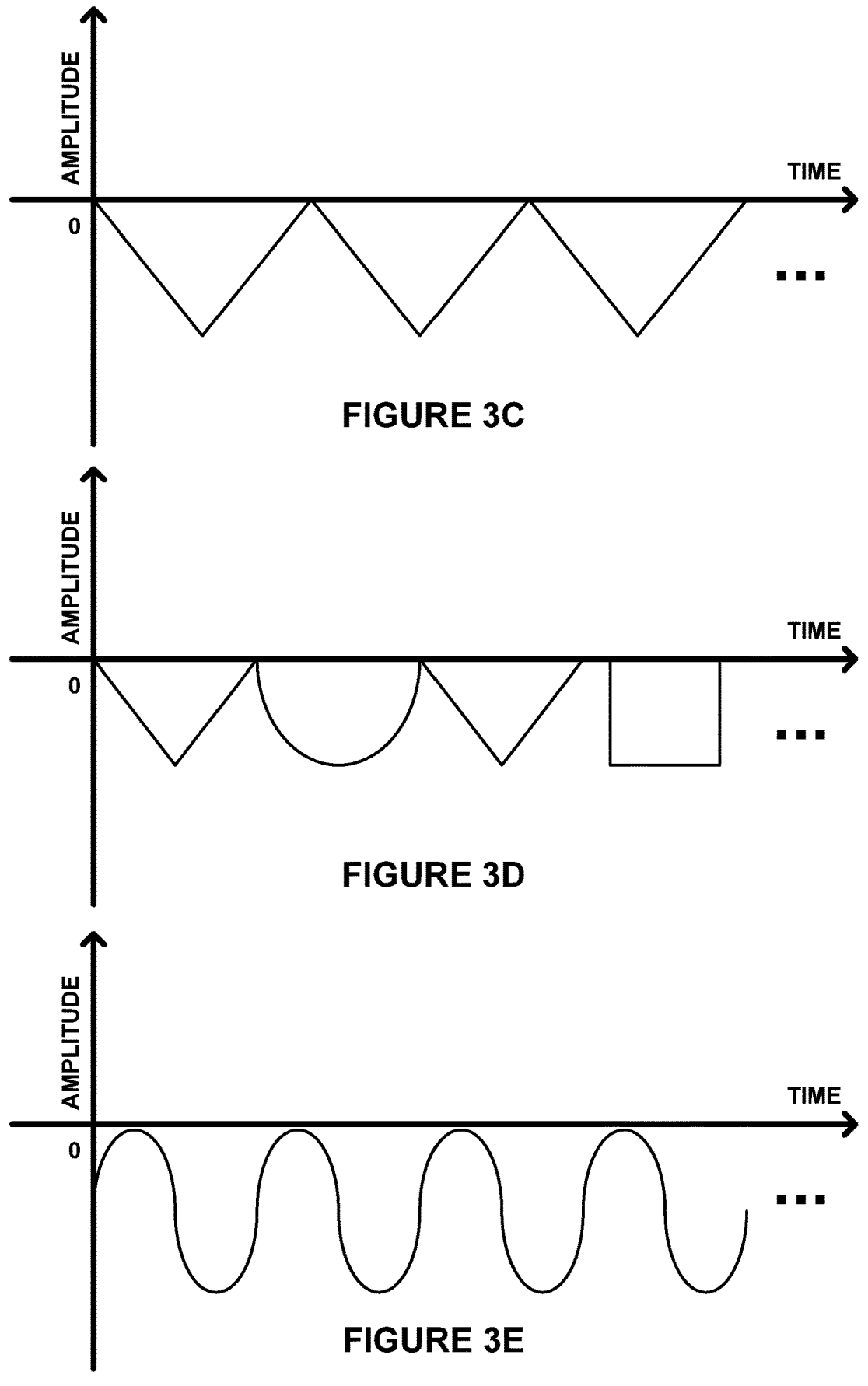

Each of the signals may comprise a signal having any type of waveform (e.g. sine, square, triangular, etc.). However, a signal which comprises a few (e.g. 1 to 10) frequency components (e.g. a signal that is a sine wave or a superposition of 2 to 10 sine waves of different frequencies) is preferred in some cases because such signals may simplify analysis and/or reduce the time required to acquire enough data to compute the impedance frequency spectrum for battery 3. A signal for continuously discharging battery 3 may comprise a waveform having exclusively negative portions (e.g. the negative portions of a periodic sine wave, square wave, triangular wave, etc.). Such discharge signals may, for example, be represented as waveforms comprising:

negative portions of a sinusoidal wave (see e.g. FIG. 3A);

negative portions of a square wave (see e.g. FIG. 3B);

negative portions of a triangular wave (see e.g. FIG. 3C), a combination of two or more of the above (see e.g. FIG. 3D);

a periodic wave having values less than or equal to 0 (e.g. a sinusoidal wave as shown in FIG. 3E);

etc.

Each discharge signal that is applied to battery 3 may have a different frequency (e.g. a DC signal, an AC signal having a frequency of 5 Hz, an AC signal having a frequency of 1000 Hz, etc.). In some embodiments the plurality of signals comprises signals having frequencies in the range from 2 kHz to 0.1 Hz. In some embodiments the plurality of signals comprises 20 or more (e.g. 30) signals having different frequencies. In some embodiments the plurality of signals comprises 10 or more signals having different frequencies. Increasing the number of different signals may improve accuracy of the test performed by testing module 4. However, increasing the number of different signals may also increase an amount of time required to complete a test of battery 3. In some embodiments the range of frequencies is tailored to a specific battery 3 (e.g. based on physical size, capacity, properties, etc. of the battery 3 being tested).

In some cases a state of health of battery 3 may be based on the complex impedance of battery 3 at only a few frequencies or a single frequency (e.g. a reduced frequency set). The sub-range of frequencies may be selected such that the complex impedance of battery 3 in the sub-range varies with the parameter (or parameters) which determines state of health. For example, in some cases the state of health of battery 3 may be correlated to the thicknesses of electrodes of battery 3. For example, the electrodes may become thinner as battery 3 ages as a result of corrosion and/or other processes. In this case the sub-range of frequencies may be selected to include selected frequencies which produce different complex impedances based on how thick the electrodes of battery 3 are.

In some cases the sub-range may comprise the higher end of the frequency spectrum for smaller batteries (i.e. smaller Rated Electrical Capacity). In some cases the sub-range may comprise the lower end of the frequency spectrum for larger batteries (e.g. diffusion region typically appears at lower frequencies for larger batteries). Larger batteries have a higher Rated Electrical Capacity than smaller batteries. For example, for an automotive starter battery a smaller Rated Electrical Capacity may be about 40 Ah and a higher Rated Electrical Capacity may be about 200 Ah. For a Li-ion mobile phone battery, for example, a smaller Rated Electrical Capacity may be about 1000 mAh and a higher Rated Electrical Capacity may be about 4000 mAh.

Each signal typically does not draw a large current from battery 3. For example, each of the plurality of signals may draw a current of about 500 mA or less. An amount of current that is drawn may be dynamically varied by apparatus 10. However, testing module 4 preferably keeps a voltage variation of each cell of a battery 3 below a threshold level. In some embodiments the voltage variation of each cell resulting from drawing the testing current is 10 mV per cell or less.

Testing module 4 may adjust a signal that is to be applied to battery 3 in order to maintain a voltage variation of each of the cells within battery 3 below a threshold level. For example, testing module 4 may apply an initial excitation signal (e.g. via discharge module 20) to battery 3. A voltage response of battery 3 may be measured while the initial excitation signal is applied to battery 3. Based on the measured voltage response, an amplitude of the current to be drawn by each signal of the plurality of signals may be set such that drawing the set amount of current would not exceed the threshold for voltage variation of the cell.

As another example, a desired amplitude of the voltage variation across the terminals of battery 3 caused by modulating the current drawn from battery 3 may be set. In such embodiments an amplitude of the current drawn from battery 3 may be dynamically varied such that the variation in the voltage across the terminals of battery 3 is at the desired amplitude.

In some cases a state of health of battery 3 may be determined by performing an initial quick test (for example, a test lasting less than 10 seconds) without having to fully test battery 3. If the initial quick test is not conclusive, a full test (for example, a test lasting in the range of about 30 to 60 seconds) of battery 3 may be run. In some cases a state of health of battery 3 may be determined by analyzing the computed impedance spectrum at only a few frequencies. In some such embodiments an initial test of battery 3 is performed by discharging battery 3 at only a few frequencies. If processing of the test results indicates that the battery has a "bad" state of health then the testing of battery 3 may be ceased. If processing of the test results indicates that the battery has an "excellent" state of health then the testing of battery 3 may also be ceased. If the initial test of battery 3 is not conclusive the number of frequencies at which battery 3 is discharged at may be increased. In some embodiments a full test (e.g. tested using full frequency range) of battery 3 is performed when the initial test is not conclusive.

In some embodiments discharge module 20 comprises a closed loop current regulator. Such a regulator may, for example comprise a PID controller. Such regulator varies the current draw from battery 3 (e.g. by varying application of the load) to cause the actual current drawn from the battery to track a waveform of the desired current draw. Applying closed loop control of the drawn current may provide one or more of:

preventing or reducing unbound oscillation (e.g. out of control oscillation) of a load;

assisting discharge module 20 with applying the desired load;

etc.

In some embodiments discharge current may be dynamically varied. The control loop in controller 22 may set a desired target discharge current (e.g. a constant amplitude current, a current having a constant envelope, a current having a desired waveform, etc.) to be drawn from battery 3. The target discharge current may be adjusted as needed or desired throughout a test of battery 3 to achieve a desired battery current and voltage response. For example, one or more parameters such as amplitude, envelope, waveform, etc. of the desired current may be varied. Additionally, or alternatively, application of a load to a current may be varied to vary the current that is drawn from the battery as described elsewhere herein. Achieving a desired current and voltage response may facilitate apparatus 10 to derive improved (or the best possible) impedance measurements within battery 3's excitation minimums and maximums.

In some embodiments discharge module 20 measures parameters of the discharge signals applied to draw a current from battery 3. Discharge module 20 may monitor voltage, current, etc. of the discharge signals. Discharge module 20 may dynamically adjust parameters of the discharge signals to achieve a desired loading of battery 3 during a test.

The applied voltage and current may be measured simultaneously during application of the discharge signal to battery 3. For example, the applied voltage and current may be measured simultaneously using two independent analog to digital converters (ADCs). In some embodiments the voltage response of battery 3 may be simultaneously measured with the applied current and/or voltage. The ADCs may be triggered to perform analog to digital conversions at exactly the same time. This advantageously eliminates any phase shift issues that may occur with multiplexed voltage and current measurements that are inherent with multiplexed ADC conversions.

The voltage and current are typically measured at a sampling frequency that is at least double the frequency of the discharge signal. To reduce the amount of data collected the sampling frequency may be varied with the frequency content of the discharge signal (e.g. if frequency of the discharge signal increases the sampling frequency may be increased, if frequency of the discharge signal decreases the sampling frequency may be decreased, etc.). However this is not mandatory. In some embodiments the sampling frequency remains constant. In such embodiments the sampling frequency is at least twice the frequency of the highest frequency component of the discharge signal. In some embodiments the voltage and current are measured using a single cycle of the discharge signal. In some embodiments the voltage and current are measured using multiple cycles of the discharge signal. For example, 2, 3, 4, 5, etc. cycles may be used.

In some cases the maximum frequency of the measured voltage and/or current response is different than the maximum frequency of the discharge signal. In such cases the voltage and/or current are measured at a sampling frequency that is at least double the frequency of the measured voltage and/or current response.

Measurement module 21 measures performance characteristics of battery 3 as battery 3 is discharged by the applied plurality of discharge signals. Measurement module 21 typically measures voltage across terminals 3A and 3B and current flowing through battery 3. Measurement module 21 may, for example, comprise a first analog-to-digital converter (ADC) coupled across the terminals of battery 3. An output of the first ADC provides voltage values corresponding to the voltage across the terminals of battery 3. In some embodiments a buffer circuit (e.g. a unity gain amplifier, etc.) is coupled between the battery and the DAC.

A precision shunt resistor connected in series with the load (e.g. load 34 described elsewhere herein) may be coupled to a second ADC for measuring the current being supplied by battery 3. Preferably an amplifier circuit is coupled between the shunt resistor and the second ADC. The output of the second ADC provides measured current values. Preferably the first and second ADCs are synchronized (e.g. using a single clock signal). This advantageously eliminates a phase shift from being introduced between the measured voltage values and the measured current values. In some embodiments measurement module 21 comprises a suitable voltmeter and/or current monitor (ammeter, Hall effect sensor, etc.).

In some embodiments measured voltage and current values (e.g. values measured by measurement module 21) are conditioned. In some embodiments a low-pass anti-aliasing filter is applied to decimate the measured voltage and current values. In such embodiments the filter removes high frequency noise and reduces the number of data points. Such filter may, for example, comprise a digital low pass filter having a window function corresponding to the Hamming window. The cut-off frequency may be selected to pass the highest frequency component of the discharge signal. In some embodiments the cut-off frequency is set to 10 kHz or less (e.g. 5 kHz).

By measuring the terminal voltage (i.e. the voltage across terminals 3A and 3B of battery 3) and/or the current flowing through battery 3, testing apparatus 10 may compute a frequency varying complex impedance of battery 3. Typically both the terminal voltage and current flowing through battery 3 are measured. However, in cases where the current that is drawn is known (e.g. the load is configured to draw a set current) it may not be necessary to measure the (known) current. One or more performance characteristics of battery 3 (e.g. state of health, etc.) may be generated by correlating the computed frequency to one or more expected impedance responses (or models) derived from testing batteries of the same type as battery 3.

Controller 22 is coupled to discharge module 20 and measurement module 21. Controller 22 comprises one or more processors configured to control discharge module 20 to apply the plurality of signals to battery 3. Additionally, or alternatively, controller 22 may generate machine executable instructions which control measurement module 21 to measure parameters associated with battery 3. In some embodiments one or both of discharge module 20 and measurement module 21 comprises a dedicated controller. In some embodiments controller 22 dynamically adjusts parameters of one or more of the signals in the plurality of signals.

Controller 22 may also compute the complex impedance frequency spectrum of battery 3. The computed impedance data may, for example, be stored in data store 25. In some embodiments controller 22 fits one or more models representative of a battery to the computed impedance data.

Data collected by testing module 4 may be input to AI module 6. As described elsewhere herein, AI module 6 determines a state of health and/or estimates other performance parameters of battery 3. AI module 6 may be executed within testing module 4. In some embodiments AI module 6 is on cloud system 7. In some embodiments AI module 6 is at least in part on testing module 4 and at least in part on cloud system 7.

A user may provide information about battery 3 (e.g. a model of battery, state of charge, etc.) to testing module 4 (e.g. to controller 22) via input/output interface 9 as described elsewhere herein. Testing apparatus 10 (or testing module 4 more specifically) may provide the results of a test of battery 3 to a user via input/output interface 9 as described elsewhere herein.

In some embodiments testing module 4 comprises a charger 23. Charger 23 may charge a battery 24 or other electrochemical device which powers testing module 4 (or apparatus 10 generally) using current drawn from battery 3 while a test of battery 3 is being performed.

In some embodiments discharge module 20 comprises a constant current sink circuit (e.g. a "voltage to current sink" in the art). In such embodiments an op-amp drives a power transistor (or transistors) as a current sink power device in a closed feedback loop. A controller (e.g. controller 22) may generate a discharge signal which controls application of a load to battery 3. The circuit may apply the load in a manner which tracks the waveform of the discharge signal (e.g. the current drawn from battery 3 tracks the waveform of the discharge signal). Preferably the circuit is operable in the range of 0 Hz (i.e. constant DC current) to tens of kHz (i.e. lower frequency AC current). The discharge signal may have any waveform. For example, the discharge signal may have a waveform that is sinusoidal, square, triangle, complex and/or the like as described elsewhere herein.

Figure 4:
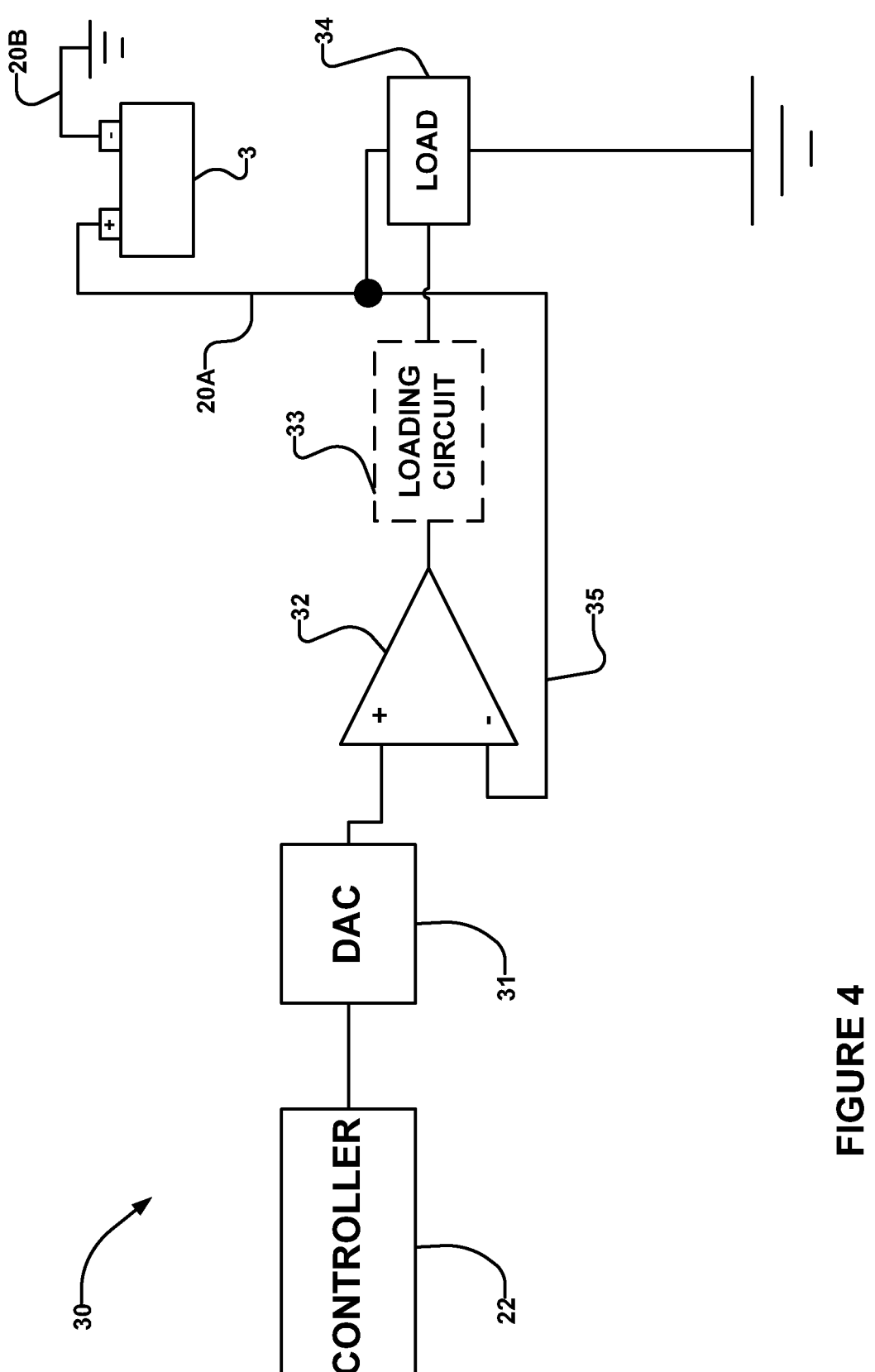
FIG. 4 is a schematic illustration of an example electrical circuit for drawing current from an electrochemical system.

FIG. 4 is a schematic diagram showing an example discharge circuit 30 which may be found within discharge module 20.

An output of controller 22 (or another controller of apparatus 10) may be coupled to a digital to analog converter (DAC) 31. Controller 22 provides a digital discharge signal. DAC 31 coverts the digital discharge signal into an analog signal. The analog signal is provided to op-amp 32. An output of op-amp 32 may be provided to load 34. Load 34 may comprise one or more power transistors such as MOS-FETs, bi-polar junction transistors, etc. Op-amp 32 in combination with load 34 effectively servos application of load 34 to battery 3 based on a frequency of the discharge signal and the waveform of the discharge signal (e.g. the current drawn from battery 3 tracks the waveform of the discharge signal). Preferably load 34 comprises at least one circuit element which limits an amount of current that is drawn from battery 3 (e.g. a resistive element, etc.).

In some embodiments an output of op-amp 32 is provided to optional loading circuit 33. Loading circuit 33 may comprise one or more power transistors such as MOSFETs, bi-polar junction transistors, etc. Additionally, or alternatively, loading circuit 33 may comprise a resistive network, one or more filters, one or more additional amplifiers, etc. which may modify characteristics of the analog discharge signal (e.g. amplitude, frequency, etc.). Op-amp 32 in combination with loading circuit 33 may effectively variably servo application of load 34 to battery 3 based on a frequency of the discharge signal, the waveform of the discharge signal and any modifications made to the discharge signal by loading circuit 33.

Feedback loop 35 provides for dynamic adjustment of the current draw. Dynamically adjusting the current draw based on differences between the actual current draw and the current draw specified by the discharge signal allows load 34 and/or loading circuit 33 to draw current from battery 3 in a manner which more closely resembles the waveform of the discharge signal.

Preferably load 34 is not just a fixed resistive load that will have a varying discharge current depending on the battery voltage according to Ohm's law. Rather the combination of switching circuit 33 with load 34 permits application of load 34 to be varied (e.g. via switching circuit 33) for the current drawn from battery 3 to track the waveform of the discharge signal. As described elsewhere herein the current drawn from battery 3 may be varied by varying the discharge signal.

In some embodiments application of load 34 is filtered. For example, one or more circuit elements such as capacitors, inductors, resistors and/or the like may be connected across load 34, feedback loop 35 and/or the like. The filter may prevent oscillation of circuit 30. Additionally, or alternatively, the filter may remove noise or other electromagnetic interference from interfering with the test of battery 3. This advantageously may provide for a more accurate test of battery 3.

In some embodiments controller 22 may dynamically vary in real time application of load 34 by varying the digital discharge signal that is input into DAC 31.

Figure 5:
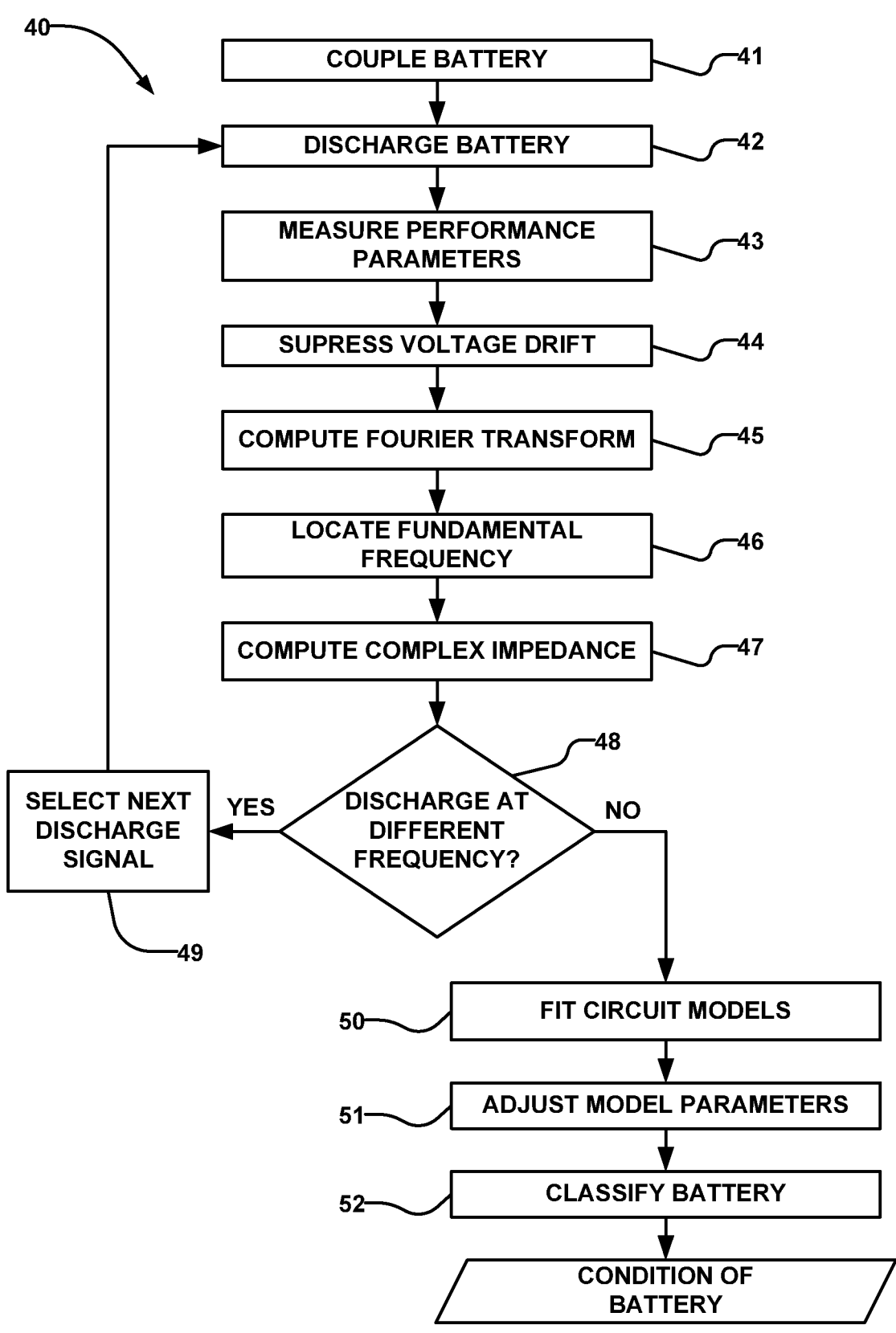
FIG. 5 is a flow chart illustrating a method according to an example embodiment of the invention.

FIG. 5 is a block diagram of an example method 40 for testing a battery 3.

In block 41 a battery to be tested (e.g. battery 3) is coupled to the testing system (e.g. apparatus 10 described elsewhere herein). A discharge signal draws current from battery 3 in block 42 at a frequency which corresponds to the frequency of the discharge signal.

As the battery is discharged, blocks 43 to 47 measure performance characteristics of the battery being tested. In block 43 a plurality of measurements of the voltage across the battery terminals (i.e. the terminal voltage of the battery) are taken. Block 43 also takes a plurality of corresponding measurements of the current flowing through the battery.

Especially because the battery being tested according to example method 40 is continuously being discharged (e.g.

the battery is not re-charged between discharge cycles), an intrinsic voltage drift may be present in the measured voltage data. Processing the voltage data without somehow compensating for the intrinsic voltage drift may skew test results and provide an incorrect measurement of the battery's performance. In block 44, the intrinsic voltage drift present in the measured voltage data is removed. Block 44 may execute a drift compensation method as described elsewhere herein.

Method 40 computes a complex impedance of the battery from the measured voltage and current data. Preferably method 40 computes the complex impedance in the frequency domain. In some embodiments block 45 computes the Fourier transform of both the compensated voltage data and the measured current data. In block 46 the fundamental frequency or frequencies of the voltage data and the current data is located from the Fourier transform. In block 47 the complex impedance at the fundamental frequency(ies) is computed by dividing the compensated voltage data by the current data at the fundamental frequency(ies).

Block 48 determines whether additional discharge signals are to be applied to the battery being tested. If yes, then method 40 returns to block 42 where the battery is discharged by applying the next discharge signal. The next discharge signal to be used is selected in block 49. If the battery is not to be discharged with any additional discharge signals, method 40 proceeds to block 50.

In block 50 one or more circuit models representative of the battery are fit to the computed impedance data using any model fitting algorithm presently known or discovered in the future. In an example embodiment the Levenberg Marquardt fitting algorithm is used. In some embodiments, a fitting algorithm of the group consisting of simplex, least squares and particle swarm is used.

Depending on when method 40 is performed and/or on what type of battery (or other electrochemical system) method 40 is performed on, method 40 may generate different results. Without limitation to any particular theoretical explanation, this is because factors such as the state-of-charge of the battery being measured, the size of the battery, rest time of the battery, temperature of the battery, etc. may cause alterations in the impedance properties of the battery being tested. As described elsewhere herein such factors may be input into the battery testing system by a user and/or may be measured by the battery testing system. Block 51 adjusts parameters of the models fit to the impedance data in block 50 to compensate for such factors. Any compensation method as described elsewhere may be used.

Block 52 classifies a state of health of the battery being tested based on the impedance data and/or the model parameters. Block 52 may for example provide a machine learning module (e.g. AI module 6) trained to classify the battery based on impedance data and/or model parameters which are inputted into the system. The classification may provide information about the battery's state of health to a user. In some embodiments block 52 classifies the battery as "good", "satisfactory", "ok", "bad", etc. In some embodiments the classification provides an estimated length of time the battery's state of health will remain above a threshold. For example, such classification may classify the battery as "Good for one more year", "Good for two more years", "Satisfactory for at least six months", etc. In some embodiments block 52 classifies the battery by assigning a value in a range (e.g. a SoH in the range of 0% to 100%). In some embodiments the output of block 52 includes a confidence indicator.

Dynamic Current Adjustment

In some embodiments testing module 4 is configured to dynamically adjust current that is drawn from battery 3 to keep the impedance spectrum response of battery 3 in a range that is linear (or close to linear). For the impedance spectrum response of battery 3 to be linear (i.e. linearly related to the current signal), typically a voltage across each cell of battery 3 should not exceed a threshold value (e.g. about 10 mV peak-to-peak). If the response of battery 3 approaches or exceeds the threshold value, testing module 4 may automatically reduce the current drawn from battery 3 by an amount sufficient to keep the voltage of the response of battery 3 below the threshold voltage. If the response of battery 3 is undesirably small, testing module 4 may automatically increase the current drawn from battery 3 by an amount sufficient to keep the voltage of the response of battery 3 at a sufficient voltage for measurement.

Testing module 4 may, for example perform a potentiostatic method which dynamically adjusts the drawn current to maintain the voltage across each cell of battery 3 within a preset voltage range (e.g. about 10 mV peak-to-peak). In some embodiments a voltage across each individual cell of battery 3 is estimated by dividing a voltage between the terminals of battery 3 by the total number of cells within battery 3.

Dynamically adjusting the drawn current from battery 3 may have one or more of the following advantages:

Maintains voltage response of battery 3 below a threshold peak-to-peak value (e.g. below about 10 mV) by varying the drawn current across the frequency band to reduce total droop and maintain linearity (or close to linearity) of the impedance spectrum response from battery 3.

Fits a measured voltage signal at each frequency within a desired predefined window (e.g. fits the measured voltage signal within a voltage measurement window, maintains an amplifier input within its valid range, maintains a programmable gain amplifier input within its valid range, etc.).

Adjusts a discharge offset voltage to ensure a full-scale range of a downstream analog to digital converter (ADC) is not exceeded.

etc.

Information about a voltage droop (or voltage drift) and/or an amplitude of a voltage signal at each frequency may be used to adjust the current drawn to maintain the total voltage drift to be within a predefined threshold range and/or an amplifier gain (e.g. gain of the programmable gain amplifier) to be within a threshold range (e.g. within a valid range of the amplifier) for the next frequency scan.

In some embodiments dynamic current adjustment is performed by first applying an initial discharge signal to battery 3 (e.g. a sinusoidal discharge signal at a constant frequency (e.g. a frequency matching the first test frequency), a short discharge pulse, etc.). In some embodiments a 2 KHz sinusoidal discharge signal having an amplitude of 1A is applied. In some embodiments a short discharge pulse (e.g. 100 ms) having an amplitude of 1A is applied.

In some embodiments the initial discharge signal has a frequency and/or current peak amplitude that is the same as the frequency and/or current peak amplitude of a first discharge signal which be applied to the battery once a test is commenced. In some embodiments the initial discharge signal has a current in the range of about 0.2% C-rate to 5% C-rate multiplied by a capacity value of battery 3.

The voltage response to the initial discharge signal may be filtered (e.g. to remove noise, to separate out a particular frequency or frequency band, etc.). An initial change in voltage ($\Delta V_{init}$) is computed from the voltage response to the initial discharge signal. Resistance of the battery cell may then be computed from $\Delta V_{init}$ and the amplitude of the discharge current that was applied ($R=\Delta V_{init}/I$). A desired current amplitude required to maintain a desired peak-to-peak voltage may then be computed by dividing the desired peak-to-peak voltage by the computed resistance ($I_{new}=V_{pp}/R$).

The computed desired current amplitude may then be used to commence a test of battery 3. For each frequency, testing module 4 may:

1. Filter a measured voltage response to the applied discharge current.
  2. Compute a change in voltage (e.g. peak to peak amplitude of voltage response for the particular response (see e.g. $\Delta V$ in FIG. 5A)) and a total voltage value at the end of the current draw for that frequency (e.g. battery 3 no longer being discharged at that frequency).
  3. Compute a resistance (R) of battery 3 at the particular frequency. It is unnecessary to compute the resistance for the first frequency since this has already been done using the initial discharge signal as described above.
  4. If the change in voltage is larger than the threshold peak-to-peak voltage range that is to be maintained, a new reduced current value for the next frequency may optionally be computed. The new reduced current value may, for example, be computed as follows:

$$I_{New} = \frac{(\text{Change in voltage}) - (\text{Desired Voltage Range (``}V_{PP}\text{''}))}{R}.$$

$I_{New}$ may then be used to set an amplitude of the current draw for the next frequency.
  5. Compute an amount of voltage droop or drift for that frequency (e.g. droop=voltage at start of test at the frequency−voltage at end of test at that frequency). The voltage droop may be communicated to the voltage drift/offset and/or gain setting routines described elsewhere herein. In some embodiments voltage droop may be interpolated from a portion of the voltage response for that frequency (e.g. voltage droop between two points not corresponding to the start and end times of the signal for that frequency may be used to interpolate a total voltage droop for the signal).
  6. Repeat for next frequency as desired.

Figure 5A:
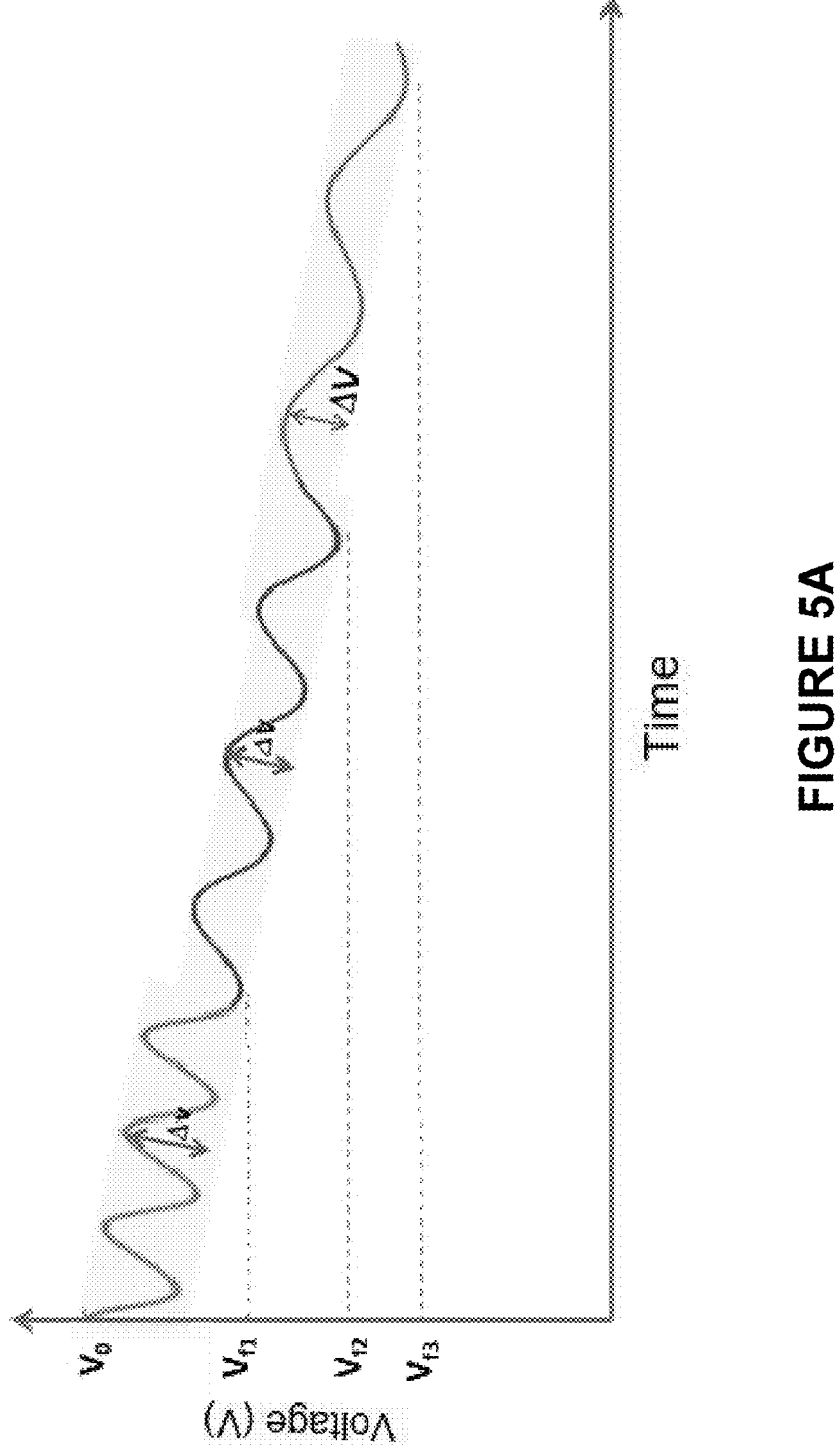
FIG. 5A is a graphical illustration of an example voltage response.

FIG. 5A is a graphical illustration of example measured voltage signals. $V_0$ to $V_{f1}$ corresponds to a voltage droop demonstrated in a measured voltage signal response to a current drawn at a first frequency. $V_{f1}$ to $V_{f2}$ corresponds to a voltage droop demonstrated in a measured voltage signal response to a current drawn at a second frequency. $V_{f2}$ to $V_{f3}$ corresponds to a voltage droop demonstrated in a measured voltage signal response to a current drawn at a third frequency. As shown in FIG. 5A, $V_{f1}$, $V_{f2}$ and $V_{f3}$ correspond to minima of the voltage response.

Voltage Drift Compensation

As discussed above, continuously discharging the battery throughout a testing cycle without re-charging the battery can result in a state of charge of the battery being reduced sufficiently to cause a shift in the terminal voltage of the battery by the end of a testing cycle (i.e. a "voltage drift"

occurs). A voltage drift may be reduced or eliminated from the measured voltage by quantifying the voltage drift and adjusting the measured voltage to compensate for the quantified voltage drift. In some embodiments the quantified voltage drift is subtracted from the measured voltage.

Voltage drift compensation may be applied, for example, to compensate for voltage drifts that occur as a result of a battery testing protocol which results in discharge of a battery during testing. Voltage drift compensation as described herein may be applied in other contexts as well including cases where voltage drift is caused by a battery being charged during testing.

Example 1—Genetic Algorithm

Figure 6:
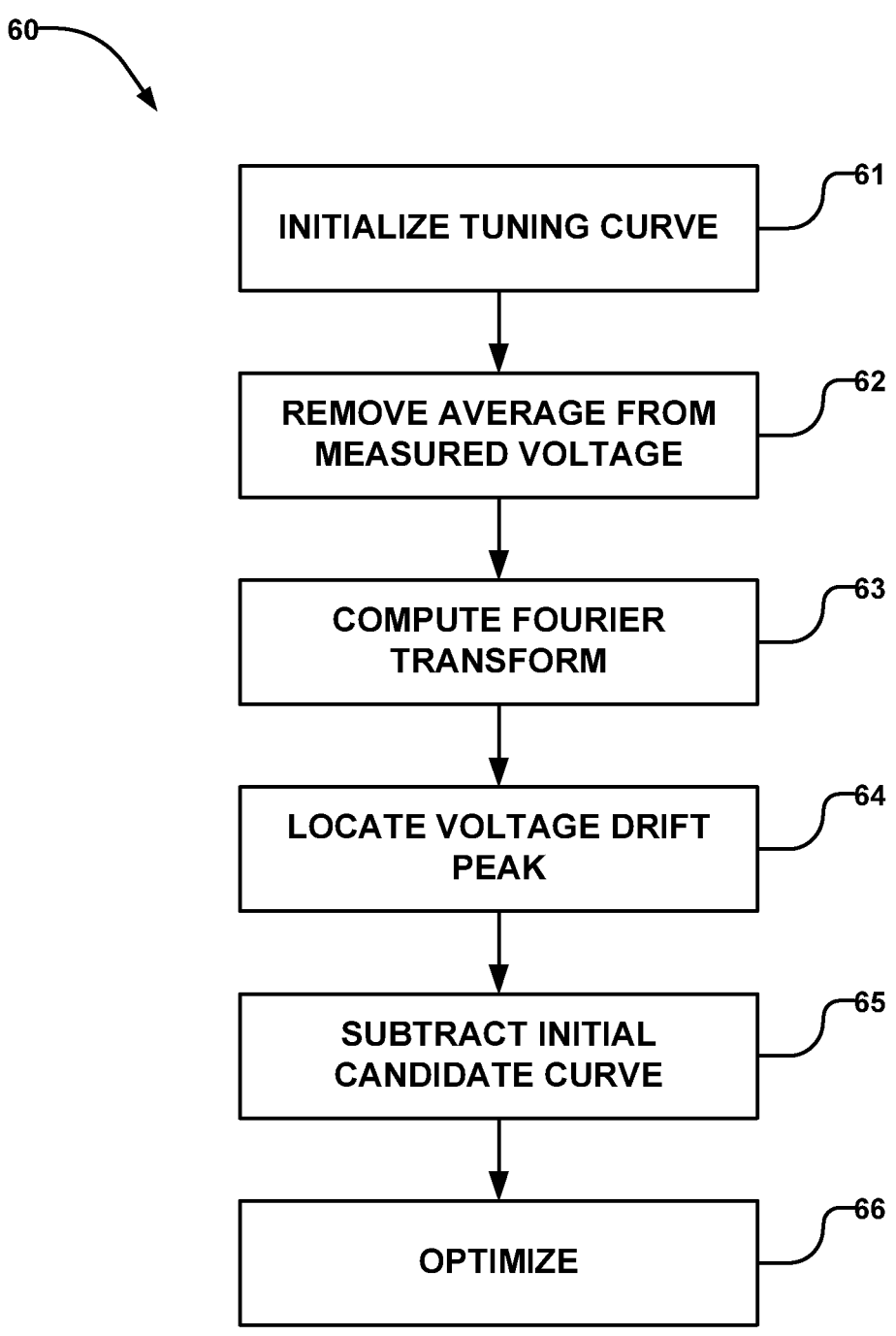
FIG. 6 is a flow chart illustrating a method according to an example embodiment of the invention.

In some embodiments apparatus 10 executes a genetic algorithm which compensates for the voltage drift. In some embodiments the genetic algorithm may be like method 60 shown in FIG. 6.

In block 61 a tuning curve is initialized. The tuning curve may be defined by a set of fixed parameters and a set of tuning parameters. Preferably, the tuning curve is a non-linear curve. In some embodiments the tuning curve is a spline curve having a plurality of sections joined at knots. For example the curve may comprise a $2^{nd}$ order b-spline with 6 knots. In such embodiments, the fixed parameters can be times corresponding to the knots. The tuning parameters may be the spline coefficients.

For example, the knot locations may be evenly spaced in a time dimension spanning the acquisition of voltage signals from an electrochemical system. For example, if testing a battery involves a sequence of 28 test signals which have an average duration of 1.25 seconds (total test time of 35 seconds) the knots may be placed at 5 second intervals.

In some embodiments the tuning curve is any other spline. In some embodiments the tuning curve is a polynomial. In some embodiments the tuning curve is an exponential decay curve.

Block 62 finds the average of the measured voltage signal and subtracts this value from the measured voltage signal (i.e. a "processed voltage signal"). Removing the average signal advantageously removes the DC component from the analysis thereby simplifying the method. However, block 62 is not mandatory.

Block 63 transforms the measured voltage signal into a frequency domain. For example, block 63 may compute the Fourier transform of the measured voltage signal (e.g. using a suitable algorithm such as the fast Fourier Transform (FFT)).

In block 64 a peak associated with the voltage drift is located. If the measured voltage signal was processed according to block 62 so that there is no DC (zero frequency) component, the voltage drift peak will typically be the first peak in the Fourier transform. The magnitude of the voltage drift peak may be used as an objective function in an optimization of the tuning parameters of the tuning curve (e.g. method 60 aims to find tuning parameters such that when the tuning curve is subtracted from the measured voltage signal the magnitude of the objective function is minimized).

Block 65 subtracts the initial candidate curve from the measured voltage signal. The difference is the first best candidate signal. The initial curve is the first best candidate curve. The tuning parameters of the initial curve are the first best candidate tuning parameters.

Figure 7:
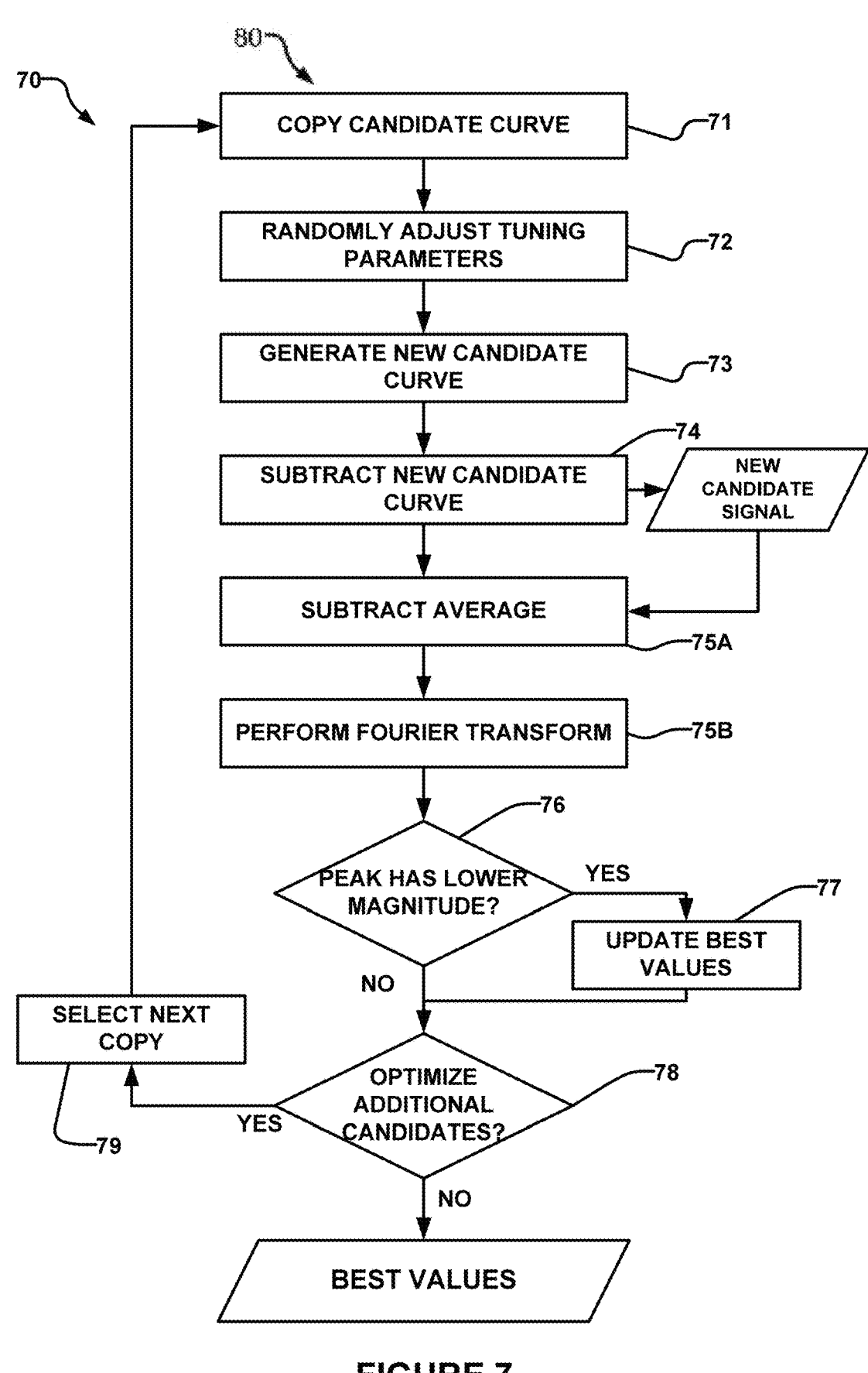
FIG. 7 is a flow chart illustrating a method according to an example embodiment of the invention.

In block 66 an optimization is performed to get the best compensated voltage signal by minimizing the value of the Fourier peak of the drift voltage. In some embodiments the voltage signal is optimized according to example method 70 (see e.g. FIG. 7).

Block 71 makes N copies of candidate curve 80. The number of copies N corresponds to a desired number of iterations of optimization method 70. Fewer iterations may reduce an execution time of method 70. However, a greater number of iterations may result in a better (e.g. closer) optimization. In some embodiments block 71 makes 10 copies of candidate curve 80. In some embodiments block 71 makes fewer than 10 copies of candidate curve 80. In some embodiments block 71 makes more than 10 copies of candidate curve 80. In some embodiments block 71 makes between 5 and 50 copies of candidate curve 80. Randomly adjusting multiple copies of a candidate curve may facilitate a more thorough search of the candidate (e.g. multiple points corresponding to the different copies may be observed instead of just a single point of a single copy).

A first copy of candidate curve 80 is passed to block 72. In block 72 the tuning parameters of the copied candidate curve 80 are randomly adjusted. For example, controller 22 may randomly select a set of tuning parameters. The set of tuning parameters may, for example, be randomly adjusted by generating a random number from a uniform distribution between –j and j. The random number may then be added to the current tuning parameters. For example, j may be 0.005. Preferably j is large enough to overcome local minima. Preferably j is also not large enough that it results in an inability to find a good solution. The uniform distribution may be exchanged for any random distribution (e.g. normal, beta, Cauchy, etc.). Preferably the random distribution is symmetrical about 0. This may facilitate exploring the solution space evenly.

In block 73 a new candidate compensation curve is generated from the fixed parameters and the new tuning parameters which were set in block 72.

In block 74 the new candidate curve is subtracted from the processed voltage signal. The difference is the new candidate voltage signal.

In block 75A the average of the new candidate voltage signal is subtracted from the candidate voltage signal. In block 75B the Fourier transform of the new candidate signal is computed. Block 75B locates the peak associated with the drift voltage. If the located peak is lower in magnitude than the current best value the best parameters are updated (blocks 76 and 77). In such cases the current peak value becomes the new best value, the new candidate compensation curve becomes the new best candidate and the adjusted voltage becomes the new best adjusted voltage.

Block 78 verifies whether additional candidate curve copies are to be optimized. If so, block 79 selects the next copy of candidate curve 80 and returns method 70 to block 72. Otherwise, method 70 terminates and returns the best values.

In some embodiments where the discharge signal is a sine wave (and the voltage signal is therefore expected to also be a sine wave) the objective function may be replaced with a function having a value that is proportional to a squared error between points of the discharge signal and points on an idealized sine-wave.

In some embodiments the optimization algorithm is a single objective optimization algorithm. In some embodiments the optimization algorithm is one of the group consisting of particle swarm, simulated annealing, gradient descent and stochastic hill climbing.

Example 2—Averaging Maxima and Minima

Figure 8:
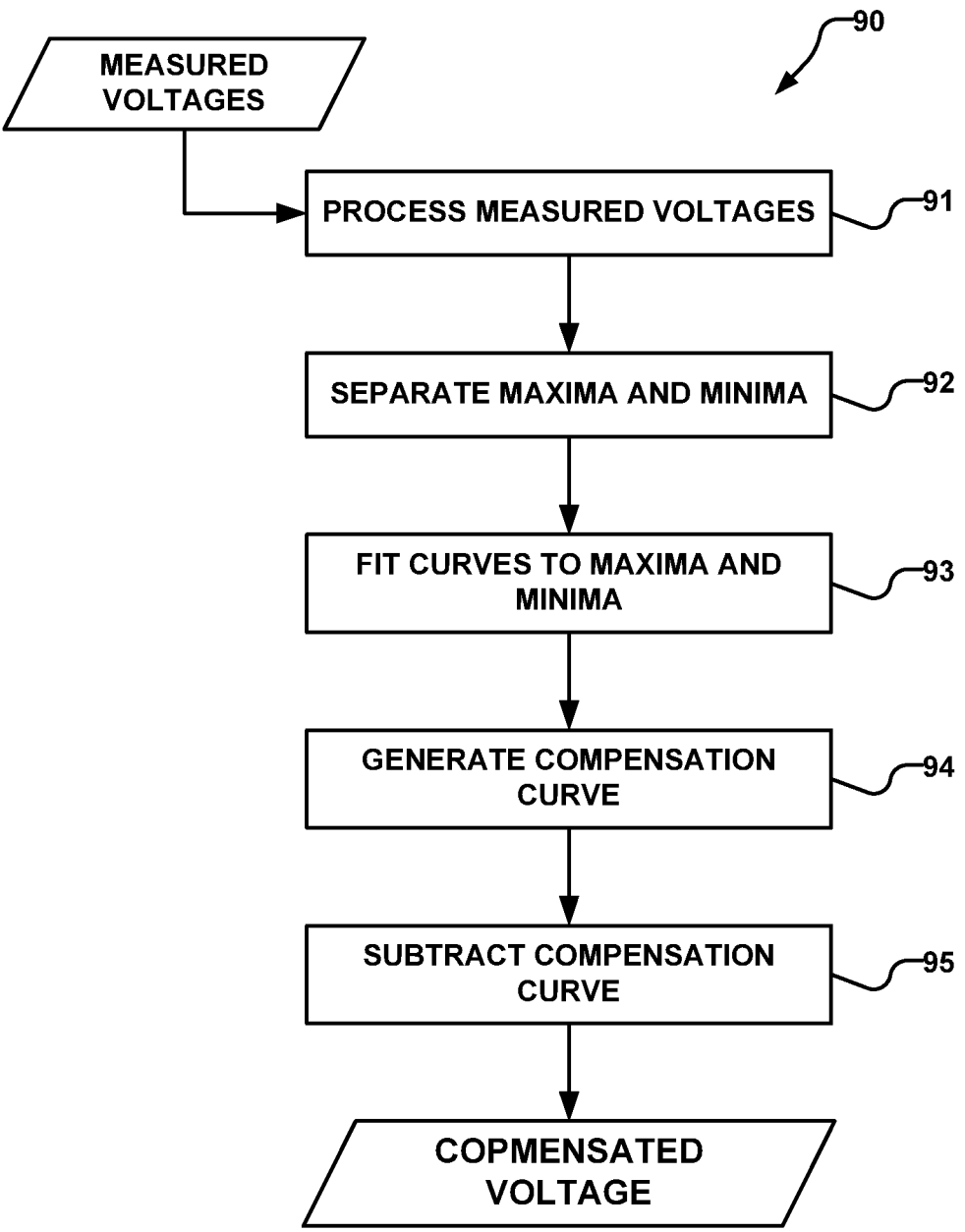
FIG. 8 is a flow chart illustrating a method according to an example embodiment of the invention.

In some embodiments voltage drift is compensated by averaging local maxima and minima of the measured voltage signal together to generate a compensation signal which may be subtracted from the measured voltage signal (see e.g. example method 90 of FIG. 8).

Block 91 receives and processes the measured voltage data. Block 91 may be configured to retrieve (e.g. generate machine instructions to retrieve measured voltage data from a data store, memory module, etc.) and/or receive (e.g. generate machine instructions to receive the measured voltage data). Block 91 traverses the measured voltage data to locate local maxima and minima of the measured voltage data. In some embodiments block 91 does not register maxima and minima separated from each other by less (or more) than a threshold amount (e.g. block 91 may ignore local maxima and minima corresponding to noise present in the measured voltage data). In some embodiments topographic prominence is used to decide if a local extremum is significant or not.

Block 92 separates the registered maxima and minima into distinct groups. The registered maxima (e.g. registered "peaks" of the measured voltage data) may be separated into a first group. The registered minima (e.g. registered "troughs" or "valleys" of the measured voltage data) may be separated into a second group.

Curves representative of the points in each of the distinct groups are generated in block 93. First and second curves may be fit to the points of the first and second groups respectively. In some embodiments the first and/or second curves are decaying exponential curves (however this is not mandatory and other types of curves may be used as the first and second curves). In some embodiments the first and/or second curves may be spline curves, polynomial curves, and/or the like.

Block 94 combines the curves generated in block 93 to generate a compensation curve. Block 94 may, for example, average the first and second curves together to generate the compensation curve. In such embodiments, the compensation curve is representative of the voltage drift.

The compensation curve may be subtracted from the measured voltage data in block 95 to generate a compensated voltage signal. This advantageously reduces or completely eliminates voltage drift from the compensated voltage data.

In some embodiments method 90 may register a reduced number of maxima and minima. For example, method 90 may register every $n^{th}$ (e.g. every $2^{nd}$, $3^{rd}$, $4^{th}$, etc.) maxima or minima. In some cases, voltage drift is small (e.g. between 0.02 mV and 1.6 mV). In such cases processing time required to complete method 90 may be reduced by reducing the number of maxima and minima that are registered with minor (or no) impact on the quality of voltage compensation.

Example 3—Filtering

In some embodiments method 90 filters the measured voltage data to generate the compensation curve. The compensation curve may then be subtracted from the measured voltage data to generate the compensated voltage signal.

Example 4—Characteristic Drift

In some embodiments battery 3 is discharged by a known amount. A characteristic drift may be determined by measuring changes in the voltage of the battery as a result of the discharging. For example the battery may be discharged with a constant current for a discharge period. Voltage across the terminals of battery 3 may be measured during the discharge period. The resulting curve of voltage as a function of time may be identified as the characteristic drift.

For example, it may be desired to subject a battery 3 to a testing protocol as described herein in which the battery 3 is discharged while modulating discharge current at different frequencies. The discharge period for evaluating voltage drift may be selected to have a length equal to the aggregate duration of the testing discharges. A current to be drawn during the discharge period may be selected to be an average current drawn by the testing discharges. During the discharge period the voltage of the battery 3 under test may be sampled periodically. The sampled values may be stored and used to represent the characteristic drift which may be subtracted from the voltage signal measured during the testing discharges.

In some embodiments the characteristic drift may be measured as described herein before and after the testing discharges and the before and after characteristic drifts may be averaged to obtain a characteristic drift to be subtracted from the voltage signal measured during the testing discharges.

In some embodiments the average current draw of the testing discharges may vary over the course of the testing discharges. In such cases the current drawn during the discharge period may be modulated to track variations in the average current of the testing discharges. For example, if the average current of the testing discharges decreases, an amplitude of the current drawn during the current discharge period may be modulated to have a higher amplitude (e.g. to offset the decreased average).

A test of battery 3 may then be performed according to any of the methods described elsewhere herein. The measured voltage values may be concatenated together. The characteristic drift may be subtracted from the concatenated data (or signal) to compensate the concatenated data for voltage drift. The compensated data may then be split back into its respective parts (or signals).

Voltage Measuring Window

As described elsewhere herein a voltage response of a battery or other electrochemical system may be measured. The voltage response may drift over time and may have different magnitudes under different test conditions. A measurement circuit is typically capable of measuring voltages within a particular range or "measuring window". For example a specific measurement circuit may be capable of measuring voltages in a range of a minimum measurable voltage, for example 0 volts to some maximum measurable voltage, for example 15 volts. If the voltage response is outside the measuring window (e.g. has a voltage below the minimum measurable voltage or above the maximum measurable voltage) then the measurements may be clipped.

Figure 8A:
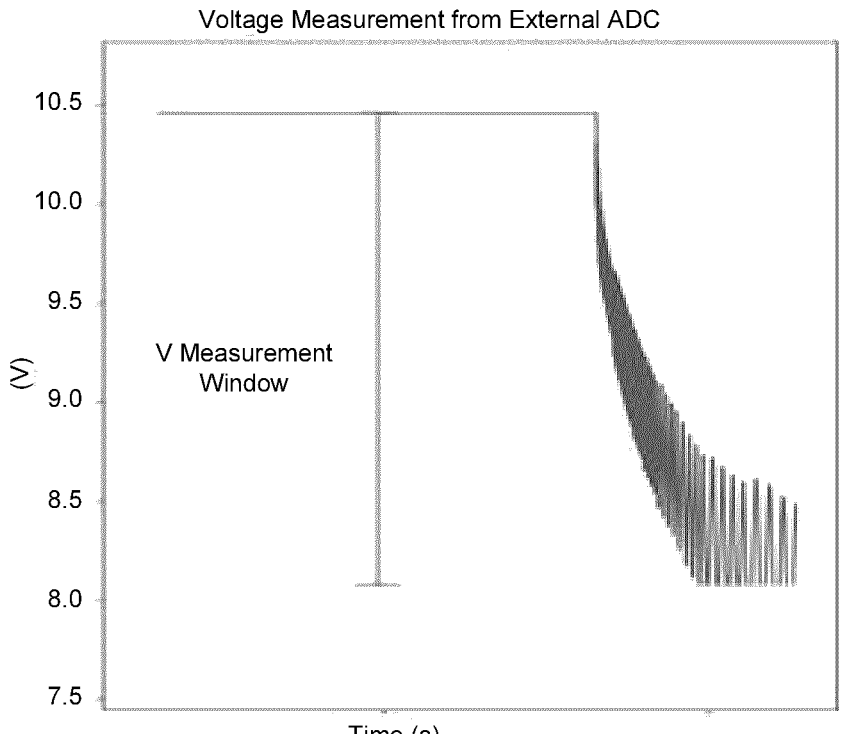
FIGS. 8A and 8B are graphical illustrations of example voltage responses.

FIG. 8A illustrates an example voltage response where voltages below 8V are clipped (the voltage measuring window is between 8V and 10.5V).

Figure 8B:
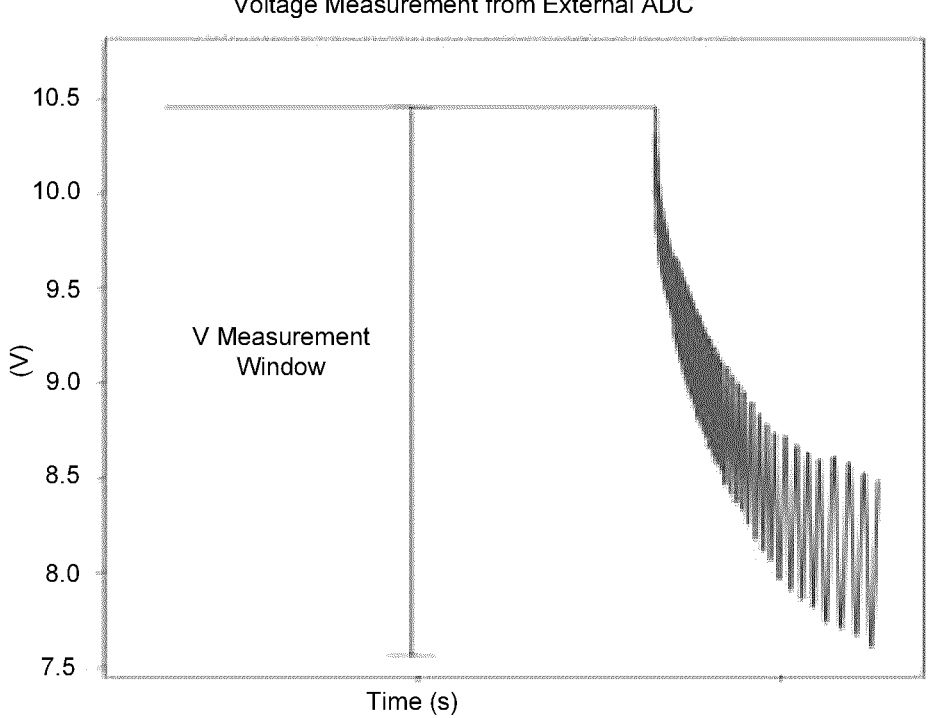

In some embodiments a measurement circuit is configured to allow the measuring window to be adjusted. For example, one or both of the minimum and maximum measurement voltages may be adjustable. FIG. 8B illustrates the example voltage response of FIG. 8A with the voltage measuring window adjusted to have a lower measurable voltage such that voltages below 8V are no longer clipped.

In the example case where the measurement circuit comprises a variable gain amplifier and an analog to digital converter connected to digitize an output voltage of the variable gain amplifier a measuring window may be set by setting a gain and offset applied by the variable gain amplifier to establish a measuring window between a suitable minimum measurable voltage and a suitable maximum measurable voltage. The measuring circuit may, for example, be configured so that a voltage response at the minimum measurable voltage of the measuring window is within a measuring range of the analog to digital converter and at or near one end of the measuring range and a voltage response at the minimum measurable voltage of the measuring window is within a measuring range of the analog to digital converter and at or near a second end of the measuring range of the analog to digital converter.

Where the voltage response is subject to drift, the voltage response may not remain in a measuring window even if the voltage response initially falls within the measuring window. To capture the drifting voltage response, the measuring window may be made large enough to accommodate expected drift of the voltage response.

In some embodiments clipping of the measured voltage is avoided by setting the voltage measuring window to span a large voltage range. For example, the voltage measuring window may cover a full voltage range of a battery 3 being tested (e.g. from 0V to the maximum open circuit voltage of battery 3). In some cases however setting the voltage measuring window to span a large voltage range may unfavourably reduce measurement resolution (e.g. due to a finite resolution (number of steps) provided by an analog to digital converter).

In some embodiments the voltage measuring window is set based on a predicted amount of voltage drift. In some embodiments the voltage measuring window is predicted based on a type of battery 3 being tested (e.g. specific types of batteries may have corresponding specific amounts of voltage drift).

Data specifying the expected drift may be retrieved and applied to set a measuring window. In some embodiments apparatus 10 stores predicted voltage measuring window amounts. The voltage measuring window may be set to be large enough to cover the full range of the predicted amount of voltage drift. By setting the voltage measuring window based on the predicted amount of voltage drift a higher measurement resolution may be maintained. In some embodiments a buffer amount (e.g. 5%, 10%, 15%, etc.) is added to the predicted amount of voltage drift.

In some embodiments voltage drift is predicted for a particular battery being tested. This may be done, for example, by applying an initial discharge pulse and measuring characteristics of a response to the initial discharge pulse prior to performing any of the testing methods described herein. A measuring window may then be set based on the predicted voltage drift. The measuring window may be set prior to applying test discharge signals as described herein.

One or more parameters representative of the battery's response to the initial discharge pulse may be used to predict voltage drift. In some embodiments a response to the initial discharge pulse corresponds to an exponential decay. Parameters of the exponential decay may be used to predict the voltage drift.

In some embodiments one or more of the following parameters are used to predict voltage drift:

an initial voltage drop ($\Delta$Vin) (see e.g. FIG. 80);

a final settled voltage ($V_{final}$) after the discharge pulse is complete (e.g. voltage after 100 ms if a 100 ms discharge pulse is applied);

exponential fit parameters corresponding to the voltage response (e.g. exponent, multipliers, time constant, etc.);

etc.

In some embodiments voltage drift is predicted by:

Applying a discharge pulse of an amplitude equivalent to an average of the current which will be drawn during a test for a set amount of time. Typically the set amount of time is short (e.g. 100 ms). If, for example, 1 A of peak current will be drawn during a test then the discharge pulse may have a depth of 0.5 A. If different current amounts are drawn during a test, the amplitude of the discharge pulse may be determined with a weighted average of the different current amounts that will be drawn during the test.

Finding pulse droop by calculating voltage drop ($V_{final}$−$OCV_{initial}$) over the duration of the pulse (e.g. at t=100 ms for a 100 ms discharge pulse). "$OCV_{initial}$" means the initial open circuit voltage of battery 3.

Predicting a voltage drift based on the measured response to the discharge pulse.

In some such embodiments a predicted voltage drift may be represented as follows:

$$\text{Predicted Voltage Drift} = B(\text{Pulse Droop})^D$$

wherein B and D are numeric coefficients.

For example, a specific predicted voltage drift may be represented as follows:

$$\text{Predicted Voltage Drift} = 38.213(\text{Pulse Droop})^{0.4443}.$$

Figures 8C, 9:
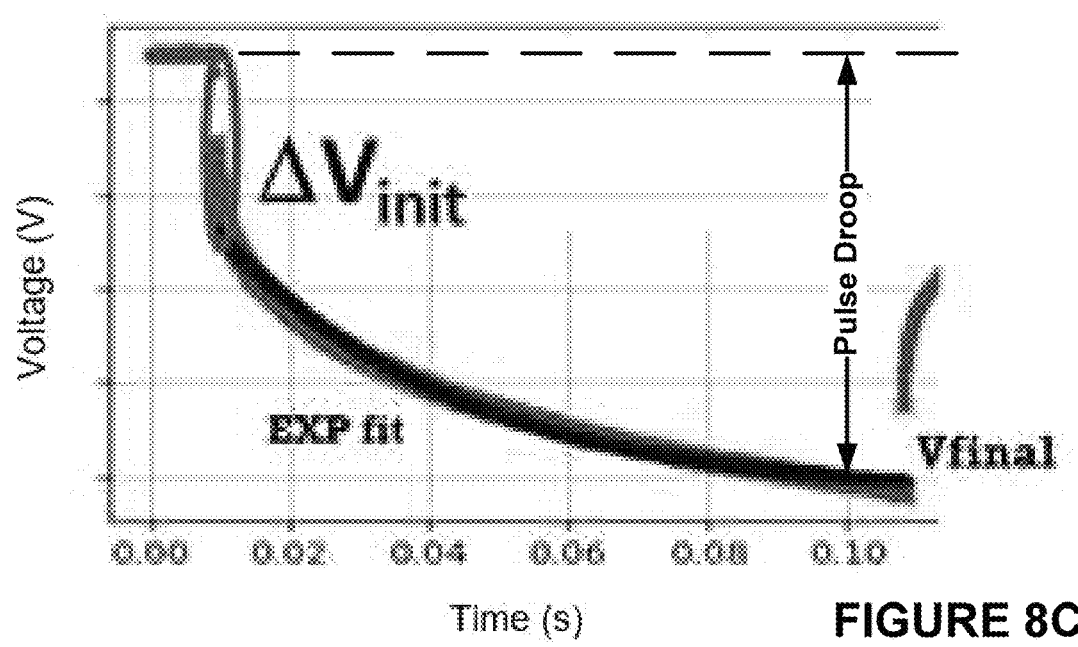
FIG. 8C is a graphical illustration of an example voltage response to an initial discharge pulse.
FIG. 9 is a flow chart illustrating a method according to an example embodiment of the invention.

FIG. 8C illustrates an example pulse voltage response to a discharge pulse of 1A for 100 ms.

In some embodiments one or more parameters of the response to the initial discharge pulse and/or parameters of a voltage rise during a rest period prior to a test may be used as input data to improve accuracy of any of the SoH determination methods described elsewhere herein. In some embodiments such parameters may be input features which improve training of AI module 6.

State of Charge Compensation

The impedance frequency spectrum of a battery may vary as state of charge of the battery varies. In cases where the impedance spectrum is applied to determine parameters of electrical circuit models the parameters may also be altered as a result of the state of charge of the battery. This issue can be addressed by charging a battery 3 that is to be tested to a standard state of charge (e.g. fully charged) prior to testing the battery 3. A disadvantage of requiring that batteries must be at a standard state of charge for testing is the time required to adjust the state of charge (e.g. by charging). It can take a significant time to bring a battery to the standard state of charge (or even to verify that the battery is at the standard state of charge). Depending on the condition (e.g. SoH) of a battery 3 it may not be possible in some cases to bring battery 3 to the standard state of charge.

Classifying a state of health of battery 3 without compensating for different states of charge which battery 3 may have may result in an inaccurate (or less accurate) assessment of the state of health of battery 3.

Preferably, testing module 4 (or apparatus 10 generally) compensates for different states of charge of the different batteries being tested. For example, controller 22 may scale impedance data and/or parameters of models based on a measured state of charge of the battery.

State of charge may be compensated, for example, by scaling computed complex impedance values of an impedance frequency spectrum (which may, for example, be measured as described herein) and/or parameters of a model by one or more scaling factors. The one or more scaling factors may be determined by testing the same battery 3 at different states of charge and observing how the measured impedance frequency spectrum and/or parameters of one or more models change with the state of charge.

For some battery chemistries open circuit voltage (OCV) is a reasonably reliable indicator of state of charge. A scaling factor may be expressed as a scaling function of OCV ("ƒ(OCV)"). The scaling function may be any function that has parameters that allow the function to be fitted reasonably well to the way that a particular value or parameter changes with OCV.

For example, the scaling function may be a polynomial function having coefficients that may be set. Consider the case where a particular parameter p has a value $p_{full\_charge}$ when a battery is fully charged and the same parameter has a value $p_{measured}$ when the battery is at another state of charge having an open circuit voltage OCV. In this case, for a suitably constructed ƒ(OCV):

$$p_{measured}=(1+f(OCV))p_{full\ charge}$$

and so, if $p_{measured}$ is known (e.g. by computation or measurement) $p_{full\_charge}$ can be calculated by:

$$p_{full\ charge} = \frac{p_{measured}}{1 + f(OCV)}$$

In this manner, parameter values used for further computations (e.g. assessment of SoH) may be adjusted to the corresponding values that would have been determined if the battery had been fully charged before processing the parameter values to estimate SoH (or other performance measure).

It is often sufficient for ƒ(OCV) to be a second order polynomial of the form:

$$f(CV)=A(OCV)^2-B(OCV)+C$$

where A, B, and C are fixed coefficients. For example, for a particular case ƒ(OCV) may be given by:

$$f(OCV)=0.728(OCV)^2-18.787(OCV)+121.21$$

A different function ƒ(OCV) may be applied to compensate each parameter (and/or each complex impedance) to account for the state of charge of a battery under test not being the standard state of charge.

In some embodiments state of charge is compensated by adjusting computed impedance values based on a look up table.

Such scaling functions, look up tables, etc. may, for example, be computed by measuring parameters of a battery as a function of OCV in a lab environment and then fitting scaling function(s), look up tables, etc. to the measured parameters.

In some embodiments parameters that are not sensitive to different states of charge need not be modified by scaling or otherwise to compensate for different states of charge of a battery 3. Such parameters may be directly used to determine state of health of battery 3 (or other performance characteristics) without having to first compensate for state of charge. This may, for example, reduce processing time and/or an amount of resources required to process the measured data.

In some embodiments apparatus 10 autonomously compensates for different states of charge of battery 3 without having to acquire specific data and/or compensation parameters to compensate for the state of charge of battery 3. In some embodiments measured OCV data of battery 3 is provided to AI module 6 as an input. AI module 6 may train itself to autonomously compensate for effects resulting from different states of charge based on the provided OCV data. In some embodiments no information about state of charge of battery 3 is provided to AI module 6. In such embodiments AI module 6 may train itself to compensate for effects of the state of charge of battery 3 based on the other data that is inputted into AI module 6.

In some such embodiments AI module 6 trains itself to autonomously compensate for different states of charge of battery 3 through a method of unsupervised learning. AI module 6 may train itself to identify correlations within data sets that are inputted into AI module 6. For example, AI module 6 may perform clustering on data that is inputted into AI module 6. Each cluster of data may represent data which is representative of similar (or the same) performance characteristics of battery 3 (e.g. each cluster of data may have similar or the same OCV values). Each such cluster of data may be correlated to a specific state of charge of battery 3 by AI module 6.

Adjustment for Recent Charging

For at least some battery types, testing a battery soon after it has been charged (e.g. within 60 minutes of charging for some models of battery 3) may result in incorrect (or less accurate) test results. Once a battery finishes charging, charge is concentrated around the battery's electrodes. The battery must rest for the charge to be distributed within the battery. This can, for example, impact a state-of-charge reading.

In some embodiments testing data is adjusted to compensate for less than ideal rest times. For example, testing module 4 (or apparatus 10 generally) may adjust (e.g. by scaling) the computed impedance data and/or parameters determined based on the impedance data based on a measure that indicates rest time since the battery was last charged.

In some embodiments testing module 4 compensates for rest time by interpolating to estimate a rest time and scaling the computed impedance data accordingly. For example, testing module 4 may be configured to perform example rest time compensation method 100 shown in FIG. 9.

In block 101 testing module 4 measures OCV of battery 3 (e.g. a terminal voltage between terminals 3A, 3B of battery 3). In block 102 testing module 4 waits for a waiting period (typically a few seconds) before measuring the OCV of battery 3 a second time in block 103. In block 104 a rate of change of the OCV is calculated. For example, method 100 may subtract the second OCV measurement from the first OCV measurement. Method 100 may optionally divide the resulting difference by the amount of time which elapsed between the two measurements.

Method 100 may determine a scaling factor for a parameter or value based on the rate of change of OCV. It is expected that the rate of change of OCV is highest just after a battery has been charged and that the rate of change of OCV decreases with rest time since the battery was last charged.

A scaling factor for a parameter is determined in block 105. The scaling value may, for example, be calculated as a function of the rate of change of OCV. In some cases predetermined scaling factor values are provided. The scaling factor values correspond to different ranges or bins. Block 105 may determine which of a plurality of bins the rate of change of OCV determined in block 104 corresponds to and may then apply the scaling factor(s) associated with that bin to adjust parameter value(s) and/or impedance values.

For example, a first bin may correspond to a high rate of change (rate of change of OCV exceeds a threshold (e.g. 3 mV/min)) which may imply that the battery has rested for less than 5 minutes. A second bin may correspond to a range of moderate rates of change (e.g. about 100 μV/min) that may, for example, imply that the battery has rested for about 5 to 30 minutes. A third bin may correspond to a range of slow rates of change (e.g. about 20 μV/min) that may imply that the battery has rested for about 30 to 60 minutes. A final bin may correspond to negligible rate of change (e.g. rate of change below a second threshold (e.g. 4 μV/min)) that may imply that the battery has rested for more than 60 minutes.

In block 106, the model parameters are multiplied by a scaling factor associated with the type of rate of change the computed rated of change was grouped into. In some embodiments there is a separate scaling factor for each parameter and/or complex impedance.

In some embodiments a charger (part of or separate from apparatus 10) used to charge battery 3 may communicate with testing module 4 (or apparatus 10 generally) to provide charging information to testing module 4. In such embodiments the charger may provide information about the charging cycle (e.g. current duration of charging cycle, parameters of charging signal (e.g. voltage, current, etc.), etc.) to testing module 4. Testing module 4 may then use this information to adjust its testing methodology (e.g. scale values such as raw data, computed impedance data, computed model parameter values, etc. based on the provided charging information). For example, the charger may communicate to testing module 4 how long it has been since the charge was completed. In such cases, testing module 4 may compute or look up the exact recovery time for the specific battery being tested and may determine adjustment factors based on the recovery time. In some embodiments the charging rate (e.g. fast charge vs. slow charge) is used to further refine the adjustment factors. For example, the adjustment factors may be scaled differently based on what the charging rate was.

The charger and testing module 4 (or apparatus 10) may communicate using any known wired or wireless communication interface. In some embodiments a charger is integrated with apparatus 10.

Temperature Measurement and Compensation

Performance characteristics of battery 3 may vary as temperature of battery 3 changes. In some embodiments a system for measuring temperature of battery 3 is integrated into apparatus 10. Additionally, or alternatively impedance values and/or values of parameters derived from the impedance values may be adjusted based on the temperature of battery 3.

Figure 10A:
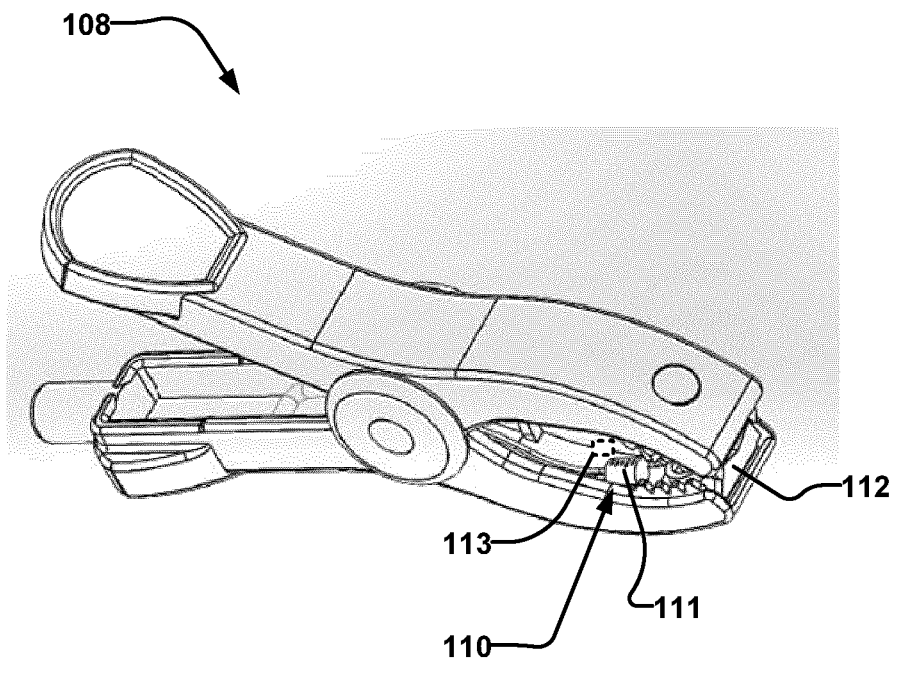
FIGS. 10A and 10B are perspective views of an example clip which may be used to couple a test lead to an electrochemical system.
Figure 10B:
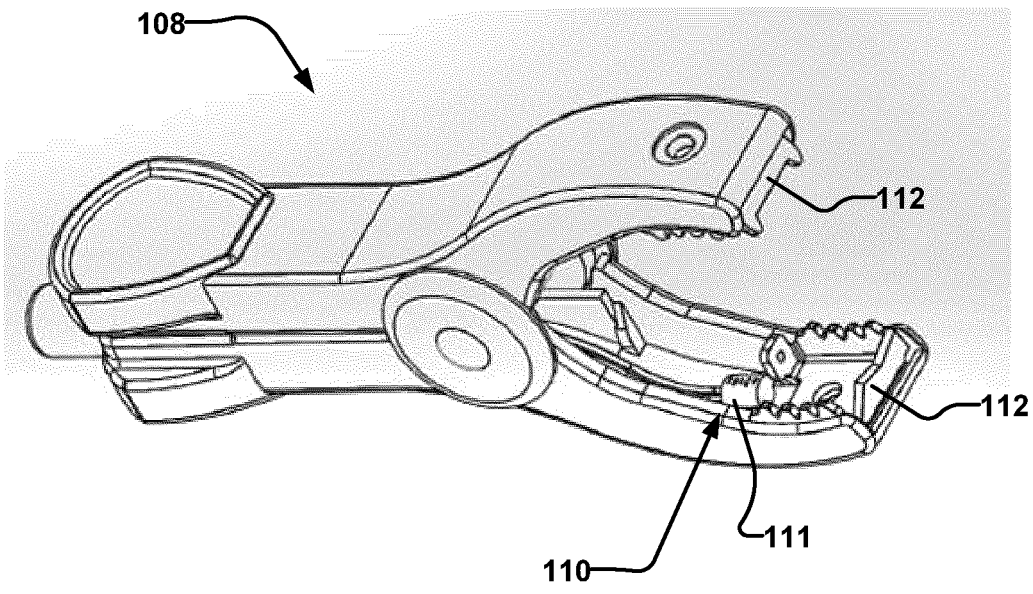
Figures 10C, 10D, 11:
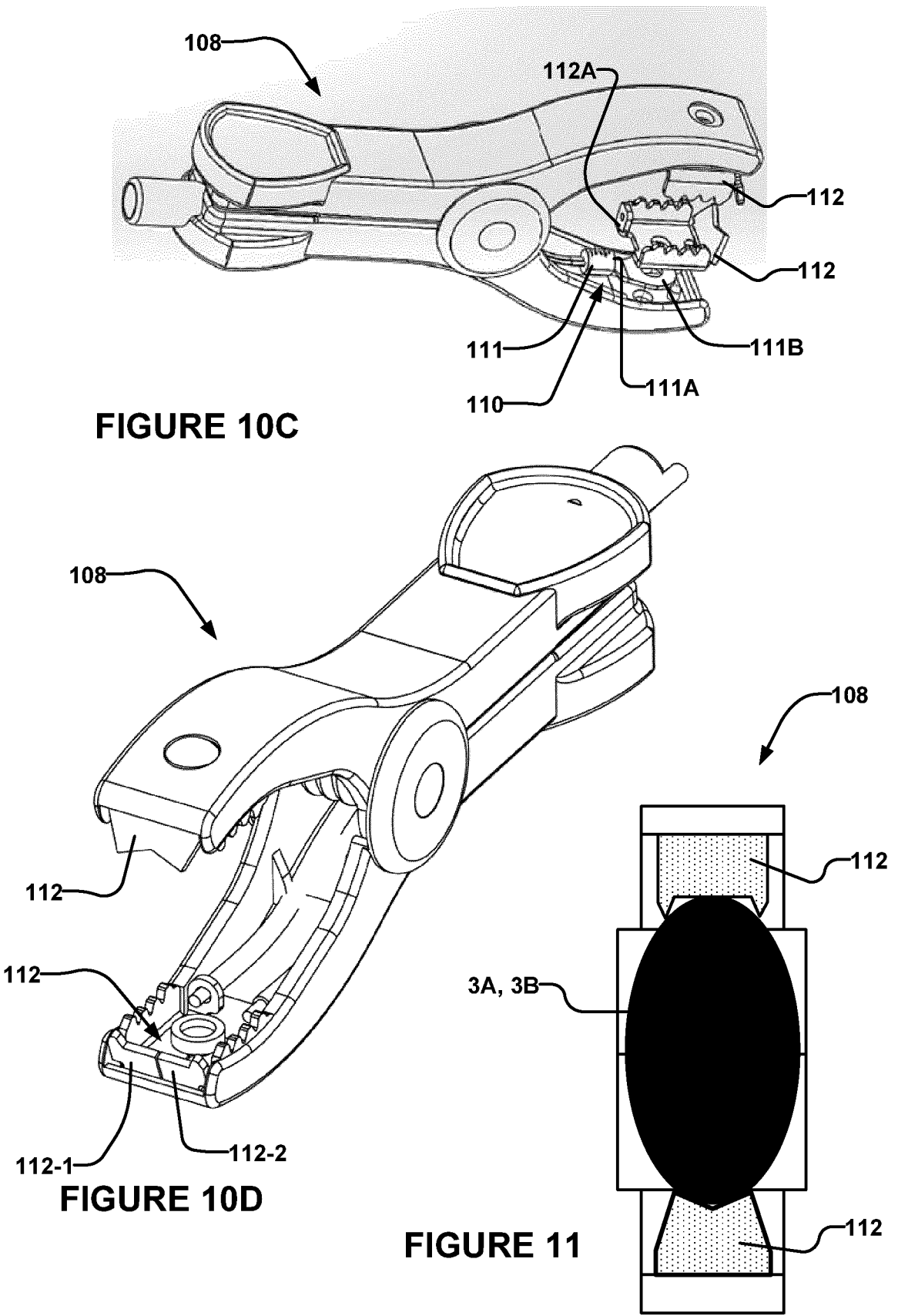
FIG. 10C is a partial exploded perspective view of the clip of FIGS. 10A and 10B.
FIG. 10D is a perspective view of an example clip which may be coupled to an electrochemical system.
FIG. 11 is a schematic illustration of an example clip coupled to a terminal of an electrochemical system.

In some embodiments one or both of leads 4A and 4B of testing module 4 (or apparatus 10) comprise a clip 108 coupled to an end of the lead (see e.g. FIGS. 10A to 10C). Clip 108 may comprise temperature sensor 110. For example a thermistor 111 may be installed close to a metal conducting surface 112 of clip 108 (see e.g. FIG. 10A). Coupling clip 108 to a terminal of battery 3 places one or more conducting surfaces of the clip in contact with one or more surfaces of the terminal of the battery. Having these surfaces contact each other allows for the transfer of heat from battery 3 to the conducting surface(s) of the clip. After enough time has passed the clip and the terminal of the battery will be in thermal equilibrium.

Accuracy of the data provided by temperature sensor 110 may be improved by increasing contact of one or more sensing surfaces of temperature sensor 110 with faces of conducting surface 112. In some embodiments one or more faces of conducting surface 112 directly abut sensing surfaces of temperature sensor 110. For example, a face 112A of conducting surface 112 may abut sensing surface 111A of thermistor 111 (see e.g. FIGS. 10B and 10C). In some embodiments thermistor 111 comprises a sensing plate 111B. Sensing plate 111B may increase the sensing surface of thermistor 111. In some embodiments sensing plate 111B abuts a bottom portion of a conducting surface 112 (see e.g. FIG. 10C).

Preferably there is low thermal resistance between terminals of battery 3 and the conducting surfaces (e.g. conducting surfaces 112) of a clip (e.g. clip 108). Preferably there is also low thermal resistance between the conducting surfaces and sensing surfaces of the temperature sensor (e.g. sensor 110). This may improve sensitivity of temperature sensor 110.

Low thermal resistance may, for example, be a thermal resistance in the range of about 0.002 to 0.069 mK/W. Materials having low thermal resistance may, for example, be copper, brass, aluminum, gold, stainless steel and/or the like.

Preferably there is also high thermal resistance between conducting surfaces 112 of a clip and other portions of the clip. This may prevent (or reduce) heat transfer between conducting surfaces 112 and other portions of the clip. This may, for example, reduce the likelihood that heat may erroneously be transferred between the other portions of the clip and temperature sensor 110 (which may introduce error in data produced by temperature sensor 110). This may also reduce the likelihood that heat from a conducting surface 112 will be dissipated through the other portions of the clip thereby reducing the temperature reading obtained by temperature sensor 110. In some embodiments the clip comprises a thermal insulator between a conducting surface 112 and one or more other of the lead (e.g. the outer casing, a wall of the lead, etc.).

High thermal resistance may, for example be a thermal resistance in the range of about 4 to 5.88 mK/W or more. Materials having high thermal resistance may, for example, be epoxy, nylon, PVC, ABS, a polycarbonate (PC) and/or the like.

In some embodiments one conducting surface 112 of a clip 108 is electrically isolated into two distinct portions (see e.g. distinct portions 112-1 and 112-2 in FIG. 10D). This may facilitate, for example, having a Kelvin connection when the lead is coupled to a terminal of battery 3. In some embodiments one of the distinct portions acts as a reference electrode (e.g. portion 112-1) and the second distinct portion acts as a working electrode (e.g. portion 112-2). The reference electrode may, for example, be connected to a voltage monitor. The working electrode may, for example, be connected to a variable lead (e.g. load 34 described elsewhere herein). In some embodiments the lead comprises an electrical isolator between the two distinct portions.

In some embodiments the clip comprises both a temperature sensor 110 and a conducting surface split into two distinct portions (e.g. to provide a Kelvin connection as described elsewhere herein). In some embodiments temperature sensor 110 (e.g. thermistor 111) abuts the other conducting surface which is not split into two distinct portions (e.g. in embodiments where the clip comprises two opposing conducting surfaces). In such embodiments temperature sensor 110 may be positioned relative to the un-split conductive surface as described elsewhere herein. In some embodiments sensing surfaces of temperature sensor 110 abut one of the two distinct portions of the split conducting surface but not both. This may facilitate running wiring from temperature sensor 110 and the distinct portions of the split conducting surface on the same side of the clip. In some embodiments sensing surfaces of temperature sensor 110 abut both of the distinct portions of the split surfaces. In some such embodiments a sensing surface which spans both the distinct portions is not electrically conductive.

Figure 11A:
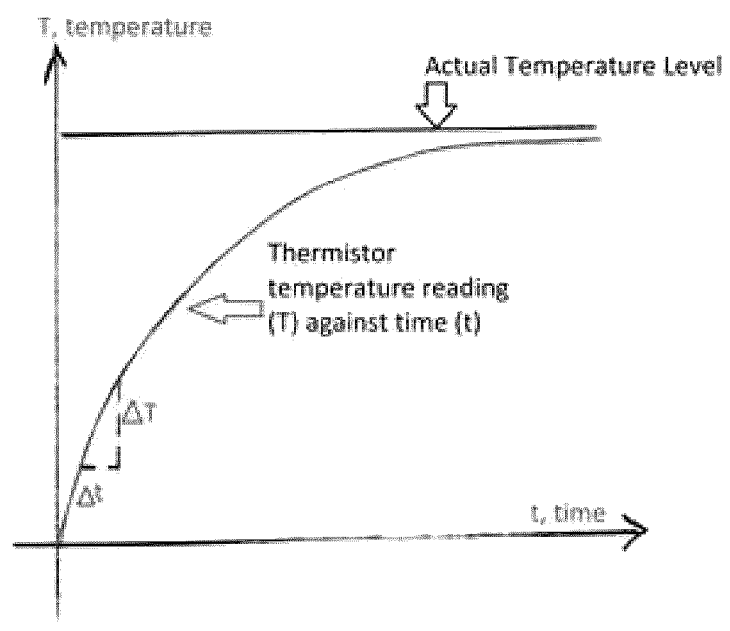
FIG. 11A is a graphic illustration showing an example output of a temperature sensor of the clip of FIGS. 10A and 10B.

Typically there is a delay between a time that a clip is coupled to a terminal of the battery and the time at which the contacting surface(s) of the clip and the terminal of the battery reach a state of thermal equilibrium. During this delay the temperature output of temperature sensor 110 does not represent the temperature of battery 3. The temperature sensed by temperature sensor 110 changes until an equilibrium temperature is reached.

Where the clip is initially at a lower temperature than the terminal of the battery to which the clip is connected then a difference between the temperature of the clip (measured by the temperature sensor) and the temperature of the terminal of battery 3 to which the clip is coupled generally tracks an inverse exponential function (see e.g. FIG. 11A). This is advantageous because the first time derivative of an exponential function is directly correlated to the value of the exponential function. So, the rate at which the temperature measured by temperature sensor 110 is changing is indicative of the temperature difference between the clip and the terminal of battery 3 to which the clip is connected. The specific relationship between the rate of change of the temperature measured by temperature sensor 110 and the temperature difference between the clip and the battery terminal depends on factors such as:

the thermal mass of battery 3;

the thermal mass of the clip; and the thermal conductivity of the connection between the terminal and the clip.

The combined effect of these factors may be determined by calibrating the temperature sensor 110 relative to a type of battery in a lab environment.

A model for determining an internal temperature of the battery based on the equilibrium temperature may also be developed by calibrating the temperature sensor relative to a type of battery in a lab (e.g. testing the temperature sensor and battery in number of different environmental temperatures).

By measuring a rate of change of the output of the temperature sensor and using the thermal equilibrium model for the specific type of battery being tested (i.e. determining how far from reaching equilibrium the contact surfaces and temperature sensor are) to estimate the temperature difference between the temperature sensed by the temperature of the terminal of battery 3 the temperature of the terminal of battery 3 may be determined by adding the calculated temperature difference and the temperature measured by temperature sensor 110. This allows temperature of battery 3 to be quickly determined (i.e. the system need not wait for the lead and the terminal to reach thermal equilibrium). Based on the equilibrium temperature, an internal temperature of the battery may be determined.

In some embodiments temperature sensor 110 measures the rate at which the temperature measured by temperature sensor 110 may be changing (e.g. "dT/dt"). The measured rate of change may be processed to yield a model defining a relationship between the rate of change and the temperature difference (e.g. "$\Delta T$") between the clip and the battery terminal (e.g. "f($\Delta T$)"). As described elsewhere herein the model may be determined by calibrating temperature sensor 110 relative to a type of battery in a lab environment. To determine the temperature difference ($\Delta T$) an inverse of the model function may be taken. The temperature of the battery may be determined by adding the computed temperature difference ($\Delta T$) to the measured temperature (e.g. "T").

Apparatus 10 is preferably configured to receive signals from temperature sensor 110. For example, apparatus 10 may be configured to receive one or more wires extending from temperature sensor 110 to apparatus 10. In some embodiments temperature sensor may communicate wirelessly with apparatus 10. Apparatus 10 may also comprise a data store configured to store information about a calibrated model for temperature sensor 110 (e.g. model parameters, inverse parameters of the model, etc.). In some embodiments the model is simple. For example, the temperature difference ($\Delta T$) may be obtained by multiplying the rate of temperature change (e.g. "dT/dt") with a scaling value. Apparatus 10 may also comprise one or more logic circuits and/or processors configured to control temperature sensor 110 and/or determine the temperature of the battery as described above.

In some embodiments temperature sensor 110 (and/or clip 108) comprises local storage. In some such embodiments information (or a portion of the information) about a calibrated model for temperature sensor 110 may be stored locally with temperature sensor 110. The measurements taken by temperature sensor 110 may be processed (at least partially) locally on temperature sensor 110 (and/or clip 108). The processed data may be communicated to apparatus 10. In some embodiments the data is communicated wirelessly. In some embodiments the processed data is communicated by wired connection.

In some embodiments the calibration data comprises a range of values such as the rate of temperature change, measured temperature, etc. which the measurements taken by temperature sensor 110 may fall within for a specific battery type. If the measurements taken by temperature sensor 110 fall outside of this range, temperature apparatus 10 may warn the user that the measurements taken by temperature sensor 110 fall outside of a range defined by the calibration data. For example apparatus 10 may warn a user that clip 108 may not be positioned properly relative to the battery.

The temperature of battery 3 may be estimated without waiting for the lead to come into thermal equilibrium with the corresponding terminal of battery 3. This may be done by measuring a rate of change of the temperature reading of temperature sensor 110 against time and extrapolating from the rate of change a predicted temperature of battery 3. Advantageously this can reduce time required for testing because apparatus 10 need not wait for temperature sensor 110 to reach steady state in order to determine the temperature of battery 3.

Alternatively, or additionally, the lead may comprise an infrared type sensor 113 mounted proximate to the conducting surface.

Temperature sensor 110 may be calibrated by testing the temperature sensor(s) with multiple batteries and independently measuring temperatures of the batteries. Such tests may be conducted in varying temperature settings. The data may be used to generate a formula specific to the temperature sensor within the electrode.

In some embodiments temperature sensor 110 continuously measures temperature of battery 3. Apparatus 10 may record this data and average the data to obtain a baseline temperature $T_0$. Upon apparatus 10 commencing a test of battery 3, apparatus 10 may record an initial starting temperature $T_1$ at the time the test was commenced. Once the test is over, apparatus 10 may record a finishing temperature $T_2$ at the time the test was completed. The temperature of battery 3 may then be computed, for example, as follows:

$$T=T_0+M(T_1-T_2)$$

wherein M is a scaling value. M may be determined during the performed calibration tests as described above. In some embodiments M is a constant. In some embodiments M is dependent on $T_1$ and $T_2$.

A number of scaling values and models based on battery type may, for example, be stored in data store 25 (e.g. stored locally on testing module 4, stored in cloud system 7, etc.). Once a user inputs a type of battery being tested (or the system ascertain what type of battery is being tested in any other manner), the appropriate scaling values and model(s) may be retrieved from the data store.

Accuracy of the temperature readings made by the temperature sensors depend in part on the surface (e.g. surface 112) conducting heat from the battery to the temperature sensor. The inventors have discovered that thermal conduction of the surface (and therefore the accurateness of the temperature measurement) may be improved by constructing a lead to have one or more contact surfaces which conform to a shape of the battery terminal (which may, for example, comprise a post). Having the contact surfaces conform to the shape of the battery increases a surface area of the contact surface which is in contact with the battery post thereby increasing thermal conduction of the surfaces (see e.g. FIG. 11).

In some embodiments apparatus 10 measures temperature of battery 3 with an accuracy of ±5° C. In some embodiments apparatus 10 measures temperature of battery 3 with an accuracy better than ±5° C.

In embodiments where apparatus 10 comprises two or more temperature sensors 110 (e.g. one temperature sensor 110 on each of two leads), readings from the different temperature sensors may be averaged together. In some embodiments readings from temperature sensors which vary from the remaining readings by more than a threshold amount may be discarded (i.e. not considered by apparatus 10).

In some embodiments signals from temperature sensors 110 are conditioned. For example, apparatus 10 may comprise a filtering circuit designed to remove electromagnetic noise from the temperature readings. In some embodiments the signals from the temperature sensors may be amplified, buffered, etc. prior to being processed. The temperature sensors may be powered via a power source from testing module 4 (or apparatus 10).

Figure 12:
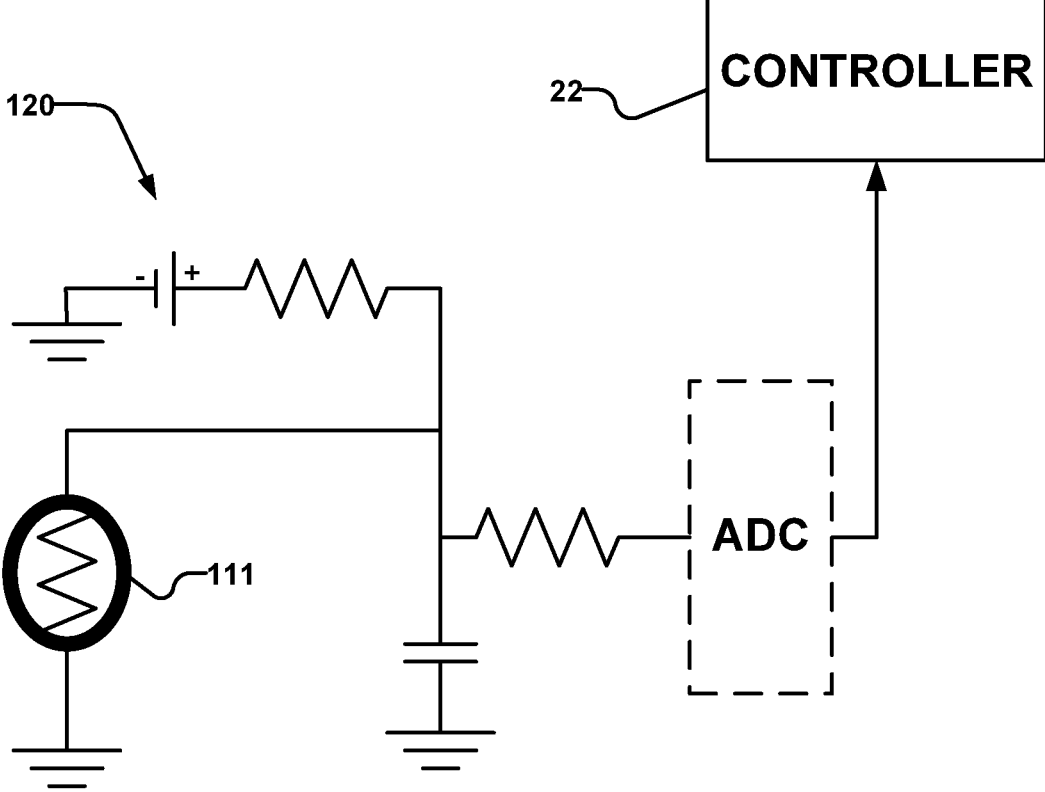
FIG. 12 is a schematic illustration of an example circuit coupling a temperature sensor of the clip of FIGS. 10A and 10B to an electrochemical system.

In some embodiments thermistor 111 may be electrically coupled to apparatus 10 as shown in example circuit 120 of FIG. 12. Thermistor 111 and/or the infrared sensor may be a commercially available sensor.

In some embodiments apparatus 10 comprises only one lead which comprises a temperature sensor. In some embodiments the lead with the temperature sensor is coupled to the negative terminal of battery 3. In some embodiments the lead with the temperature sensor is coupled to the positive terminal of battery 3.

In some cases there is a significant temperature variation between the internal parts of a battery being tested (e.g. battery 3) at which electrochemical reactions occur (e.g. a center of battery 3 and temperatures of surface portions of the battery that are accessible for temperature measurements (including battery terminal posts). The variation in temperature may result in an inaccurate estimation of battery temperature if the temperature of the battery is assumed to be the same as the temperature of the battery's terminal posts.

In some embodiments a temperature estimation algorithm correlates one or more measurements from a thermistor (e.g. thermistor 111) or other temperature sensor measuring a temperature of an external surface of battery 3 to an internal temperature of battery 3.

The temperature estimation algorithm may, for example, comprise a statistical estimator. In some embodiments the statistical estimator comprises a minimum mean square error (MMSE) estimator (e.g. an estimator which attempts to minimize a mean square error of a random variable). In some embodiments the MMSE estimator comprises a linear MMSE (LMMSE) estimator (e.g. an estimator which optimizes a linear function).

Internal temperature of battery 3 may, for example, be estimated as follows:

$$\hat{x} = Wy + b$$

wherein $\hat{x}$ represents an estimate of the internal temperature x of battery 3, W is a matrix (e.g. a row vector), y is a measurement vector (e.g. a column vector) and b is an offset scalar.

b and W may be calculated from calibration measurement vectors (y) corresponding to known values of x (e.g. known battery internal temperatures). Such values of x and the calibration measurement vectors (y) may be experimentally obtained in a lab setting by, for example, testing multiple batteries at multiple different internal temperatures. Optimal values for b and W may, for example, be represented as follows:

$$b = \bar{x} - W\bar{y}$$

$$W = C_{XY}C_y^{-1}$$

wherein $\bar{x}$ and $\bar{y}$ are the means of calibration values x and y respectively which were experimentally obtained as described above, $C_{XY}$ is the cross-covariance of calibration values x and y and $C_y$ is the auto-covariance of calibration value y.

The measurement vector y may comprise one or more of the following:
   initial battery post temperature (e.g. battery post temperature at start of test);
   final battery post temperature (e.g. battery post temperature at end of test);
   average battery post temperature;
   initial rate of change of battery post temperature;
   final rate of change of battery post temperature;
   average rate of change of battery post temperature;
   ambient temperature;
   internal battery temperature estimates obtained from another algorithm;
   another measurement or estimate of a property of the battery;
   etc.

In some embodiments the statistical estimator is modified to estimate both internal temperature and at least one other property of the battery. In such embodiments x and b become vectors and the dimensions of matrix W increase. In some embodiments the statistical estimator estimates the other property alone (i.e. does not estimate internal temperature of the battery but rather estimates the other property of the battery).

In some embodiments internal temperature of the battery is estimated with a state observer. In some embodiments the state observer comprises a Kalman filter. In some embodiments the state observer receives as input any measurement vector y described herein.

Cloud Functionality

As described elsewhere herein, apparatus 10 may comprise and/or interact with a cloud-based system 7. Cloud-based system 7 may host a library containing data from lab tests of a large number of batteries. Data collected during a test of battery 3 may be uploaded to cloud-based system 7. For example, user entered data, measured voltage and current, measured temperature of battery 3, measured state of charge, etc. may be uploaded to cloud-based system 7. Cloud-based system 7 may, for example and without limitation, use such data to:

>   further train AI module 6 to improve performance, accurateness, etc. of AI module 6;
>
>   perform calculations more efficiently reducing processing time;
>
>   calibrate apparatuses 10 which are in communication with cloud-based system 7;
>
>   report results of a test to a user (e.g. by providing an online report);
>
>   etc.

Some of the methods described elsewhere herein require computation of a number of complex, computationally intensive algorithms (e.g. model fitting, machine learning, etc.). Performing such algorithms on cloud-based system 7 may provide increased processing capabilities compared to the local processing capabilities of an apparatus 10.

In some cases apparatus 10 acquires impedance data (e.g. a complex impedance frequency spectrum). Apparatus 10 may communicate the impedance data to cloud-based system 7. Additionally, apparatus 10 may communicate any information about battery 3 which was provided by a user.

In some embodiments apparatus 10 may perform model fitting. In such embodiments apparatus 10 optionally communicates model parameters to cloud-based system 7. In some embodiments the model fitting may be performed directly on cloud-based system 7. For example, apparatus 10 may communicate impedance data to cloud-based system 7 for further processing. In some cases, if apparatus 10 does use cloud-based system 7 to compute a model fit, fit parameters may be sent to cloud-based system 7 separately from the computed impedance data.

Cloud-based system 7 may then proceed to classify a state of health of battery 3 based on one or more of the computed impedance data, the model parameters, user provided information about battery 3, etc.

In some embodiments battery 3 is identified by a unique identifier. Data obtained from tests performed on battery 3 including EIS data, measured voltage data, measured current data, temperature, etc. may be stored in cloud-based system 7. The unique identifier may index the data. Additionally, or alternatively, testing module 4 may comprise a printer. The printer may print out a label for a battery 3 that is being tested. The label may include information identifying the battery and/or performance data. In some embodiments the label includes one or more of the unique identifier assigned to the battery 3 being tested, measured EIS data, measured voltage data, measured current data, temperature, etc.

In some embodiments testing module 4 may comprise a scanner for quickly identifying a battery 3 (e.g. a barcode scanner, OCR scanner, computer vision scanner). Once a battery 3 is identified testing module 4 may pull stored data corresponding to battery 3 from cloud-based system 7. The stored data may be displayed to a user. In some embodiments testing module 4 predicts performance of battery 3 based on data stored in cloud-based system 7 for identical (or similar) batteries.

In some embodiments cloud-based system 7 comprises data corresponding to a fleet of batteries 3 (i.e. a plurality of batteries 3). Each battery in the fleet may be identified by a unique identifier. Cloud-based system 7 and/or AI module 6 may analyze the data corresponding to the fleet of batteries to determine useful patterns in the data, threshold identifiers (e.g. a threshold voltage response indicative of imminent failure of a battery), optimize usage of the fleet of batteries, etc. Non-limiting example cases of how data corresponding to a fleet of batteries may be used include:

>   The data corresponding to the fleet of batteries may be analyzed to determine performance of different batteries in the fleet used in different environmental conditions. Performance of a battery 3 may decrease faster if the battery 3 is exposed to harsher environmental conditions (e.g. hot environments, very cold environments, very humid environments, etc.). For example, certain impedance parameters corresponding to specific effects (e.g. aging effects, depletion of ion concentrations, etc.) may be present sooner for batteries operating under higher temperatures (e.g. a temperature over 30° C.). Usage of the fleet of batteries may be optimized by identifying which batteries in the fleet are more likely to fail sooner based on the environmental conditions the batteries are exposed to. Additionally, or alternatively, usage of the fleet of batteries which comprises batteries having different states of health may be optimized by allocating batteries to different environmental conditions based on their state of health (e.g. a brand new battery may be allocated to an environment prone to harsh environmental conditions while a battery having a lower (e.g. 80%, 70%, etc.) state of health may be allocated to an environment having less harsh environmental conditions).
>
>   The data corresponding to the fleet of batteries may be analyzed to identifying effects on the state of health of the batteries in the fleet based on usage of the batteries. A state of health of a battery may decrease faster if the battery is subject to more strenuous use (e.g. rapid charging, rapid discharge, etc.). Certain parameters in the measured impedance data may correspond to more strenuous use. Identifying such parameters may facilitate better management of the fleet of batteries which prolongs the life of the fleet of batteries. The fleet of batteries may be managed by reducing strain on the batteries by changing a usage profile, exposing different sets of the batteries to the more strenuous use at different times, etc.
>
>   etc.

Cloud-based system 7 may provide a central means for processing the data corresponding to the fleet of batteries. Cloud-based system 7 may report results of the analysis simultaneously to different users (e.g. owners of fleets of batteries, manufacturers of batteries, designers of technologies dependent on the batteries, etc.). In some embodiments cloud-based system 7 automatically communicates data corresponding to a risk of battery failure that exceeds a preset threshold amount. The threshold amount may be set by a user of cloud-based system 7.

In some cases a battery may not meet required performance characteristics for one application but may meet required performance characteristics of a second application. For example, a battery may not have the required performance characteristics for powering a vehicle but may still be reliably used to power a transmission tower or for grid storage. Cloud-based system 7 may monitor and/or analyze data corresponding to a battery to identify when the battery may no longer be suited for its initial intended purpose. Cloud-based system 7 may also identify one or more different systems the battery may still be used to power. In some embodiments AI module 6 is trained to periodically (e.g. every month, week, day, etc.) monitor data corresponding to the battery to determine a state of health of the battery. The determined state of health may be compared to a threshold state of health for a specific application. The threshold state of health may be stored in cloud-based system 7.

Cloud-based system 7 may comprise data corresponding to systems in need of a new battery. Cloud-based system 7 may pair a battery no longer satisfying its initial intended purpose to a new system which may be powered by the battery.

In some embodiments cloud-based system 7 analyzes data corresponding to a single battery 3. Such analysis may, for example, determine whether use of the battery is being optimized, what a typical usage profile for the battery is, whether the battery is being used to its maximum capacity, etc. For example, cloud-based system 7 may (non-limiting):

Monitor the state of charge of the battery to determine whether the battery is being charged before its full capacity is consumed. If so, a user warning may be generated.

Recommend a usage profile. The usage profile may optimize use of the battery. The usage profile may for example suggest a charging protocol for increasing the life of the battery.

Dynamically vary a recommended usage profile.

Verify whether the battery is being used according to a recommended profile and/or incentivize usage according to the recommended protocol.

etc.

Cloud-based system 7 may compare the test results to test results of batteries being used in an identical (or similar) manner. If a discrepancy is noticed (i.e. worse performance characteristics), cloud-based system 7 may generate a warning indicating that a specific load is resulting in increased degradation of a battery. Additionally, or alternatively, could-based system 7 may generate a warning indicating that an apparatus 10 which resulted in the discrepancy may be faulty.

As described elsewhere herein cloud-based system 7 may collect data corresponding to a battery periodically. In some embodiments cloud-based system 7 may adjust an amount of time between subsequent collection of data based on previous test results. For example, if cloud-based system 7 may decrease the time between subsequent collections of data if it becomes more likely that a battery will fail. If it becomes less likely that a battery will fail, could-based system 7 may increase the time between subsequent collections of data.

In some embodiments cloud-based system 7 initiates one or more defensive protocols if it determines that the likelihood of a battery failing has exceeded a predetermined threshold. The one or more protocols may include requesting a new battery be delivered, saving current data, safely shutting down a system being powered by the battery, generating a user warning, etc.

In some cases testing modules 4 may be modified to improve test results of battery 3. For example, hardware and/or software components of a testing module 4 may be modified to improve test results. Cloud-based system 7 and/or AI module 6 may determine a scaling function for preserving battery data previously collected. The scaling function may, for example, map previously stored data to a new dataset. The new dataset is ideally the data the modified testing modules 4 would have collected had they been modified when the previous tests were run. The scaling function may be communicated to the testing modules 4 via could-based system 7.

In some embodiments cloud-based system 7 analyzes collected data to determine a life cycle of a battery or batteries. The life cycle may provide information about the history of a battery. The life cycle may span from manufacturing to recycling. Cloud-based system 7 may report the determined life cycle to users, battery manufacturers, battery suppliers, environmental organizations, etc.

In some embodiments cloud-based system 7 incentivizes optimal use of one or more batteries. For example, cloud-based system 7 may track usage of the one or more batteries. If cloud-based system 7 determines that the use of the one or more batteries satisfies a predetermined threshold for good use, cloud-base system 7 may:

reduce service fees;

certify the one or more batteries as reliable if they are to be sold second-hand;

etc.

In some embodiments a testing device is integrated with a battery. The integrated testing device may comprise one or more sensors configured to measure properties of the battery (e.g. one or more of a temperature sensor, a current sensor, a voltage sensor, etc.) and/or an entire testing module as described elsewhere herein (e.g. testing module 4). The integrated testing device may dynamically monitor properties of the battery, a condition of the battery, a load cycle of the battery and/or the like.

The integrated testing device may be configured to measure data relating to properties of the battery. For example, the integrated testing device may be configured to measure temperature of the battery's terminals and/or temperatures of internal battery components such as anode(s), cathode(s) and/or electrolyte, an amount of current being drawn, a current charge of the battery, a load cycle of the battery, etc. The measured data may be processed to determine a condition of the battery (e.g. a state of health, a state of charge, etc.). In some embodiments the integrated testing device communicates the measured data to cloud-based system 7 for processing. In some such embodiments the integrated testing device comprises a transmitter. In some embodiments the integrated testing device comprises a data communication network node, for example a CANBUS node.

The integrated testing device may be configured to periodically measure data (e.g. at a set time interval). However, the integrated testing device may additionally or alternatively be configured to measure data upon a threshold condition being detected. For example, the integrated testing device may be configured to measure data during a rest cycle of the battery. A rest cycle may, for example, be detected by detecting a drop in drawn current from the battery that exceeds a threshold amount. Such threshold may be preset and/or dynamically varied in real time based on detected use of the battery.

The integrated testing device may be self-powered. For example, the integrated testing device may comprise its own power source such as a battery. In some embodiments the integrated testing device recharges its power source using current drawn from the battery being monitored. In some embodiments the integrated testing device is powered from the battery being monitored. In some embodiments the integrated testing device is powered by electrical charge in an energy storage device such as a supercapacitor. The energy storage device may be charged by the battery being monitored and/or from another source.

In one example case the integrated testing device is integrated with an electric vehicle battery (or a battery in another context that experiences different load cycles that include a rest cycle and an operational cycle). The integrated testing device may be configured to measure parameters of the battery during different load cycles (e.g. a rest cycle, a drive cycle, and/or a charging cycle, etc.) of the battery. The measured parameters may be processed alone or in combination with information about the different load cycles of the battery to determine a condition of the battery (e.g. state of health of the battery, state of charge of the battery, etc.). The processing may be done locally on the integrated testing device or may be done remotely (e.g. on cloud-based system 7).

In some embodiments the integrated testing device is configured to measure data a certain period of time after the battery commences a rest cycle and/or when the battery is in the rest cycle and has a temperature that differs from an ambient temperature by less than a threshold amount (the integrated testing device may include a temperature sensor located to measure ambient temperature). For example, the integrated testing device may include a timer that triggers the integrated testing device to measure data about the battery 2 hours after the battery enters a rest cycle. The start of a rest cycle may be detected, for example, by detecting an 'ignition off' condition and/or by detecting that little or no power has been drawn from the battery for a threshold period of time. As another example the integrated testing device may trigger measurement of data when the battery is in a rest state and the temperature of one or more components of the battery satisfies a condition such as being below a threshold and/or differing from ambient temperature by less than a threshold. In some embodiments these conditions are combined.

The integrated testing device may be configured to measure data while the battery is in a rest cycle (e.g. the vehicle is not being driven). However, some parameters of the battery may depend on loads drawn from the battery during a drive cycle of the battery (e.g. while the vehicle is being driven). For example, some parameters of the battery may change based on a rate at which the battery was previously discharged during a drive cycle of the battery (e.g. state of charge). In such case data collected during the latest drive cycle may be used to scale parameters measured during a rest cycle. This may, for example, compensate for different discharge rates of the battery.

In some embodiments the integrated testing system acquires data for the battery during each of two or more of a rest cycle, an operational cycle and a charging cycle. The acquired data may then be processed together as described herein to evaluate a condition of the battery (e.g. SoH). The processing may, for example, be performed by cloud-based system 7. In some embodiments the integrated testing system sends data to cloud-based system 7 together with data that indicates whether the data was obtained while the battery was in a rest cycle, operational cycle or charging cycle. Cloud-based system 7 may store the received data and, when enough data has been received, cloud-based system 7 may process the received data to determine a condition of the battery. In some embodiments the integrated testing system accumulates data until a required set of data has been accumulated (the set may include data acquired during different cycles of the battery) and then sends the set of data to cloud-based system 7 for processing.

In some cases information about the drive cycles, temperature of the battery and complex impedance data measured during rest cycles of the battery (e.g. measured as described elsewhere herein) may be transmitted to cloud-based system 7. The data may be continuously transmitted to cloud-based system 7 but this is not necessary in all cases. For example, if the integrated device detects that there is negligible variation in the measured data (e.g. the measured data varies from previously measured data by less than a threshold amount), the integrated device may cease transmission of the data until new data is detected. In some embodiments the data is transmitted using a communication system of the vehicle.

The complex impedance data may be fitted to an appropriate electric circuit model (or models). Computed parameters may be scaled by the load cycle information (e.g. to compensate for different discharge rates). In some cases information from the most recent drive cycle before the complex impedance data was measured is used to scale the computed parameters (e.g. to compensate for the discharge rate prior to measuring the complex impedance data). As described elsewhere herein an artificial intelligence module (e.g. AI module 6) may at least partially process the measured data to determine a condition of the battery (e.g. a state of health of the battery, a state of charge of the battery, etc.).

Cloud-based system 7 may communicate a determined and/or updated condition of the battery back to the vehicle. In some embodiments an operator of the vehicle is notified of the updated condition. For example, a display showing a state of charge estimation may display the latest state of charge estimation. As another example, the operator of the vehicle may receive a warning (visual, audio, etc.) if the battery is determined to have a state of health less than a threshold amount.

Preferably a test of battery 3 is not performed if battery 3 is undercharged. In some cases however, testing module 4 (or apparatus 10) is able to differentiate between a poor battery and a good battery that has been over-discharged. For example, apparatus 10 may measure the open circuit voltage or state of charge of battery 3. If an under charged state is detected, computed impedance values and/or model parameters may be scaled (using a scaling polynomial, look-up table, etc.) to compensate for the undercharged state of battery 3. An under charged state may be detected if the open circuit voltage is below a specified threshold (e.g. a threshold provided by a manufacturer of the battery).

In some cases battery 3 has a state of charge below a minimum threshold for performing a test. In such cases apparatus 10 may inform a user that battery 3 must be charged prior to running the test. The user may be informed via input/output interface 7.

Example Applications

Application in Anomaly Detection

In some cases the systems and methods described herein may be applied to verify production of electrochemical cells. For example, the systems and methods described herein may be applied as a quality control device which tests each electrochemical cell (or randomly sampled electrochemical cells) coming out of a production line to test whether the sampled electrochemical cells meet applicable performance requirements. Additionally, or alternatively, the tests may verify whether electrochemical cells are being consistently produced by the production line.

In some cases a EIS response of an electrochemical cell which is known to be of high quality is captured. Such EIS response may then be used as a reference against which other tested electrochemical cells are compared. The comparison may comprise (non-limiting):

Modelling the tested electrochemical cell and comparing the parameters of the model to predefined model parameters of the reference sample. A pass/fail criteria of the test may be based on a variation of the model parameters of the tested electrochemical cell to the model parameters of the reference sample. In some cases a pass/fail tolerance is defined through statistical analysis.

Comparing real and/or imaginary components at some or all frequencies of the EIS of the tested electrochemical cell to the real and/or imaginary components of the EIS data of the reference sample. An amount of acceptable deviation may be predefined through, for example, statistical analysis.

Training a machine learning algorithm, DN (Dirichlet-Neumann) algorithm, etc. using EIS data and/or model parameters of a plurality of new high quality electrochemical cells to evaluate quality of tested electrochemical cells. In some cases the training data comprises EIS data and/or model parameters of electrochemical cells identified as anomalies or badly produced electrochemical cells.

Application in Early Detection of Malfunctioning Cells

The EIS or testing systems described herein may (with or without embedded analytical programs) be integrated into a BMS (battery management system or similar system) of an electrochemical cell pack. Single cells or arrays of cells may be sampled to capture EIS or other test data. The cells may be sampled periodically or at random times. In some cases the cells are sampled during "quiet periods" (i.e. a period of time when the equipment being powered by the electrochemical cell pack is not in operation).

Methods described herein may obtain the sampled data and may be applied to detect or provide advance warning of failures of the electrochemical cell pack in the field. In some cases the methods described herein are applied to detect a failure in real time or to detect an imminent failure prior to its occurrence (e.g. to give an operator enough warning to take appropriate remedial action).

If a particular failure mode is of interest then EIS or other test data corresponding to such failure mode with or without modeling parameters may be used to train a machine learning algorithm to detect the particular mode of failure.

In some cases the methods are performed in real-time via a cloud based system or offline through a computer program which has access to the EIS or other test data from the cloud based system. This is advantageous when the battery management system does not have embedded analytical programs.

Application in State of Charge Estimation

EIS hardware with or without embedded analytics may be integrated into a battery pack battery management system. The integrated hardware may be used to regularly measure the impedance spectrum response of a battery during quiet modes (e.g. times when equipment which is being powered by the battery is not in operation) to assess SoH of the battery. Battery model parameters that are commonly used for battery SoC estimation through Kalman filtering or other non-linear estimations as described elsewhere herein may be updated as the battery ages to ensure accurate SoC estimation over the life span of the battery. Such application may be particularly advantageous for mileage prediction for electric vehicles, computing a remaining useful energy of the battery and/or the like.

Application in Battery Manufacturing Optimization

In some cases the systems and methods described herein are used in laboratory settings to optimize battery design (or design of electrochemical cells of other types). For example, the systems and methods described herein may be used to optimize the thickness of a coating on an electrode of a particular electrochemical cell being designed. The effect of the coating on charge transfer resistance may be monitored and a minimum thickness with the lowest resistance may be found. The charge transfer resistance may be derived from fitting a Nyquist plot to electrical circuit models. Embedded analytical programs or an application run on an external device may be programmed to perform such optimization. The analytics application(s) may comprise a machine learning algorithm as described herein.

In some cases a user interface of a device acquires required design parameters (e.g. thickness of the electrode coating) or performance characteristics. A corresponding impedance spectrum response and/or the model parameter(s) relating to the design factor of interest may be identified through the analytics.

Application in Identifying Electrochemical Cell Type

Different electrochemical cells may have different impedance spectra which vary based on type and/or chemistry of the electrochemical cells. For example, automotive batteries may have a distinct impedance spectrum signature with an extremely low imaginary component corresponding to a large double layer capacitance. The systems and methods described herein may in some cases identify different types and/or chemistries corresponding to the tested electrochemical cells. In some cases a machine learning algorithm is trained with impedance spectrum data of various electrochemical cell types and chemistries in order for the algorithm to be able to identify specific types and/or chemistries of the tested electrochemical cells.

Application in Evaluation of Second Life for Electrochemical Cells

The systems and methods described herein may evaluate a usability of an electrochemical cell for a secondary application (e.g. a use of the electrochemical cell that the electrochemical cell was not originally designed for). For example, electric vehicle batteries may be considered to be of poor quality once they drop to 80% of their rated capacity. However, such batteries may nevertheless still be suitable for storage applications and/or or the like. The systems and methods described herein may determine whether a particular electrochemical cell is suitable for another application if the electrochemical cell is no longer suitable for its intended application.

Additional Machine Learning Training Data

Impedance spectrum data may be captured at the start, during and/or after a charging cycle of an electrochemical cell. The information from the impedance spectrum data alone or in combination with model fit parameters and/or information about the charge profile (e.g. period of a certain charge mode, slope and/or time constant of the voltage rise, etc.) may be used as training sets for a machine learning algorithm which is designed to assess the condition of the electrochemical cell.

In some cases impedance spectrum measurement circuit hardware (with or without embedded analytics) is integrated with a charger. In some such cases impedance spectrum data relating to the charge may be captured in real time.

Integration of EIS Hardware with Battery Management System (BMS)

Figure 13:
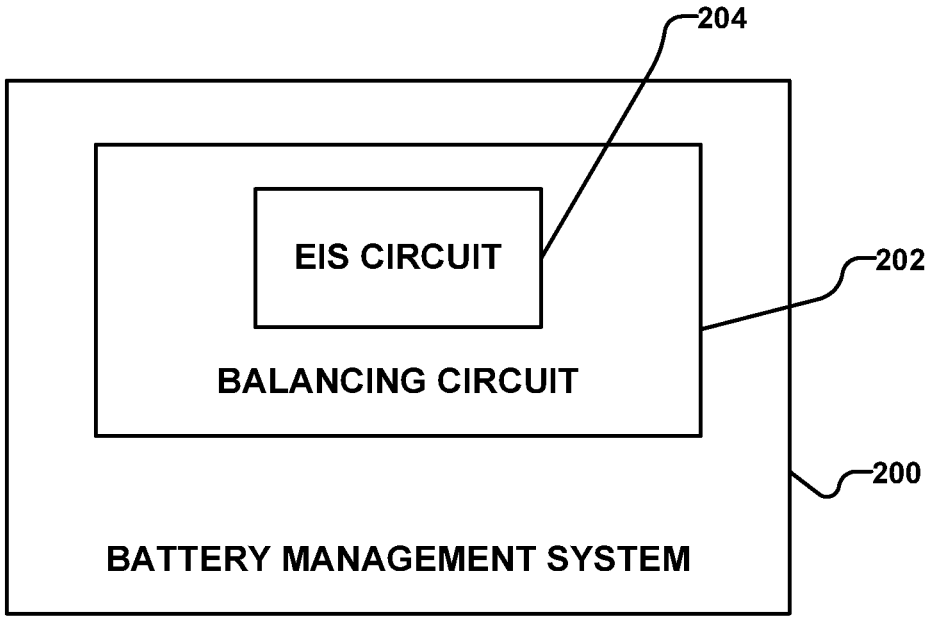
FIG. 13 is a schematic illustration of a battery management system according to an example embodiment of the invention.

In some cases, an impedance spectrum circuit is part of a balancing circuit of a battery management system. FIG. 13 schematically illustrates a battery management system 200 which comprises a balancing circuit 202 having EIS circuit 204. For example, a discharge FET which applies sinusoidal discharge signals to a battery may also be used for balancing purposes inside a battery pack. This advantageously further integrates the EIS device into the battery management system.

Enumerated Example Embodiments

The following are non-limiting example embodiments of the technology described herein. It is emphasized that any of the example embodiments below may be a stand-alone embodiment or may be combined with any other embodiment, feature or combination of features described herein.

A1. A method for compensating for state of charge of an electrochemical system, the method comprising:

measuring an open circuit voltage of the electrochemical system;

determining a scaling factor based on the measured open circuit voltage; and scaling test data corresponding to a test of the electrochemical system based on the scaling factor.

A2. The method according to embodiment A1 wherein the scaling factor is determined based on a scaling function dependent on the open circuit voltage.

A3. The method according to embodiment A2 wherein the scaling function comprises a polynomial function.

A4. The method according to embodiment A3 wherein the scaling function comprises a second order polynomial of the form:

$$f(OCV)=A(OCV)^2-B(OCV)+C$$

wherein A, B and C are fixed coefficients and OCV represents the open circuit voltage.

A5. The method according to any one of embodiments A1 to A4 wherein different scaling factors are applied to compensate different parameters of the test data.

A6. The method according to embodiment A1 wherein the scaling factor is determined based on a look up table.

A7. The method according to embodiment A1 wherein the scaling factor is determined autonomously by an artificial intelligence module trained to autonomously compensate for effects resulting from different states of charge based on the measured open circuit voltage.

A8. The method according to embodiment A7 wherein the artificial intelligence module is trained through a method of unsupervised learning.

A9. The method according to embodiment A8 wherein the artificial intelligence module performs clustering on data that is inputted.

A10. The method according to embodiment A9 wherein each cluster of data may represent data which is representative of similar performance characteristics of the electrochemical system.

B1. A method for compensating for rest time of an electrochemical system, the method comprising:

determining a time since the electrochemical system was last charged; and adjusting test data corresponding to a test of the electrochemical system based on the determined time.

B2. The method according to embodiment B1 wherein determining the time since the electrochemical system was last charged comprises interpolating to estimate rest time.

B3. The method according to embodiment B1 wherein adjusting test data corresponding to the test of the electrochemical system based on the determined time comprises determining a scaling factor for a parameter of the test data based on a rate of change of measured open circuit voltage of the electrochemical system.

B4. The method according to embodiment B3 wherein determining the scaling factor comprises:

measuring open circuit voltage of the electrochemical system at a first time;

waiting for a set amount of time;

measuring open circuit voltage of the electrochemical system at a second time;

computing the rate of change of the open circuit voltage of the electrochemical system based on the measured open circuit voltage at the first time and the second time.

B5. The method according to embodiment B4 wherein the set amount of time comprises less than 10 seconds.

B6. The method according to any one of embodiments B3 to B5 wherein the scaling factor is determined by selecting a predetermined scaling factor from a plurality of predetermined scaling factor based on the rate of change of the open circuit voltage of the electrochemical system.

B7. The method according to any one of embodiments B1 to B6 wherein the scaling factor is determined at least partially based on information obtained from a charger used to charge the electrochemical system.

B8. The method according to embodiment B7 wherein the information obtained from the charger comprises information about the charging cycle.

C1. A method for compensating for voltage drift of an electrochemical system, the method comprising:

quantifying voltage drift in a measured voltage signal; and subtracting the quantified voltage drift from the measured voltage signal.

C2. The method of embodiment C1 wherein subtracting the quantified voltage drift comprises using a genetic algorithm.

C3. The method of embodiment C2 wherein the genetic algorithm comprises subtracting an average of the measured voltage signal from the measured voltage signal, transforming the measured voltage signal into a frequency domain signal, identifying a voltage drift peak in the frequency signal corresponding to the voltage drift and optimizing parameter values defining a parameterized tuning curve such that subtracting the tuning curve from the measured voltage signal minimizes the magnitude of the voltage drift peak.

C4. The method of embodiment C3 wherein the genetic algorithm comprises subtracting the average of the measured voltage signal from the measured voltage signal prior to transforming the measured voltage signal.

C5. The method of embodiment C3 or C4 wherein the tuning curve is a non-linear curve.

C6. The method of embodiment C3 or C4 wherein the tuning curve is a spline curve having a plurality of sections joined at knots.

C7. The method of embodiment C6 wherein locations of the knots are evenly spaced in a time dimension spanning an acquisition period for the measured voltage signals.

C8. The method of embodiment C3 or C4 wherein the tuning curve is a polynomial or an exponential decay curve.

C9. The method of any one of embodiments C3 to C8 wherein the optimizing comprises making a plurality of copies of a candidate curve obtained by initializing the parameters of the training curve and randomly adjusting the parameter values for each of the candidate curves, subtracting each of the candidate curves from the voltage signal to yield a corresponding candidate voltage signal, transforming the candidate voltage signal into the frequency domain and comparing the magnitudes for the drift voltage peaks in the transformed candidate voltage signals.

C10. The method of embodiment C2 wherein an objective function used by the genetic algorithm is a function that has a value that is proportional to a squared error between points of the discharge signal and points on an idealized sine-wave.

C11. The method of embodiment C2 wherein the genetic algorithm comprises one or more of: particle swarm, simulated annealing, gradient descent and stochastic hill climbing.

C12. The method of embodiment C1 wherein subtracting the quantified voltage drift comprises averaging local maxima and minima of the measured voltage signal together to generate a compensation signal and subtracting the compensation signal from the measured voltage signal.

C13. The method of embodiment C12 wherein the averaging of the local maxima and minima comprises fitting a first curve to the maxima of the measured voltage signal, fitting a second curve to the minima of the measured voltage signal and then averaging the first and second curves to yield the compensation signal.

C14. The method of embodiment C13 wherein the first and second curves comprise decaying exponential curves, spline curves or polynomial curves.

C15. The method of embodiment C1 wherein subtracting the quantified voltage drift comprises filtering the measured voltage signal to generate a compensation curve and subtracting the compensation curve from the measured voltage signal.

C16. The method of embodiment C1 wherein subtracting the quantified voltage drift comprises measuring a characteristic drift by performing steps comprising discharging the electrochemical system for a period of time while measuring a terminal voltage of the electrochemical system to yield a characteristic drift curve and subtracting the characteristic drift curve from the measured voltage signal.

C17. The method of embodiment C16 comprising obtaining a first characteristic drift curve before performing testing of the electrochemical system.

C18. The method of embodiment C16 or C17 comprising obtaining a second characteristic drift curve after performing testing of the electrochemical system.

C19. The method of embodiment C16 comprising obtaining a first characteristic drift curve before performing testing of the electrochemical system and a second characteristic drift curve after performing testing of the electrochemical system and averaging the first and second characteristic drift curves.

C20. The method of any one of embodiments C16 to C19 wherein discharging the electrochemical system for a period of time while measuring the terminal voltage of the battery to yield the characteristic drift curve comprises modulating the current drawn while discharging the electrochemical system to match an average current of the testing from the voltage signal measured during testing.

D1. A clip for coupling a lead to a terminal of an electrochemical system, the clip comprising:
a first part comprising a first conducting surface; and
a second part comprising a second conducting surface, the second part pivotally coupled to the first part;
wherein at least one of the first and second conducting surfaces is shaped to conform to a surface of the terminal of the electrochemical system.

D2. The clip of embodiment D1 further comprises a temperature sensor operable to measure a temperature of the terminal of the electrochemical system.

D3. The clip of embodiment D2 wherein the temperature sensor is a thermistor.

D4. The clip of embodiment D2 or D3 wherein the temperature sensor is proximate to one or both of the first and second conducting surfaces.

D5. The clip of embodiment D4 wherein the temperature sensor directly abuts at least one of the first and second conducting surfaces.

D6. The clip of any one of embodiments D2 to D5 wherein the temperature sensor comprises a sensing plate, the sensing plate increasing the sensing surface of the temperature sensor.

D7. The clip of embodiment D6 wherein the sensing surface abuts a bottom surface of at least one of the first and second conducting surfaces.

D8. The clip of any one of embodiments D2 to D7 wherein sensing surfaces of the temperature sensor have a thermal resistance from about 0.002 to about 0.069 mK/W.

D9. The clip of any one of embodiments D1 to D8 wherein the first and second conducting surfaces have a thermal resistance from about 0.002 to about 0.069 mK/W.

D10. The clip of any one of embodiments D1 to D9 wherein the thermal resistance between the first conducting surface and at least one other member of the first part is from about 4 to about 5.88 mK/W.

D11. The clip of any one of embodiments D1 to D10 wherein the thermal resistance between the second conducting surface and at least one other member of the second part is from about 4 to about 5.88 mK/W.

D12. The clip of any one of embodiments D1 to D11 wherein one of the first conducting surface and the second conducting surface comprises two distinct portions which are electrically isolated from one another.

D13. The clip of embodiment D12 wherein a first one of the distinct portions is configured as a reference electrode and a second one of the distinct portions is configured as a working electrode.

D14. The clip of embodiment D13 wherein the reference electrode is connected to a voltage monitor.

D15. The clip of embodiment D13 or D14 wherein the working electrode is connected to a variable lead.

D16. The clip of embodiment D12 wherein a temperature sensor is proximate to the un-split conductive surface.

D17. The clip of any one of embodiments D1 to D16 further comprising an infrared sensor mounted proximate to at least one of the first and second conducting surfaces.

E1. A method for determining temperature of an electrochemical system, the method comprising:
measuring temperature of the electrochemical system using a temperature sensor for a first amount of time, the first amount of time less than a second amount of time required for the electrochemical system and the temperature sensor to reach thermal equilibrium;
determining a rate of change of temperature of the electrochemical system based at least in part on the measured temperature and the first amount of time; and
based at least in part on the determined rate of change of temperature of the electrochemical system determining a temperature of the electrochemical system.

E2. The method of embodiment E1 wherein the temperature sensor is in thermal contact with a terminal of the electrochemical system.

E3. The method of embodiment E2 wherein the temperature sensor is integrated with a clip configured to provide an electrical connection to the terminal of the electrochemical system.

E4. The method of any one of embodiments E1 to E3 wherein the temperature sensor continuously measures temperature of the electrochemical system.

E5. The method of embodiment E4 comprising computing a baseline temperature of the electrochemical system by averaging the continuously measured temperature data.

E6. The method of any one of embodiments E1 to E5 comprising conditioning a signal from the temperature sensor.

E7. The method of embodiment E6 wherein the conditioning comprises filtering the signal to remove electromagnetic noise from the signal.

E8. The method of any one of embodiments E1 to E7 comprising estimating an internal core temperature of the electrochemical system by correlating a determined temperature of the electrochemical system to the internal core temperature of the electrochemical system.

E9. The method of embodiment E8 wherein estimating the internal core temperature comprises performing a statistical estimator.

E10. The method of embodiment E9 wherein estimating the internal core temperature comprises performing a minimum mean square error estimator.

E11. The method of any one of embodiments E8 to E10 wherein estimating the internal core temperature comprises performing a linear minimum mean square error estimator.

E12. The method of embodiment E8 wherein the internal core temperature is estimated by the formula:

$$\hat{x} = Wy + b$$

wherein $\hat{x}$ represents an estimate of the internal temperature x of the electrochemical system, W is a matrix, y is a measurement vector corresponding to a reading of the temperature sensor and b is an offset scalar.

E13. The method of embodiment E12 wherein W is a row vector.

E14. The method of embodiment E12 or E13 wherein b and W are calculated from calibration measurement vectors corresponding to known values of x.

E15. The method of any one of embodiments E12 to E14 wherein optimal values for b and W are represented as follows:

$$b = \bar{x} - W\bar{y}$$

$$W = C_{XY}C_y^{-1}$$

wherein $\bar{x}$ and $\bar{y}$ are the means of calibration measurement values x and y respectively which were experimentally obtained, $C_{XY}$ is the cross-covariance of calibration values x and y and $C_y$ is the auto-covariance of calibration value y.

E16. The method of any one of embodiments E11 to E15 wherein the measurement vector y corresponds to at least one of:

initial electrochemical system terminal temperature;

final electrochemical system terminal temperature;

average electrochemical system terminal;

initial rate of change of electrochemical system terminal temperature;

final rate of change of electrochemical system terminal temperature;

average rate of change of electrochemical system terminal temperature;

ambient temperature;

internal electrochemical system temperature estimates obtained using another method; and another measurement or estimate of a property of the electrochemical system.

E16. The method of any one of embodiments E11 to E15 wherein the estimator estimates both the internal core temperature of the electrochemical system and at least one other property of the electrochemical system.

E17. The method of embodiment E8 wherein estimating the internal core temperature comprises performing a state observer.

E18. The method of embodiment E17 wherein the state observer comprises a Kalman filter.

Interpretation of Terms

Unless the context clearly requires otherwise, throughout the description and the "comprise", "comprising", and the like are to be construed in an inclusive sense, as opposed to an exclusive or exhaustive sense; that is to say, in the sense of "including, but not limited to";

"connected", "coupled", or any variant thereof, means any connection or coupling, either direct or indirect, between two or more elements; the coupling or connection between the elements can be physical, logical, or a combination thereof;

"herein", "above", "below", and words of similar import, when used to describe this specification, shall refer to this specification as a whole, and not to any particular portions of this specification;

"or", in reference to a list of two or more items, covers all of the following interpretations of the word: any of the items in the list, all of the items in the list, and any combination of the items in the list;

the singular forms "a", "an", and "the" also include the meaning of any appropriate plural forms.

Words that indicate directions such as "vertical", "transverse", "horizontal", "upward", "downward", "forward", "backward", "inward", "outward", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Embodiments of the invention may be implemented using specifically designed hardware, configurable hardware, programmable data processors configured by the provision of software (which may optionally comprise "firmware") capable of executing on the data processors, special purpose computers or data processors that are specifically programmed, configured, or constructed to perform one or more steps in a method as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs"), and the like. Examples of configurable hardware are:

one or more programmable logic devices such as programmable array logic ("PALs"), programmable logic arrays ("PLAs"), and field programmable gate arrays ("FPGAs"). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a control circuit for a device may implement methods as described herein by executing software instructions in a program memory accessible to the processors.

Processing may be centralized or distributed. Where processing is distributed, information including software and/or data may be kept centrally or distributed. Such information may be exchanged between different functional units by way of a communications network, such as a Local Area Network (LAN), Wide Area Network (WAN), or the Internet, wired or wireless data links, electromagnetic signals, or other data communication channel.

For example, while processes or blocks are presented in a given order, alternative examples may perform routines having steps, or employ systems having blocks, in a different order, and some processes or blocks may be deleted, moved, added, subdivided, combined, and/or modified to provide alternatives or subcombinations. Each of these processes or blocks may be implemented in a variety of different ways. Also, while processes or blocks are at times shown as being performed in series, these processes or blocks may instead be performed in parallel, or may be performed at different times.

In addition, while elements are at times shown as being performed sequentially, they may instead be performed simultaneously or in different sequences. It is therefore intended that the following claims are interpreted to include all such variations as are within their intended scope.

Aspects of the invention may also be provided in the form of a program product. The program product may comprise any non-transitory medium which carries a set of computer-readable instructions which, when executed by a data processor, cause the data processor to execute a method of the invention. Program products according to the invention may be in any of a wide variety of forms. The program product may comprise, for example, non-transitory media such as magnetic data storage media including floppy diskettes, hard disk drives, optical data storage media including CD ROMs, DVDs, electronic data storage media including ROMs, flash RAM, EPROMs, hardwired or preprogrammed chips (e.g., EEPROM semiconductor chips), nanotechnology memory, or the like. The computer-readable signals on the program product may optionally be compressed or encrypted.

In some embodiments, aspects of the invention may be implemented in software. For greater clarity, "software" includes any instructions executed on a processor, and may include (but is not limited to) firmware, resident software, microcode, and the like. Both processing hardware and software may be centralized or distributed (or a combination thereof), in whole or in part, as known to those skilled in the art. For example, software and other modules may be accessible via local memory, via a network, via a browser or other application in a distributed computing context, or via other means suitable for the purposes described above.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

Various features are described herein as being present in "some embodiments". Such features are not mandatory and may not be present in all embodiments. Embodiments of the invention may include zero, any one or any combination of two or more of such features. This is limited only to the extent that certain ones of such features are incompatible with other ones of such features in the sense that it would be impossible for a person of ordinary skill in the art to construct a practical embodiment that combines such incompatible features. Consequently, the description that "some embodiments" possess feature A and "some embodiments" possess feature B should be interpreted as an express indication that the inventors also contemplate embodiments which combine features A and B (unless the description states otherwise or features A and B are fundamentally incompatible).

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. An apparatus for testing an electrochemical system, the apparatus comprising:
   a testing module adapted to be electrically coupled to the electrochemical system, the testing module comprising a discharge circuit configured to draw time-varying test current from the electrochemical system wherein the time-varying test current comprises a combination of a plurality of waveforms having different frequencies, the combination comprising at last one of: a superposition of the plurality of waveforms of different frequencies and a sequence of the plurality of waveforms having different frequencies and to controllably vary a magnitude of the time-varying test current, wherein the discharge circuit is configured to draw the time-varying test current from the electrochemical system continuously during testing of the electrochemical system;
   a measurement module configured to measure terminal voltage across terminals of the electrochemical system and the test current drawn from the electrochemical system by the testing module; and a processor configured to:

compensate the voltage measured by the measurement module to at least in part compensate for voltage drift caused by continuously drawing the time-varying test current comprising the combination of the plurality of waveforms having different frequencies from the electrochemical system; and compute a state of health of the electrochemical system based at least in part on the compensated voltage and the measured current.

2. The apparatus of claim 1 wherein the testing module is configured to perform a test sequence that includes varying the magnitude of the test current at a plurality of different frequencies.

3. The apparatus of claim 2 wherein the test sequence comprises a plurality of sequential time periods and the testing module is configured to vary the magnitude of the test current at a fixed frequency in each of the time periods wherein the fixed frequency is different in different ones of the time periods.

4. The apparatus of claim 1 wherein the testing module is configured to perform a test sequence that includes one or more time periods during which the testing module is configured to modulate the magnitude of the test current at a plurality of different frequencies.

5. The apparatus of claim 1 wherein the discharge circuit is configured to control the test current to have a magnitude within a range that results in a linear response from the electrochemical system.

6. The apparatus of claim 1 wherein the discharge circuit is configured to minimize introduction of a bias or constant current when drawing current from the electrochemical system.

7. The apparatus of claim 1 wherein the testing module is configured to vary the magnitude of the test current at a first frequency and the processor is configured to determine a first response of the electrochemical system at a frequency that is a harmonic of the first frequency.

8. The apparatus according to claim 7 wherein the processor is configured to compute a state of health of the electrochemical system based at least in part on the first response.

9. The apparatus of claim 1 wherein the discharge circuit is configured to draw a current having a magnitude sufficient to force a non-linear response of the electrochemical system.

10. The apparatus of claim 9 wherein the discharge circuit is configured to vary a magnitude of the test current while the measurement module is monitoring the terminal voltage and the test current and the processor is configured to process the monitored terminal voltage and test current to determine a first magnitude of the test current at which the response becomes non-linear and to set a magnitude of the test current based on the first magnitude.

11. The apparatus of claim 1 wherein computing the state of health comprises computing one or more complex impedance values of the electrochemical system at one or more corresponding frequencies based on the compensated voltage and the measured current.

12. The apparatus of claim 11 wherein the processor is configured to test a validity of the complex impedance values by fitting real and imaginary components of the complex impedance values to a model and assessing the validity of the complex impedance values based on values of parameters of the model.

13. The apparatus of claim 1 further comprising an artificial intelligence (AI) module configured to determine the state of health of the electrochemical system based at least in part on the compensated voltage and the measured current.

14. The apparatus of claim 13 wherein the AI module is configured to receive at least one of: the measured voltage, the measured current and parameters of a model fitted to the measured voltage and current.

15. The apparatus of claim 13 wherein the AI module is configured to identify a subset of features that are relevant to determining the state of health of the electrochemical system and to disregard other features while determining the state of health of the electrochemical system.

16. The apparatus according to claim 1 wherein the processor is configured to compensate the voltage measured by the measurement module using a genetic algorithm.

17. The apparatus according to claim 16 wherein the genetic algorithm comprises subtracting an average of a measured voltage signal from the measured voltage signal, transforming the measured voltage signal into a frequency domain signal, identifying a voltage drift peak in the frequency domain signal corresponding to the voltage drift and optimizing parameter values defining a parameterized tuning curve such that subtracting the tuning curve from the measured voltage signal minimizes a magnitude of the voltage drift peak.

18. The apparatus according to claim 17 wherein the optimizing comprises making a plurality of copies of a candidate curve obtained by initializing parameters of the tuning curve and randomly adjusting the parameter values for each of the candidate curves, subtracting each of the candidate curves from the voltage signal to yield a corresponding candidate voltage signal, transforming the candidate voltage signal into a frequency domain and comparing the magnitudes for the drift voltage peaks in the transformed candidate voltage signals.

19. The apparatus according to claim 16 wherein an objective function used by the genetic algorithm is a function that has a value that is proportional to a squared error between points of a discharge signal and points on an idealized sine-wave.

20. The apparatus according to claim 1 wherein the processor is configured to compensate the voltage measured by the measurement module by averaging local maxima and minima of a measured voltage signal together to generate a compensation signal and subtracting the compensation signal from the measured voltage signal.

21. The apparatus according to claim 1 wherein the processor is configured to compensate the voltage measured by the measurement module by filtering the measured voltage to generate a compensation curve and subtracting the compensation curve from measured voltage data.

22. The apparatus according to claim 1 wherein the processor is configured to compensate the voltage measured by the measurement module by measuring a characteristic drift by performing steps comprising discharging the electrochemical system for a period of time while measuring the terminal voltage of the battery to yield a characteristic drift curve and subtracting the characteristic drift curve from measured voltage data.

23. The apparatus according to claim 1 comprising a clip for coupling the testing module to a terminal of the electrochemical system, the clip comprising:

a first part comprising a first conducting surface; and a second part comprising a second conducting surface, the second part pivotally coupled to the first part;

wherein at least one of the first and second conducting surfaces is shaped to conform to a surface of the terminal of the electrochemical system; and the first part is connected in the discharge circuit and the second part is connected to a voltage measuring part of the measurement module.

24. The apparatus according to claim 1 wherein the processor is configured to perform a method for compensating for state of charge of the electrochemical system, the method comprising:

measuring an open circuit voltage of the electrochemical system;

determining a scaling factor based on the measured open circuit voltage; and scaling test data corresponding to a test of the electrochemical system based on the scaling factor.

25. The apparatus according to claim 1 wherein the processor is configured to perform a method for compensating for rest time of the electrochemical system, the method comprising:

determining a time since the electrochemical system was last charged; and adjusting test data corresponding to a test of the electrochemical system based on the determined time.

26. The apparatus according to claim 1 wherein the processor is configured to perform a method for determining temperature of the electrochemical system, the method comprising:

measuring temperature of the electrochemical system using a temperature sensor for a first amount of time, the first amount of time less than a second amount of time required for the electrochemical system and the temperature sensor to reach thermal equilibrium;

determining a rate of change of temperature of the electrochemical system based at least in part on the measured temperature and the first amount of time; and based at least in part on the determined rate of change of temperature of the electrochemical system determining the temperature of the electrochemical system.

27. The apparatus according to claim 26 wherein the processor is configured to perform a method for compensating for state of charge of the electrochemical system, the method comprising:

measuring an open circuit voltage of the electrochemical system;

determining a scaling factor based on the measured open circuit voltage; and scaling test data corresponding to a test of the electrochemical system based on the scaling factor.

28. The apparatus according to claim 27 wherein the processor is configured to perform a method for compensating for rest time of the electrochemical system, the method comprising:

determining a time since the electrochemical system was last charged; and adjusting test data corresponding to a test of the electrochemical system based on the determined time.

29. The apparatus according to claim 28 wherein the processor is configured to compensate the voltage measured by the measurement module by measuring a characteristic drift by performing steps comprising discharging the electrochemical system for a period of time while measuring the terminal voltage of the battery to yield a characteristic drift curve and subtracting the characteristic drift curve from measured voltage data.

30. The apparatus of claim 29 further comprising an artificial intelligence (AI) module configured to determine the state of health of the electrochemical system based at least in part on the compensated voltage and the measured current.

31. The apparatus according to claim 30 comprising a clip for coupling the testing module to a terminal of the electrochemical system, the clip comprising:

a first part comprising a first conducting surface; and a second part comprising a second conducting surface, the second part pivotally coupled to the first part;

wherein at least one of the first and second conducting surfaces is shaped to conform to a surface of the terminal of the electrochemical system; and the first part is connected in the discharge circuit and the second part is connected to a voltage measuring part of the measurement module.

* * * * *